United States Patent
Nosaka et al.

(10) Patent No.: US 8,687,973 B2
(45) Date of Patent: Apr. 1, 2014

(54) VOLTAGE GENERATOR, CONTROL CIRCUIT, VECTOR SUM PHASE SHIFTER, AND OPTICAL TRANSCEIVER

(75) Inventors: Hideyuki Nosaka, Kanagawa (JP); Munehiko Nagatani, Kanagawa (JP); Shogo Yamanaka, Kanagawa (JP); Kimikazu Sano, Kanagawa (JP); Koichi Murata, Kanagawa (JP); Kiyomitsu Onodera, Kanagawa (JP); Takatomo Enoki, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 356 days.

(21) Appl. No.: 13/132,308

(22) PCT Filed: Aug. 12, 2009

(86) PCT No.: PCT/JP2009/064240
§ 371 (c)(1),
(2), (4) Date: Jun. 1, 2011

(87) PCT Pub. No.: WO2010/067644
PCT Pub. Date: Jun. 17, 2010

(65) Prior Publication Data
US 2011/0236027 A1  Sep. 29, 2011

(30) Foreign Application Priority Data
Dec. 9, 2008  (JP) ................. 2008-313560

(51) Int. Cl.
*H04B 10/00*  (2013.01)
(52) U.S. Cl.
USPC ........... 398/158; 398/159; 398/135; 398/136; 398/183; 398/188; 398/154; 398/155; 398/192; 398/194; 398/195; 327/254; 327/255; 375/308; 375/286

(58) Field of Classification Search
USPC ......... 398/135, 136, 183, 188, 137, 138, 139, 398/192, 193, 194, 195, 196, 197, 198, 154, 398/155, 158, 159, 163, 164; 327/254, 255, 327/51, 74; 375/308, 286
See application file for complete search history.

(56) References Cited

U.S. PATENT DOCUMENTS

| 4,383,212 A | 5/1983 | Ballman |
| 5,933,010 A | 8/1999 | Moreno |

(Continued)

FOREIGN PATENT DOCUMENTS

| CN | 1723610 A | 1/2006 |
| JP | 57-143915 A | 9/1982 |

(Continued)

OTHER PUBLICATIONS

Koh et al., "0.13- μm CMOS Phase Shifters for X-, Ku-, and K-Band Phased Arrays", IEEE Journal of Solid-State Circuits, vol. 42, No. 11, Nov. 2007, pp. 2535-2546.

(Continued)

*Primary Examiner* — Hanh Phan
(74) *Attorney, Agent, or Firm* — Blakely, Sokoloff, Taylor & Zafman LLP

(57) ABSTRACT

A voltage generator (400) includes a resistor ladder including resistors (4000-4008) which divide a supplied voltage to generate a plurality of reference voltages, a resistor (4009) provided between a power supply voltage (VCC) and one terminal of the resistor ladder, and a resistor (4010) provided between a power supply voltage (VEE) and the other terminal of the resistor ladder.

16 Claims, 33 Drawing Sheets

(56) References Cited

U.S. PATENT DOCUMENTS

| | | | |
|---|---|---|---|
| 6,950,030 B2 * | 9/2005 | Kovarik et al. | 340/636.1 |
| 2003/0043066 A1 | 3/2003 | Otsuka et al. | |
| 2004/0046673 A1 | 3/2004 | Kovarik et al. | |
| 2005/0073347 A1 | 4/2005 | Trosa et al. | |
| 2009/0160490 A1 * | 6/2009 | Choi et al. | 327/51 |
| 2011/0150495 A1 * | 6/2011 | Nosaka et al. | 398/135 |

FOREIGN PATENT DOCUMENTS

| | | |
|---|---|---|
| JP | 58-191048 | 11/1983 |
| JP | H05-035349 A | 2/1993 |
| JP | H07-098577 A | 4/1995 |
| JP | H10-256884 A | 9/1998 |
| JP | 2001-217682 A | 8/2001 |
| JP | 2004-032446 | 1/2004 |
| JP | 2004-187188 A | 7/2004 |
| JP | 2005-120254 | 5/2005 |
| JP | 2006-318381 A | 11/2006 |
| JP | 2007-208472 A | 8/2007 |
| NL | 7403928 | 9/1974 |
| WO | WO 2004/064246 A1 | 7/2004 |

OTHER PUBLICATIONS

Gray et al., "Analysis and Design of Analog Integrated Circuits", John Wiley & Sons, Inc., 1977, pp. 227-231.

* cited by examiner

VOLTAGE GENERATOR, CONTROL CIRCUIT, VECTOR SUM PHASE SHIFTER, AND OPTICAL TRANSCEIVER

This is a non-provisional application claiming the benefit of International Application Number PCT/JP2009/064240 filed Aug. 12, 2009.

TECHNICAL FIELD

The present invention relates to a voltage generator which generates a reference voltage, a control circuit which receives a control voltage and a reference voltage generated by a voltage generator and outputs a control signal to a means such as a variable gain amplifier or four-quadrant multiplier for adjusting the signal amplitude, a vector sum phase shifter which arbitrarily changes the phase of an input signal using a control circuit and a variable gain amplifier or four-quadrant multiplier and outputs the signal, and an optical transceiver which uses the vector sum phase shifter to adjust the timing of a clock in NRZ-RZ conversion.

BACKGROUND ART

FIG. 39 shows the arrangement of a conventional voltage generator disclosed in Japanese Patent Laid-Open No. 2004-187188. The voltage generator includes resistors 3020 to 3024 that are connected in series. Voltage input terminals 3002 and 3003 are connected to the ends of the resistors 3020 to 3024. When external reference voltages VRT and VRB are supplied to the voltage input terminals 3002 and 3003, respectively, the resistors 3020 to 3024 divide the voltages to generate a plurality of different reference voltages.

The arrangement shown in FIG. 39 constructs an analog/digital converter as a whole. An analog signal is input from an input terminal 3001 to comparators (voltage comparators) 3031 to 3034. The reference voltages output from the voltage generator are supplied to the comparators 3031 to 3034. The comparators 3031 to 3034 hold the result of comparison between the reference voltage and the analog signal for each clock input. Boundary detectors 3041 to 3044 detect the boundaries between the determination results of the comparators 3031 to 3034. First and second encoders 3050 and 3070 convert the outputs from the boundary detectors 3041 to 3044 into binary data. Flip-flops 3061 to 3064 temporarily hold data output from the encoder 3050. Flip-flops 3081 to 3084 temporarily hold data output from the encoder 3070. Referring to FIG. 39, reference numerals 3004 to 3007 denote clock input terminals; 3008 to 3011, data output terminals; and 3090 to 3094, transmission lines.

Although FIG. 39 illustrates an example in which the voltage generator is applied to an analog/digital converter, the voltage generator may be mounted in the control circuit of a vector sum phase shifter. FIG. 40 is a block diagram showing the arrangement of a vector sum phase shifter. FIGS. 41A to 41D are constellation diagrams of signals of the respective portions of the vector sum phase shifter shown in FIG. 40 plotted on a plane.

The vector sum phase shifter includes a 90° phase shifter 1000, two sign inverters 1001I and 1001Q, two variable gain amplifiers 1002I and 1002Q, combiner 1003, and control circuit 1004. This vector sum phase shifter is disclosed in reference, Kwang-Jin Koh, et al., "0.13-μm CMOS Phase Shifters for X-, Ku-, and K-Band Phased Arrays", IEEE Journal of Solid-State Circuits, vol. 42, no. 11, November 2007, pp. 2535-2546".

The operation of the vector sum phase shifter shown in FIG. 40 will be described below assuming that an input signal VIN is an ideal sine wave. FIG. 41A shows the input signal VIN. The 90° phase shifter 1000 receives the input signal VIN, and outputs an in-phase signal VINI and a quadrature signal VINQ which are 90° degrees out of phase. On the constellation diagram with an in-phase component (I) plotted along the abscissa and a quadrature component (Q) plotted along the ordinate, the in-phase signal VINI can be represented by only the in-phase component (I), and the quadrature signal VINQ can be represented by only the quadrature component (Q), as shown in FIG. 41B. If the two signals VINI and VINQ are combined, a signal corresponding to a point 220 (at an angle of 45° and an amplitude of $2^{1/2}$) in FIG. 41B can be obtained.

The in-phase signal VINI and the quadrature signal VINQ are input to the pair of sign inverters 1001I and 1001Q, respectively. The sign inverters 1001I and 1001Q switch, based on the levels of control signals SI and SQ, respectively, between directly outputting the input signal and outputting the signal after inverting the voltage sign. On the constellation diagram, the in-phase signal VINI is output as one of the signal corresponding to the in-phase component (I) and a signal obtained by rotating the in-phase component (I) by 180°, and the quadrature signal VINQ is output as one of the signal corresponding to the quadrature component (Q) and a signal obtained by rotating the quadrature component (Q) by 180°, as shown in FIG. 41C. If the two signals VINI and VINQ are combined, a signal corresponding to one of points 221, 222, 223, and 224 (at an angle of 45°, 135°, 225°, or 315° and an amplitude of $2^{1/2}$) in FIG. 41C can be obtained.

To obtain finer phase shift angles, the output signals from the pair of sign inverters 1001I and 1001Q are input to the pair of variable gain amplifiers 1002I and 1002Q, respectively. The variable gain amplifiers 1002I and 1002Q change the gains based on the levels of control signals DAT and DAQ, respectively, and consequently change the amplitudes of the input signals and output them. The combiner 1003 vector-combines an in-phase signal VXI and a quadrature signal VXQ output from the pair of variable gain amplifiers 1002I and 1002Q, and outputs the combined signal to the outside as a phase shifter output VOUT.

For example, when the gain on the in-phase signal side is set to 1, and that on the quadrature signal side is set to 0, a signal corresponding to a point 225 (at an angle of 0° and an amplitude of 1) in the constellation diagram of FIG. 41D can be obtained as the phase shifter output VOUT. Similarly, when the gain on the in-phase signal side is set to cos(22.5°) ≈0.92, and that on the quadrature signal side is set to sin(22.5°)≈0.38, a signal corresponding to a point 226 (at an angle of 22.5° and an amplitude of $(0.92^2+0.38^2)^{1/2}=1$) in FIG. 41D can be obtained as the phase shifter output VOUT. When the gain on the in-phase signal side is set to cos(45°) ≈0.71, and that on the quadrature signal side is set to sin(45°) ≈0.71, a signal corresponding to a point 227 (at an angle of 45° and an amplitude of $(0.71^2+0.71^2)^{1/2}=1$) in FIG. 41D can be obtained as the phase shifter output VOUT.

The above-described three setting examples are operation examples in the first quadrant (0° to 90°). Controlling the pair of sign inverters 1001I and 1001Q allows to obtain a signal having an arbitrary phase and an amplitude of 1 (constant independently of the phase) throughout the four quadrants (0° to 360°). That is, when the gain on the in-phase signal side is set to cos($\phi$) and the gain on the quadrature signal side is set to sin($\phi$) a signal having an angle $\phi$ and an amplitude of 1 can be obtained as the phase shifter output VOUT.

For the operation of the above-described vector sum phase shifter, the control circuit 1004 receives a digital signal DGTL containing the information of the phase φ to be output, and generates the control signals SI and SQ for the pair of sign inverters 1001I and 1001Q and the control signals DAI and DAQ for the pair of variable gain amplifiers 1002I and 1002Q. The control circuit 1004 includes a digital signal processing circuit (DSP) 1005 which calculates cos and sin (or refers to a memory) to generate the control signals, an encoder 1006 which converts the signal generated by the DSP 1005 into the specific control signals SI, SQ, DAI, and DAQ, and a plurality of digital/analog converters (DACs) 1007I and 1007Q which convert the digital data DAI and DAQ into analog signals to control the variable gain amplifiers 1002I and 1002Q.

Note that the same function as that of the combination of the sign inverters 1001I and 1001Q and the variable gain amplifiers 1002I and 1002Q can be implemented by four-quadrant multipliers (for example, Gilbert cells) (Japanese Patent Laid-Open No. 2004-32446 and Japanese Patent No. 3063093). FIG. 42 shows the arrangement of a vector sum phase shifter in this case. The vector sum phase shifter in FIG. 42 includes a 90° phase shifter 2000, two four-quadrant multipliers 2001I and 2001Q, combiner 2002, and control circuit 2003.

The operation of the 90° phase shifter 2000 is the same as that of the 90° phase shifter 1000. The in-phase signal VINI and the quadrature signal VINQ output from the 90° phase shifter 2000 are represented by the constellation diagram of FIG. 41B.

The four-quadrant multipliers 2001I and 2001Q change the signs and gains of outputs based on the signs and levels of control signals CI and CQ, and consequently change the amplitudes of the in-phase signal VINI and the quadrature signal VINQ and output them, respectively.

The combiner 2002 vector-combines the in-phase signal VXI and the quadrature signal VXQ output from the pair of four-quadrant multipliers 2001I and 2001Q, and outputs the combined signal to the outside as the phase shifter output VOUT. The phase shifter output VOUT is represented by the constellation diagram of FIG. 41D.

The control circuit 2003 receives the digital signal DGTL containing the information of the phase φ to be output, and generates the control signals CI and CQ for the pair of four-quadrant multipliers 2001I and 2001Q. The control circuit 2003 includes a DSP 2004, encoder 2005, and DACs 2006I and 2006Q. In the arrangement shown in FIG. 42, it is necessary to use DACs of differential analog output type as the DACs 2006I and 2006Q in the control circuit 2003.

DISCLOSURE OF INVENTION

Problem to be Solved by the Invention

In the conventional voltage generator shown in FIG. 39, it is necessary to supply an external reference voltage to generate a reference voltage.

In addition, the reference voltage output from the voltage generator has a power supply voltage dependence.

Note that the above-described problems also arise in a control circuit having the voltage generator, a vector sum phase shifter including the control circuit, and an optical communication transceiver including the vector sum phase shifter.

It is an object of the present invention to provide a voltage generator to which an external reference voltage need not be supplied and also provide a control circuit, a vector sum phase shifter, and an optical transceiver using the voltage generator.

It is another object of the present invention to provide a voltage generator capable of suppressing the power supply voltage dependence of a reference voltage and also provide a control circuit, a vector sum phase shifter, and an optical transceiver using the voltage generator.

Means of Solution to the Problems

A voltage generator according to the present invention comprises a resistor ladder which divides a supplied voltage to generate a plurality of reference voltages, a first voltage supply resistor provided between a first power supply voltage and one terminal of the resistor ladder, and a second voltage supply resistor provided between a second power supply voltage and the other terminal of the resistor ladder.

A control circuit according to the present invention comprises a voltage generator which generates a reference voltage, and a differential amplifier which outputs, as a control signal, a difference signal between an externally input control voltage and the reference voltage generated by the voltage generator, wherein the voltage generator comprises a resistor ladder which divides a supplied voltage to generate the plurality of reference voltages, a first voltage supply resistor provided between a first power supply voltage and one terminal of the resistor ladder, and a second voltage supply resistor provided between a second power supply voltage and the other terminal of the resistor ladder, and when the control voltage is near the reference voltage, the differential amplifier performs an analog operation of converting the control voltage into the control signal which is similar to one of a sine wave and a cosine wave.

A vector sum phase shifter according to the present invention comprises a 90° phase shifter which generates, from an input signal, an in-phase signal and a quadrature signal 90° degrees out of phase with the in-phase signal, a first four-quadrant multiplier which changes an amplitude of the in-phase signal based on a first control signal on an in-phase signal side and outputs the in-phase signal, a second four-quadrant multiplier which changes an amplitude of the quadrature signal based on a second control signal on a quadrature signal side and outputs the quadrature signal, a combiner which combines the in-phase signal output from the first four-quadrant multiplier and the quadrature signal output from the second four-quadrant multiplier and outputs a combined signal, and a control circuit which outputs the first control signal and the second control signal, wherein the control circuit comprises a voltage generator which generates a reference voltage, and a differential amplifier which outputs a difference signal between the reference voltage and an externally input control voltage as one of the first control signal and the second control signal, and the voltage generator comprises a resistor ladder which divides a supplied voltage to generate the plurality of reference voltages, a first voltage supply resistor provided between a first power supply voltage and one terminal of the resistor ladder, and a second voltage supply resistor provided between a second power supply voltage and the other terminal of the resistor ladder, and when the control voltage is near the reference voltage, the differential amplifier performs an analog operation of converting the control voltage into one of the first control signal and the second control signal which is similar to one of a sine wave and a cosine wave.

An optical transceiver according to the present invention comprises a laser which outputs continuous light, a serializer which outputs serial data to be transmitted and a clock, a first Mach-Zehnder modulator which phase- or amplitude-modulates the continuous light input from the laser and outputs NRZ signal light, a first modulator driver which drives the first Mach-Zehnder modulator based on the serial data, a second Mach-Zehnder modulator which amplitude-modulates the NRZ signal light input from the first Mach-Zehnder modulator and outputs RZ signal light, a vector sum phase shifter which receives the clock, a second modulator driver which drives the second Mach-Zehnder modulator based on the clock phase-adjusted by the vector sum phase shifter, and a phase control circuit which outputs a control voltage corresponding to a phase shift amount of the vector sum phase shifter, wherein the vector sum phase shifter comprises a 90° phase shifter which generates, from the clock, an in-phase signal and a quadrature signal 90° degrees out of phase with the in-phase signal, a first four-quadrant multiplier which changes an amplitude of the in-phase signal based on a first control signal on an in-phase signal side and outputs the in-phase signal a second four-quadrant multiplier which changes an amplitude of the quadrature signal based on a second control signal on a quadrature signal side and outputs the quadrature signal, a combiner which combines the in-phase signal output from the first four-quadrant multiplier and the quadrature signal output from the second four-quadrant multiplier and outputs a combined signal as the phase-adjusted clock, and a control circuit which outputs the first control signal and the second control signal, the control circuit comprises a voltage generator which generates a reference voltage, and a differential amplifier which outputs a difference signal between the reference voltage and an externally input control voltage as one of the first control signal and the second control signal, the voltage generator comprises a resistor ladder which divides a supplied voltage to generate the plurality of reference voltages, a first voltage supply resistor provided between a first power supply voltage and one terminal of the resistor ladder, and a second voltage supply resistor provided between a second power supply voltage and the other terminal of the resistor ladder, and when the control voltage is near the reference voltage, the differential amplifier performs an analog operation of converting the control voltage into one of the first control signal and the second control signal which is similar to one of a sine wave and a cosine wave.

Effect of the Invention

As described above, according to the present invention, providing a resistor ladder which divides a supplied voltage to generate a plurality of reference voltages, a first voltage supply resistor provided between a first power supply voltage and one terminal of the resistor ladder, and a second voltage supply resistor provided between a second power supply voltage and the other terminal of the resistor ladder allows the voltage generator to internally generate an external reference voltage that has been necessary for the conventional voltage generator. This obviates the need for voltage application from the outside.

BEST MODE FOR CARRYING OUT THE INVENTION

First Embodiment

Figure 1:
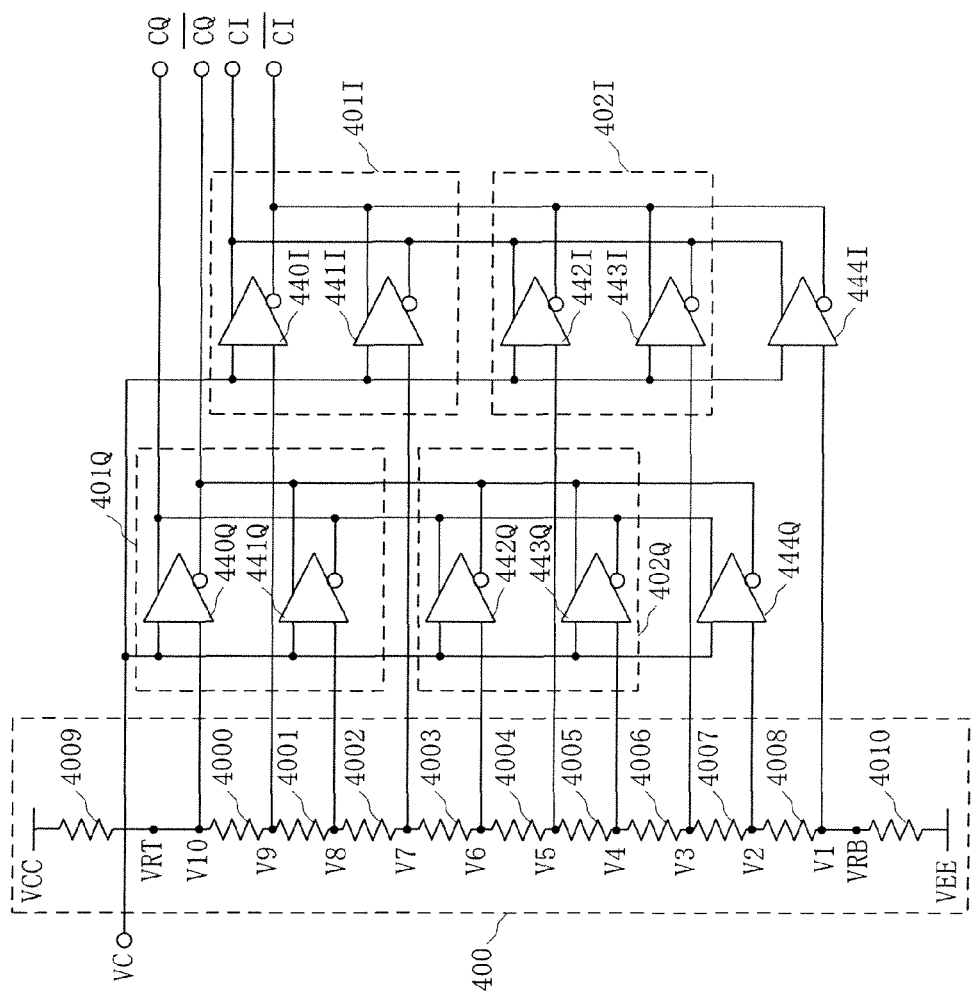
FIG. 1 is a block diagram showing an example of the arrangement of a control circuit using a voltage generator according to the first embodiment of the present invention.

An embodiment of the present invention will now be described with reference to the accompanying drawings. FIG. 1 is a block diagram showing an example of the arrangement of a control circuit using a voltage generator according to the first embodiment of the present invention.

The control circuit shown in FIG. 1 is mounted in a vector sum phase shifter. The control circuit receives a control voltage VC corresponding to a phase $\phi$ to be output and generates control signals CI and CQ for four-quadrant multipliers (not shown). The control circuit is implemented by using, as constituent elements, a voltage generator 400 which generates a plurality of reference voltages, and differential amplifiers 440I to 444I and 440Q to 444Q each of which receives the control voltage VC and a reference voltage. Details of the control circuit and the vector sum phase shifter will be described later.

The voltage generator 400 is formed from a resistor ladder including resistors 4000 to 4008. The conventional voltage generator receives reference voltages VRT and VRB from the outside. In this embodiment, however, a resistor 4009 is provided between a power supply voltage VCC and the voltage VRT, and a resistor 4010 is provided between a power supply voltage VEE and the voltage VRB so as to internally generate the reference voltages VRT and VRB required by the conventional voltage generator. One kind of resistance value is used in the resistor ladder. That is, the resistors 4000 to 4008 have the same resistance value R so that reference voltages V1, V2, V3, V4, V5, V6, V7, V8, V9, and V10 generated by the voltage generator 400 can have equal intervals.

Let RTL be the composite resistance value of the resistors 4000 to 4008 in the resistor ladder, RT be the resistance value of the resistor 4009, and RB be the resistance value of the resistor 4010. When currents flowing to the inputs of the differential amplifiers 440I to 444I and 440Q to 444Q are neglected, the current flowing to the resistors 4009 and 4010 is represented by (VCC−VEE)/(RT+RTL+RB). The voltage VRT is given by VRT=VCC−RT×(VCC−VEE)/(RT+RTL+RB). The voltage VRB is given by VRB=VEE+RB×(VCC−VEE)/(RT+RTL+RB). Hence, appropriately designing the resistance values RT and RB of the resistors 4009 and 4010 allows to set the voltages VRT and VRB at arbitrary voltage levels.

As described above, according to this embodiment, the external reference voltages VRT and VRB necessary for the conventional voltage generator can be generated inside the voltage generator 400. This obviates the need for voltage application from the outside. In this embodiment, reference voltage generation is implemented by resistance division. For this reason, even when the resistance values have temperature dependence, the reference voltages V1 to V10 output from the voltage generator have no temperature dependence. As described above, the reference voltages VRT and VRB are determined by the resistance values. Assume that the resistance values RTL, RT, and RB have the same temperature coefficient. In this case, even if the resistance values RTL, RT, and RB have temperature dependence, the reference voltages VRT and VRB remain constant because the change is canceled by the numerator and denominator of a fraction. Assume that the resistance values change to, for example, 1.1 times due to the temperature change. Even when RT=1.1×RT, RTL=1.1×RTL, and RB=1.1×RB are substituted into VRT=VCC−RT×(VCC−VEE)/(RT+RTL+RB) and VRB=VEE+RB×(VCC−VEE)/(RT+RTL+RB), the reference voltages VRT and VRB do not change. This reveals that even when the resistance values have temperature dependence, the reference voltages V1 to V10 output from the voltage generator have no temperature dependence.

Second Embodiment

Figure 2:
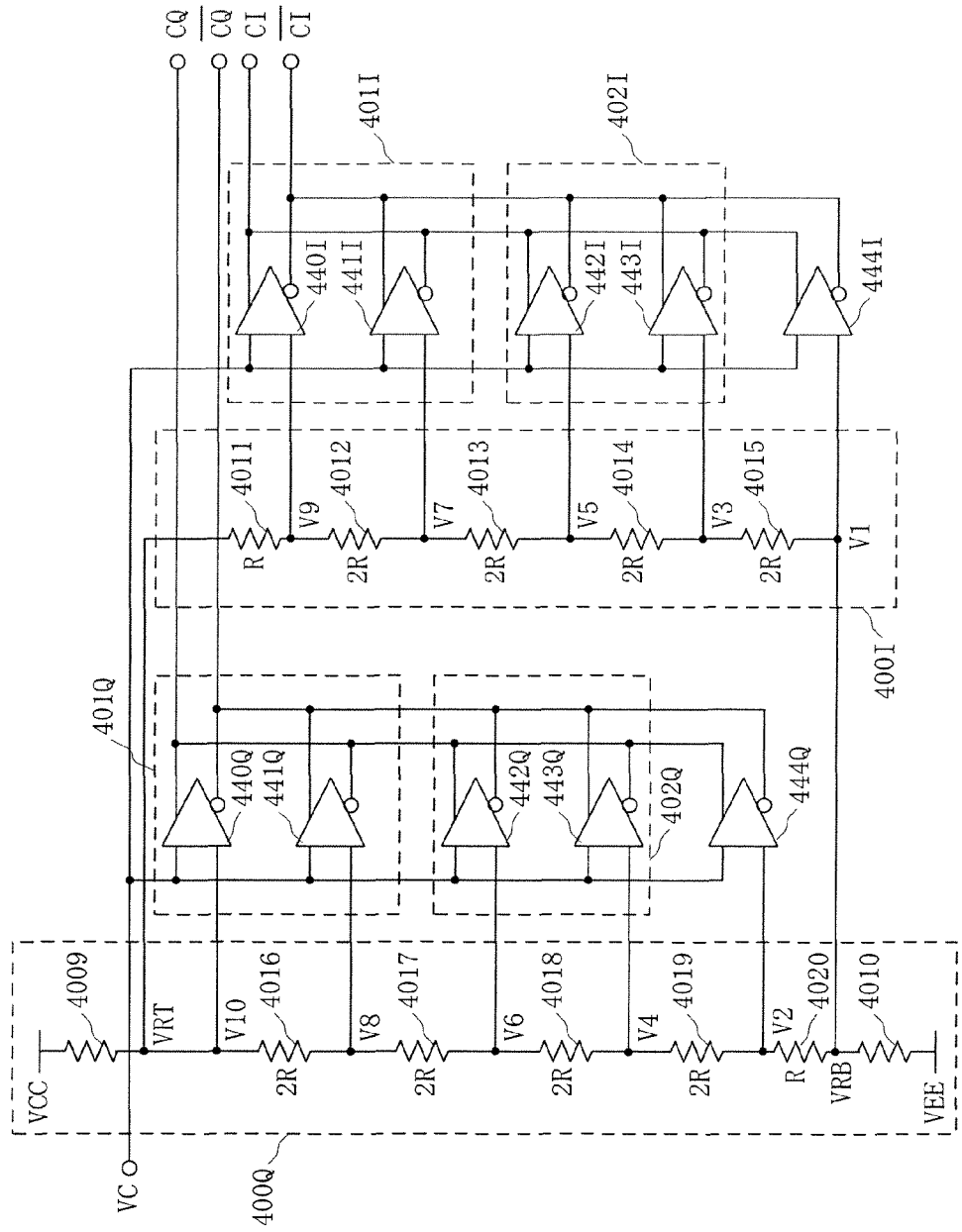
FIG. 2 is a block diagram showing an example of the arrangement of a control circuit using a voltage generator according to the second embodiment of the present invention.

The second embodiment of the present invention will be described next. FIG. 2 is a block diagram showing an example of the arrangement of a control circuit using a voltage generator according to the second embodiment of the present invention. The same reference numerals as in FIG. 1 denote the same parts in FIG. 2. In the first embodiment, the voltage generator 400 is formed from a single resistor ladder. The second embodiment is different in that a voltage generator 400I on the in-phase signal side and a voltage generator 400Q on the quadrature signal side are independently formed from resistor ladders.

The voltage generator 400I on the in-phase signal side is formed from a resistor ladder including resistors 4011 to 4015. The voltage generator 400Q on the quadrature signal side is formed from a resistor ladder including resistors 4016 to 4020. Reference voltages VRT and VRB are commonly supplied to the resistor ladder on the in-phase signal side and that on the quadrature signal side. The conventional voltage generator receives the reference voltages VRT and VRB from the outside. In this embodiment, however, a resistor 4009 is provided between a power supply voltage VCC and the voltage VRT, and a resistor 4010 is provided between a power supply voltage VEE and the voltage VRB so as to internally generate the reference voltages VRT and VRB required by the conventional voltage generator.

Two kinds of resistance values are used in the two resistor ladders. When the resistance value of the resistors 4011 and 4020 is set to R, that of the resistors 4012 to 4019 is set to 2R. That is, for example, the resistance value of a resistor provided between adjacent reference voltages such as V10 and V9 or V2 and V1 is set to R, and the resistance value of a resistor provided between alternate reference voltages such as V10 and V8 or V9 and V7 is set to 2R. This makes the reference voltages V1, V3, V5, V7, and V9 generated by the voltage generator 400I on the in-phase signal side and the reference voltages V2, V4, V6, V8, and V10 generated by the voltage generator 400Q on the quadrature signal side alternately have voltage levels at equal intervals (V10−V9=V9−V8=V8−V7= . . . =V2−V1=constant).

According to this embodiment, the same effects as in the first embodiment can be obtained. In this embodiment, additionally, the voltage generator 400I on the in-phase signal side and the voltage generator 400Q on the quadrature signal side are independently formed from resistor ladders. This allows the interconnections from the voltage generator 400I to differential amplifiers 440I to 444I on the in-phase signal side and the interconnections from the voltage generator 400Q to differential amplifiers 440Q to 444Q on the quadrature signal side to have the same length. As a result, the in-phase signal side and the quadrature signal side can have the same wiring parasitic capacitance. It is therefore possible to accurately give the reference voltage on the in-phase signal side and that on the quadrature signal side to the differential amplifiers and thus prevent operation imbalance between the in-phase signal side and the quadrature signal side.

Third Embodiment

Figure 3:
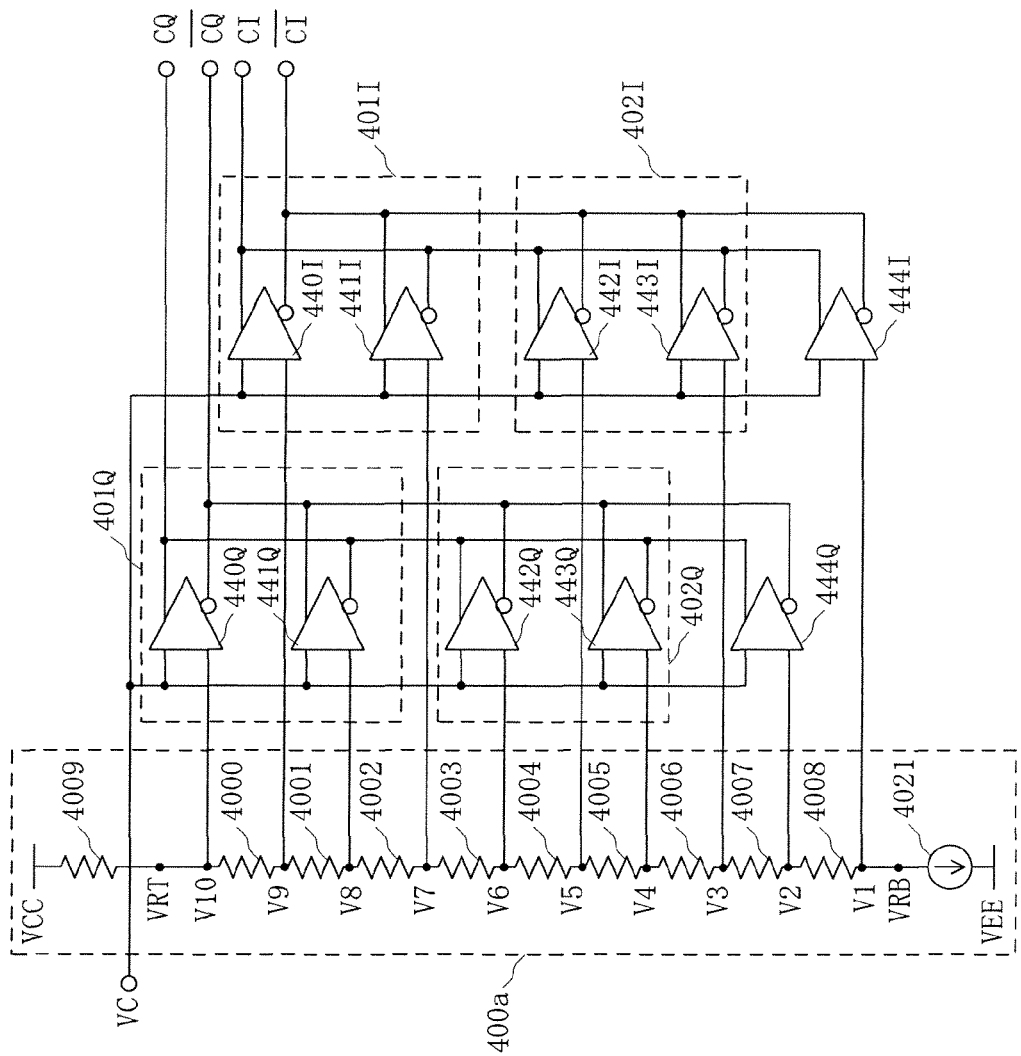
FIG. 3 is a block diagram showing an example of the arrangement of a control circuit using a voltage generator according to the third embodiment of the present invention.

The third embodiment of the present invention will be described next. FIG. 3 is a block diagram showing an example of the arrangement of a control circuit using a voltage generator according to the third embodiment of the present invention. The same reference numerals as in FIG. 1 denote the same parts in FIG. 3. As in the first embodiment, a voltage generator 400a is formed from a resistor ladder including resistors 4000 to 4008. Additionally, in this embodiment, a resistor 4009 is provided between a power supply voltage VCC and a voltage VRT, and a constant current source 4021 is provided between a power supply voltage VEE and a voltage VRB so as to internally generate the reference voltages VRT and VRB required by the conventional voltage generator.

Let I be the current value of the constant current source 4021, RTL be the composite resistance value of the resistors 4000 to 4008 in the resistor ladder, and RT be the resistance value of the resistor 4009. When currents flowing to the inputs of differential amplifiers 440I to 444I and 440Q to 444Q are neglected, the voltage VRT is given by VRT=VCC−RT×I, and the voltage VRB is given by VRB=VCC−(RT+RTL)×I. Hence, appropriately designing the resistance value RT of the resistor 4009 and the constant current value I of the constant current source 4021 allows to set the voltages VRT and VRB at arbitrary voltage levels.

According to this embodiment, the external reference voltages VRT and VRB necessary for the conventional voltage generator can be generated inside the voltage generator 400a. This obviates the need for voltage application from the outside. In this embodiment, when the constant current value I of the constant current source 4021 is assumed to have no dependence on the power supply voltage VEE, reference voltages V1 to V10 generated by the voltage generator 400a have no dependence on the power supply voltage VEE.

Fourth Embodiment

Figure 4:
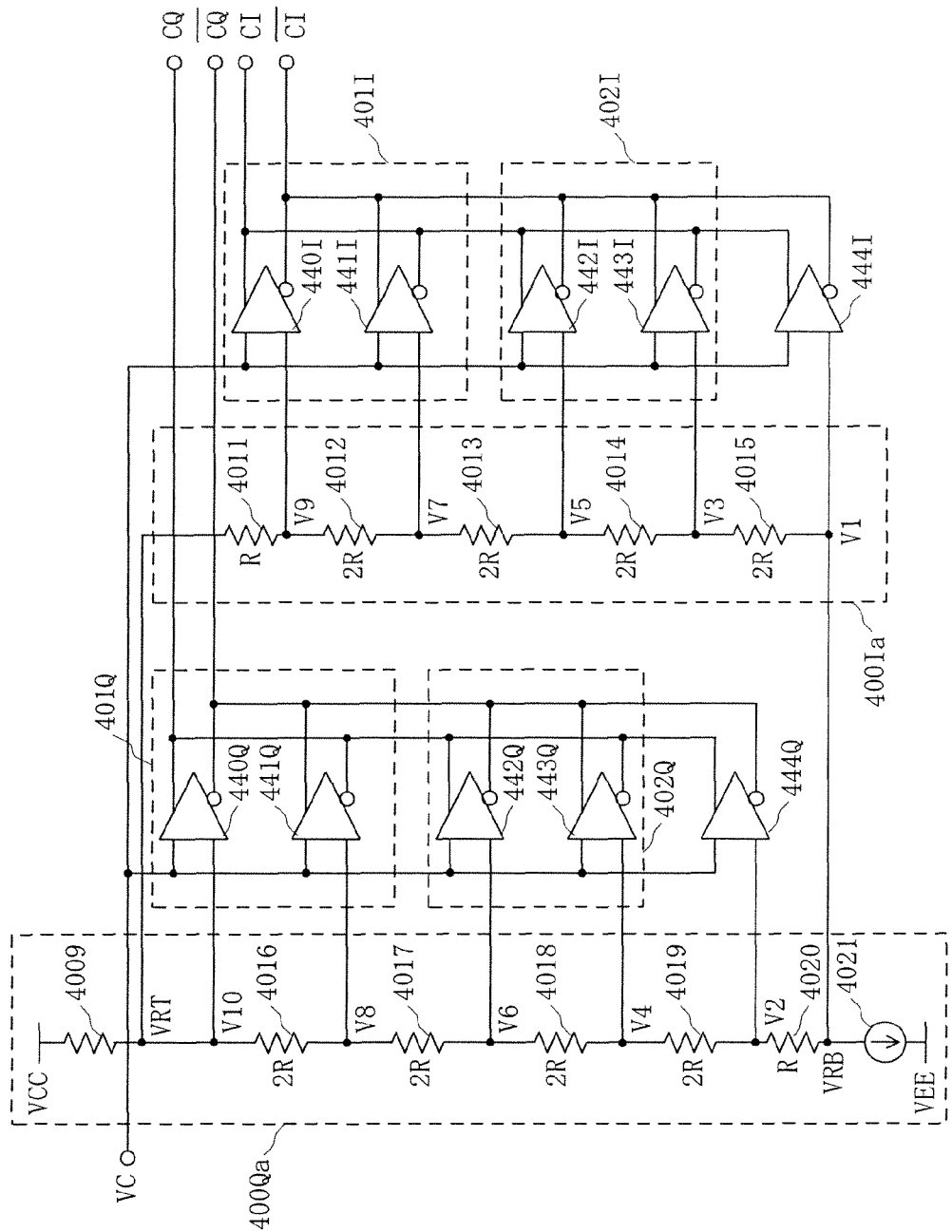
FIG. 4 is a block diagram showing an example of the arrangement of a control circuit using a voltage generator according to the fourth embodiment of the present invention.

The fourth embodiment of the present invention will be described next. FIG. 4 is a block diagram showing an example of the arrangement of a control circuit using a voltage generator according to the fourth embodiment of the present invention. The same reference numerals as in FIGS. 1 to 3 denote the same parts in FIG. 4. In the third embodiment, the voltage generator 400a is formed from a single resistor ladder. The fourth embodiment is different in that a voltage generator 400Ia on the in-phase signal side and a voltage generator 400Qa on the quadrature signal side are independently formed from resistor ladders.

The voltage generator 400Ia on the in-phase signal side is formed from a resistor ladder including resistors 4011 to 4015. The voltage generator 400Qa on the quadrature signal side is formed from a resistor ladder including resistors 4016 to 4020. Reference voltages VRT and VRB are commonly supplied to the resistor ladder on the in-phase signal side and that on the quadrature signal side. In this embodiment, a resistor 4009 is provided between a power supply voltage VCC and the voltage VRT, and a constant current source 4021 is provided between a power supply voltage VEE and the voltage VRB so as to internally generate the reference voltages VRT and VRB required by the conventional voltage generator.

According to this embodiment, the same effects as in the third embodiment can be obtained. In this embodiment, additionally, the voltage generator 400Ia on the in-phase signal side and the voltage generator 400Qa on the quadrature signal side are independently formed from resistor ladders. As a result, the in-phase signal side and the quadrature signal side can have the same wiring parasitic capacitance. It is therefore possible to accurately give the reference voltage on the in-phase signal side and that on the quadrature signal side to the differential amplifiers and thus prevent operation imbalance between the in-phase signal side and the quadrature signal side.

Fifth Embodiment

Figure 5:
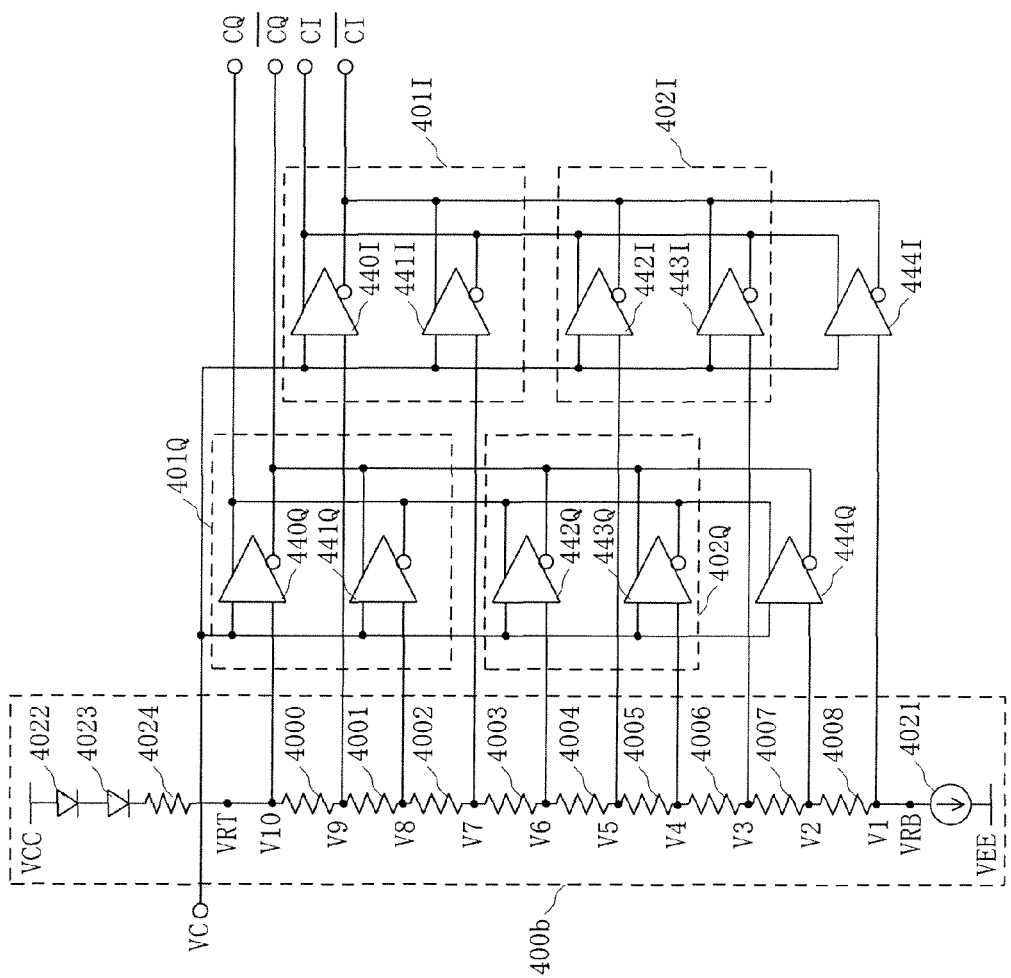
FIG. 5 is a block diagram showing an example of the arrangement of a control circuit using a voltage generator according to the fifth embodiment of the present invention.

The fifth embodiment of the present invention will be described next. FIG. 5 is a block diagram showing an example of the arrangement of a control circuit using a voltage generator according to the fifth embodiment of the present invention. The same reference numerals as in FIGS. 1 to 4 denote the same parts in FIG. 5. As in the first embodiment, a voltage generator 400b is formed from a resistor ladder including resistors 4000 to 4008. Additionally, in this embodiment, level shift diodes 4022 and 4023 and a resistor 4024 for fine voltage level adjustment are provided between a power supply voltage VCC and a voltage VRT, and a constant current source 4021 is provided between a power supply voltage VEE and a voltage VRB so as to internally generate the reference voltages VRT and VRB required by the conventional voltage generator.

Let VLS be the voltage drop of each of the level shift diodes 4022 and 4023, I be the current value of the constant current source 4021, RTL be the composite resistance value of the resistors 4000 to 4008 in the resistor ladder, and RR be the resistance value of the resistor 4024. When currents flowing to the inputs of differential amplifiers 440I to 444I and 440Q to 444Q are neglected, the voltage VRT is given by VRT=VCC−2×VLS−RR×I, and the voltage VRB is given by VRB=VCC−2×VLS−(RR+RTL)×I. Hence, appropriately designing the number of stages of the level shift diodes 4022 and 4023, the resistance value RR of the resistor 4024, and the current value I of the constant current source 4021 allows to set the voltages VRT and VRB at arbitrary voltage levels.

According to this embodiment, the external reference voltages VRT and VRB necessary for the conventional voltage generator can be generated inside the voltage generator 400b. This obviates the need for voltage application from the outside. In this embodiment, when the constant current value I of the constant current source 4021 is assumed to have no dependence on the power supply voltage VEE, reference voltages V1 to V10 generated by the voltage generator 400b have no dependence on the power supply voltage VEE. Additionally, in this embodiment, even when the constant current value I has dependence on the power supply voltage VEE, the dependence on the power supply voltage VEE of the reference voltages V1 to V10 output from the voltage generator 400b can be suppressed because the current dependence (Ohm's law) of the voltage drop of a level shift diode is generally smaller than that of the voltage drop of a resistor.

Note that the resistor 4024 for fine voltage level adjustment is not an essential constituent element of the voltage generator 400b, and RR=0 also holds.

Sixth Embodiment

Figure 6:
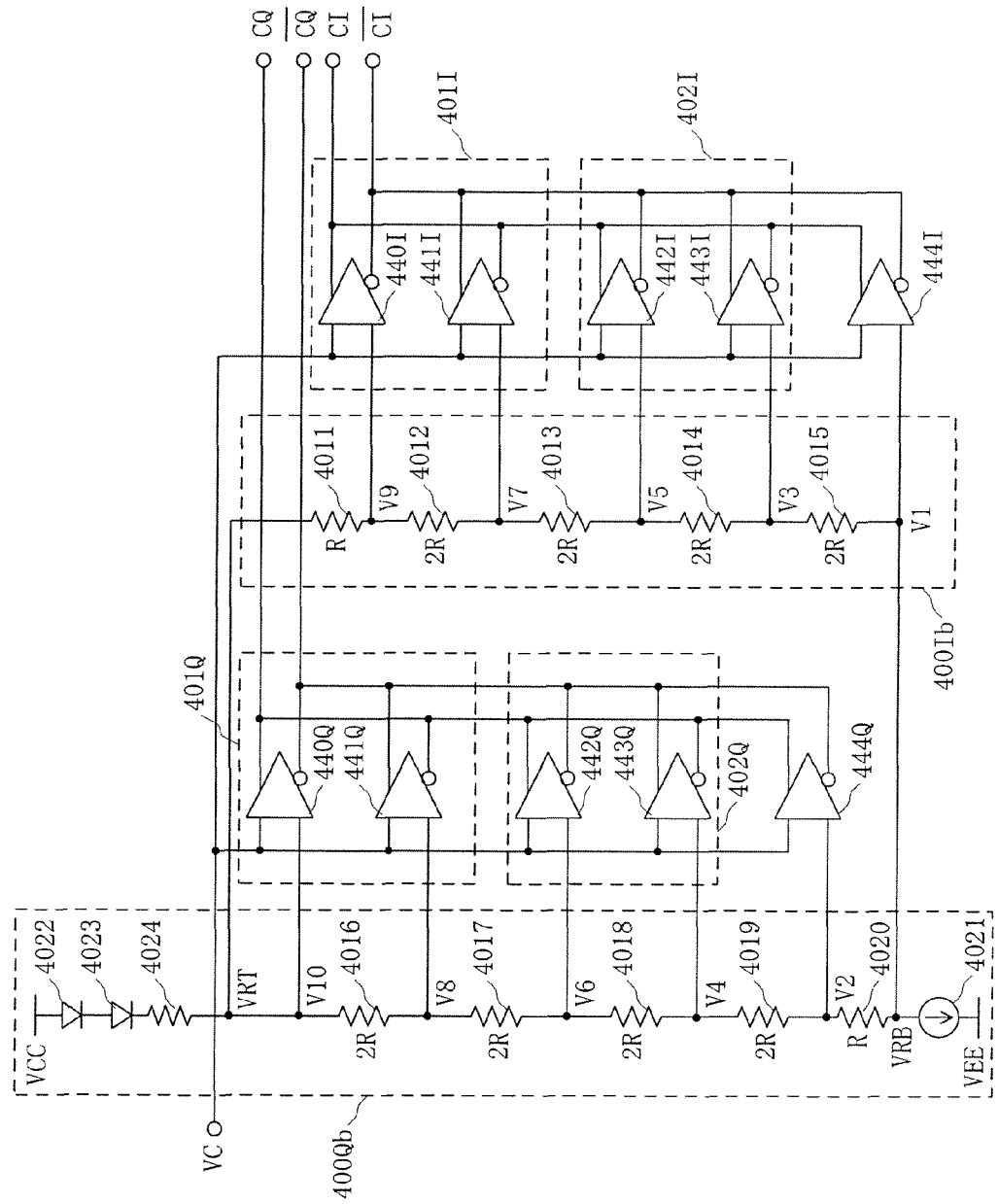
FIG. 6 is a block diagram showing an example of the arrangement of a control circuit using a voltage generator according to the sixth embodiment of the present invention.

The sixth embodiment of the present invention will be described next. FIG. 6 is a block diagram showing an example of the arrangement of a control circuit using a voltage generator according to the sixth embodiment of the present invention. The same reference numerals as in FIGS. 1 to 5 denote the same parts in FIG. 6. In the fifth embodiment, the voltage generator 400b is formed from a single resistor ladder. The sixth embodiment is different in that a voltage generator 400Ib on the in-phase signal side and a voltage generator 400Qb on the quadrature signal side are independently formed from resistor ladders.

The voltage generator 400Ib on the in-phase signal side is formed from a resistor ladder including resistors 4011 to 4015. The voltage generator 400Qb on the quadrature signal side is formed from a resistor ladder including resistors 4016 to 4020. Reference voltages VRT and VRB are commonly supplied to the resistor ladder on the in-phase signal side and that on the quadrature signal side. In this embodiment, level shift diodes 4022 and 4023 and a resistor 4024 are provided between a power supply voltage VCC and the voltage VRT, and a constant current source 4021 is provided between a power supply voltage VEE and the voltage VRB so as to internally generate the reference voltages VRT and VRB required by the conventional voltage generator.

According to this embodiment, the same effects as in the fifth embodiment can be obtained. In this embodiment, additionally, the voltage generator 400Ib on the in-phase signal side and the voltage generator 400Qb on the quadrature signal side are independently formed from resistor ladders. As a result, the in-phase signal side and the quadrature signal side can have the same wiring parasitic capacitance. It is therefore possible to accurately give the reference voltage on the in-phase signal side and that on the quadrature signal side to the differential amplifiers and thus prevent operation imbalance between the in-phase signal side and the quadrature signal side.

Seventh Embodiment

Figure 7:
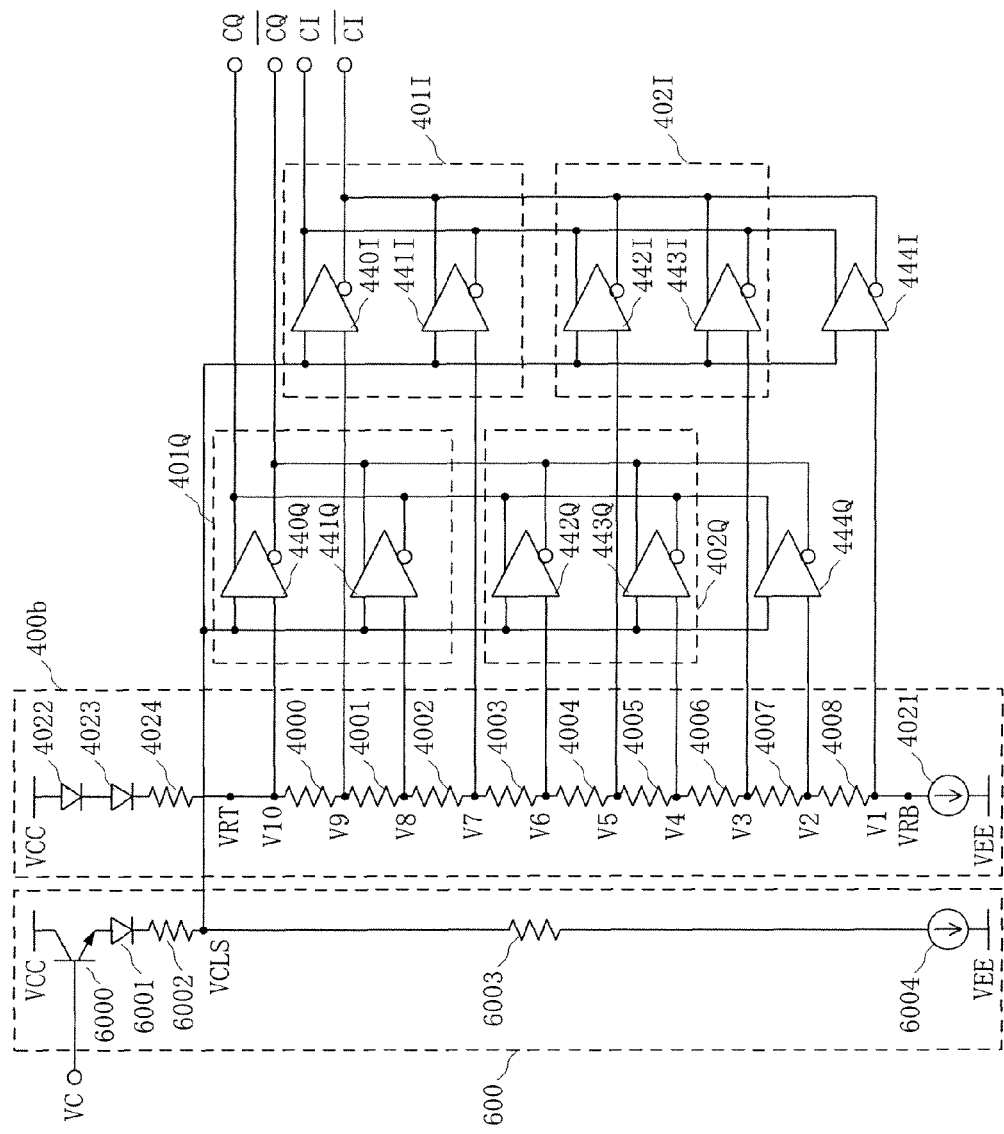
FIG. 7 is a block diagram showing an example of the arrangement of a control circuit using a voltage generator according to the seventh embodiment of the present invention.

The seventh embodiment of the present invention will be described next. FIG. 7 is a block diagram showing an example of the arrangement of a control circuit using a voltage generator according to the seventh embodiment of the present invention. The same reference numerals as in FIGS. 1 to 6 denote the same parts in FIG. 7. This embodiment is different from the fifth embodiment in that a PVT compensation circuit 600 is added. The PVT compensation circuit 600 includes a transistor 6000, level shift diode 6001, resistors 6002 and 6003, and constant current source 6004.

The PVT compensation circuit 600 serves as an emitter follower that shifts the level of a control voltage VC. The following circuit constants are made to match those of a voltage generator 400b. The total number of stages of the emitter follower (transistor 6000) and the level shift diode 6001 of the PVT compensation circuit 600 is made to match the number of stages of level shift diodes 4022 and 4023 of the voltage generator 400b. The resistance value of the resistor 6002 of the PVT compensation circuit 600 is made to match a resistance value RR of a resistor 4024 for fine voltage level adjustment of the voltage generator 400b. In addition, the constant current value of the constant current source 6004 of the PVT compensation circuit 600 is made to match a constant current value I of a constant current source 4021 of the voltage generator 400b. A resistance value RTDL of the resistor 6003 of the PVT compensation circuit 600 is arbitrarily selectable. For example, the resistance value RTDL may be equal to or ½ a composite resistance value RTL of resistors 4000 to 4008 in the resistor ladder of the voltage generator 400b.

Note that if the voltage generator 400b includes only one stage of level shift diode 4022, the level shift diode 6001 of the PVT compensation circuit 600 is unnecessary. If the voltage generator 400b uses no resistor 4024 for fine voltage level adjustment (RR=0), the resistor 6002 of the PVT compensation circuit 600 is unnecessary.

Let VLS be the voltage drop of each of the level shift diodes 4022 and 4023, I be the current value of the constant current source 4021, RTL be the composite resistance value of the resistors 4000 to 4008 in the resistor ladder, and RR be the resistance value of the resistor 4024 in the voltage generator 400b of this embodiment. When currents flowing to the inputs of differential amplifiers 440I to 444I and 440Q to 444Q are neglected, a voltage VRT is given by VRT=VCC−2×VLS−RR×I, and a voltage VRB is given by VRB=VCC−2×VLS−(RR+RTL)×I. Hence, appropriately designing the number of stages of the level shift diodes 4022 and 4023, the resistance value RR of the resistor 4024, and the current value I of the constant current source 4021 allows to set the voltages VRT and VRB at arbitrary voltage levels.

On the other hand, in the PVT compensation circuit 600 of this embodiment, the level of the control voltage VC is shifted by the transistor 6000, level shift diode 6001, and resistor 6002 of the emitter follower. Assume that the base-to-emitter voltage of the transistor 6000 is the same as the voltage drop VLS of each of the level shift diodes 4022, 4023, and 6001. A level-shifted control voltage VCLS to be sent to the differential amplifiers 440I to 444I and 440Q to 444Q is then given by VCLS=VC−2×VLS−RR×I.

Hence, VRT−VCLS=VCC−VC, and VCLS−VRB=RTL×I−(VCC−VC). The voltage difference between the voltages VRT and VCLS and the voltage difference between the voltages VCLS and VRB can be represented by functions of (VCC−VC).

According to this embodiment, the external reference voltages VRT and VRB necessary for the conventional voltage generator can be generated inside the voltage generator 400b. This obviates the need for voltage application from the outside. In this embodiment, when the constant current value I of the constant current source 4021 is assumed to have no dependence on a power supply voltage VEE, reference voltages V1 to V10 generated by the voltage generator 400b have no dependence on the power supply voltage VEE. Each of the voltages VRT and VCLS has dependence on the power supply voltage VEE. However, since the voltages VRT and VCLS similarly change depending on the power supply voltage VEE, the voltage difference between the voltages VRT and VCLS does not depend on the power supply voltage VEE. For this reason, even if the constant current value I has dependence on the power supply voltage VEE, the voltage difference between the voltages VRT and VCLS is (VCC−VC) and does not depend on the power supply voltage VEE. It is therefore possible to suppress the dependence of the control circuit on the power supply voltage VEE as compared to an arrangement including no PVT compensation circuit 600.

Even when the level shift voltage VLS of each of the level shift diodes 4022, 4023, and 6001 or the resistance value RR of the resistors 4024 and 6002 has temperature dependence, it does not affect the voltage difference between the voltages VRT and VCLS. It is therefore possible to suppress the temperature dependence of the control circuit. Similarly, even when the level shift voltage VLS of each of the level shift diodes 4022, 4023, and 6001 or the resistance value RR of the resistors 4024 and 6002 has a variation between processes, it does not affect the voltage difference between the voltages VRT and VCLS. Hence, in this embodiment, even when the reference voltages V1 to V10 output from the voltage generator 400b vary depending on PVT, the PVT compensation circuit 600 similarly changes the control voltage VC, thereby suppressing variations in the control circuit output depending on PVT. In this embodiment, providing the PVT compensation circuit 600 allows to suppress the manufacturing variation dependence, power supply voltage dependence, and temperature dependence of the control circuit. Furthermore, in this embodiment, since the voltage range of the control voltage VC can be set near the power supply voltage VCC, the resistance against noise can be raised by grounding (=0 V) the power supply voltage VCC.

Note that in this embodiment, an emitter follower formed from the bipolar transistor 6000 is used in the PVT compensation circuit 600. However, a source follower formed from a field effect transistor may also be used.

Eighth Embodiment

Figure 8:
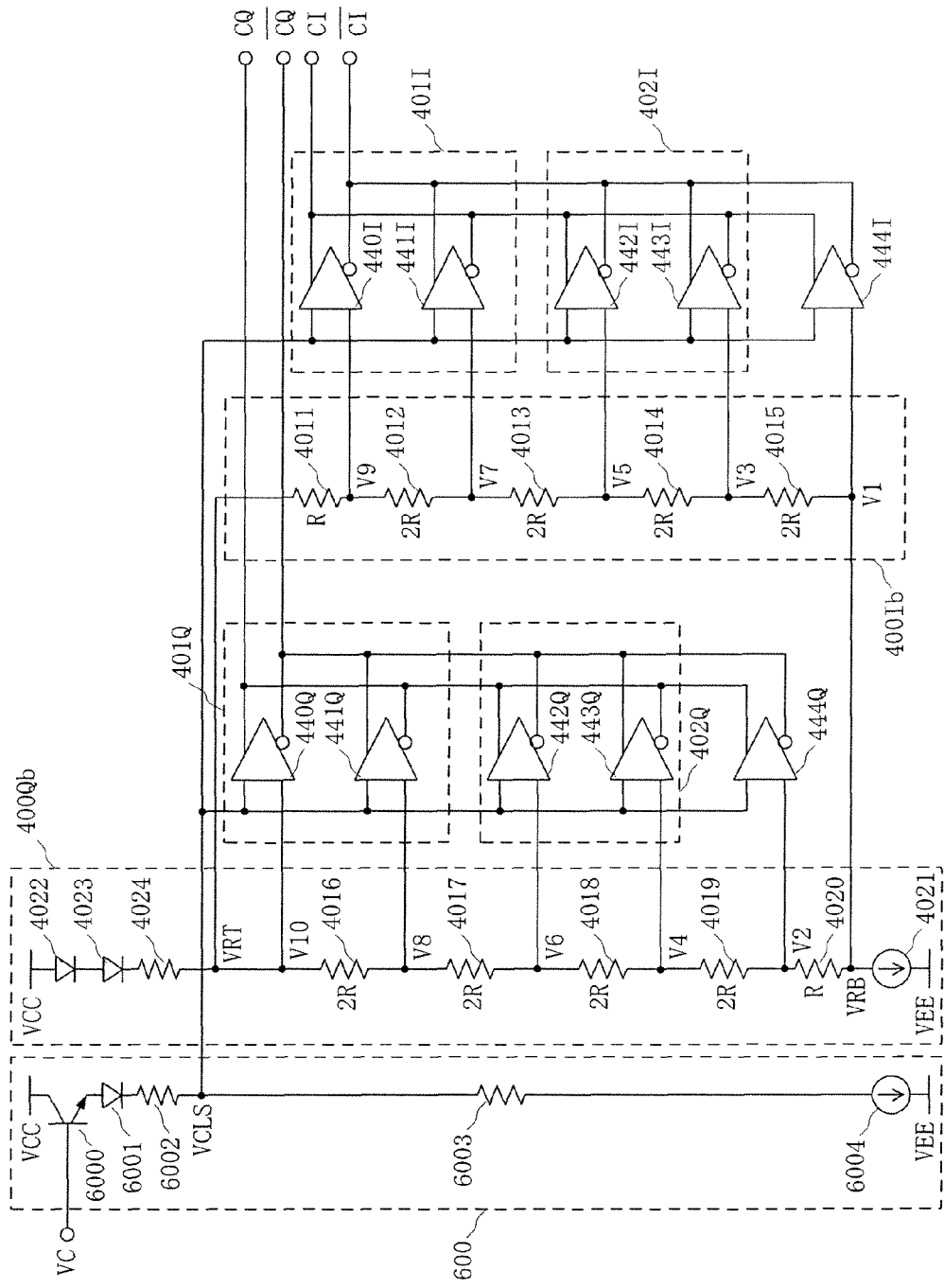
FIG. 8 is a block diagram showing an example of the arrangement of a control circuit using a voltage generator according to the eighth embodiment of the present invention.

The eighth embodiment of the present invention will be described next. FIG. 8 is a block diagram showing an example of the arrangement of a control circuit using a voltage generator according to the eighth embodiment of the present invention. The same reference numerals as in FIGS. 1 to 7 denote the same parts in FIG. 8. In the seventh embodiment, the voltage generator 400b is formed from a single resistor ladder. The eighth embodiment is different in that a voltage generator 400Ib on the in-phase signal side and a voltage generator 400Qb on the quadrature signal side are independently formed from resistor ladders, as in the fifth embodiment.

According to this embodiment, the same effects as in the seventh embodiment can be obtained. In this embodiment, additionally, the voltage generator 400Ib on the in-phase signal side and the voltage generator 400Qb on the quadrature signal side are independently formed from resistor ladders. As a result, the in-phase signal side and the quadrature signal side can have the same wiring parasitic capacitance. It is therefore possible to accurately give the reference voltage on the in-phase signal side and that on the quadrature signal side to the differential amplifiers and thus prevent operation imbalance between the in-phase signal side and the quadrature signal side.

Ninth Embodiment

Figure 9:
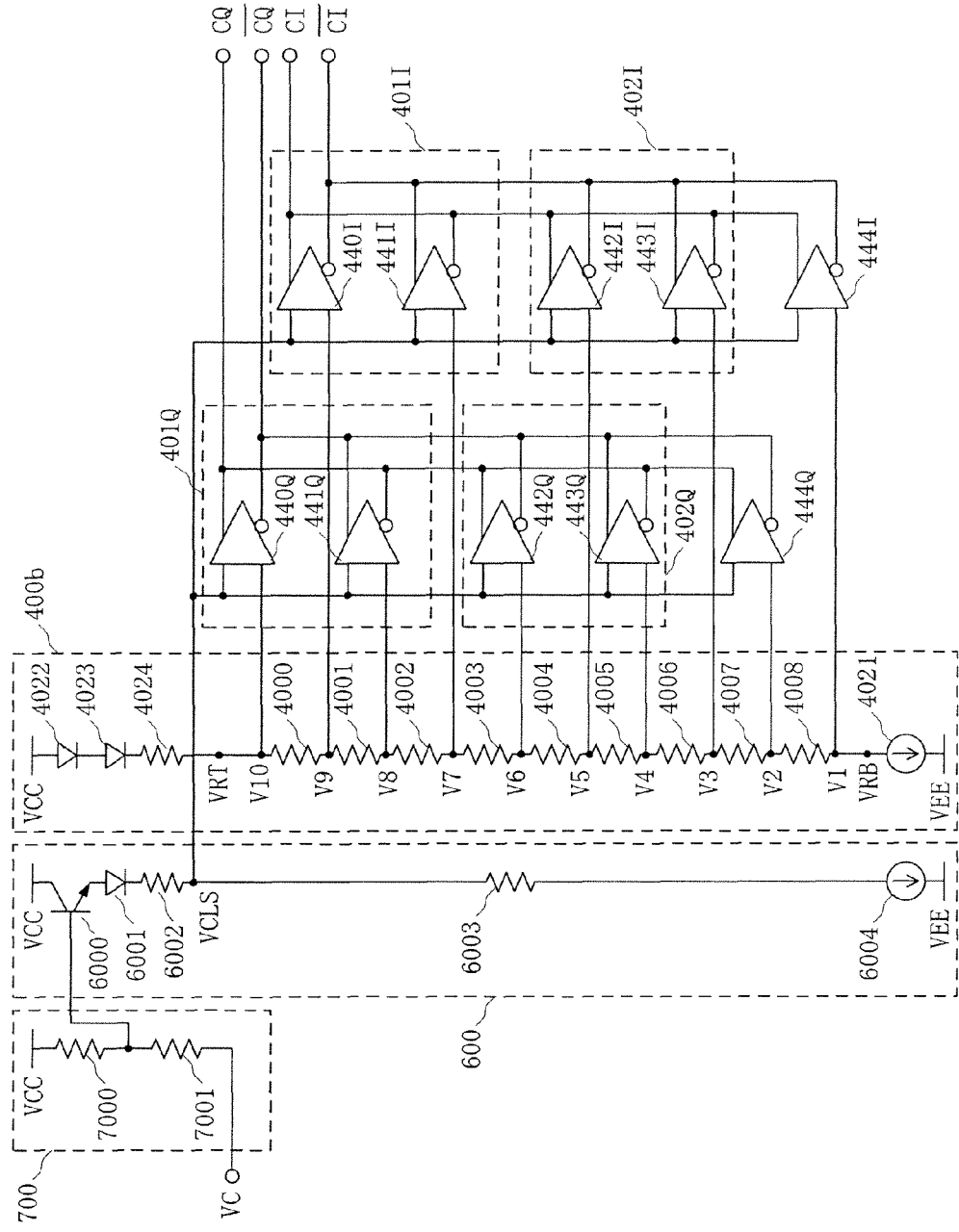
FIG. 9 is a block diagram showing an example of the arrangement of a control circuit using a voltage generator according to the ninth embodiment of the present invention.

The ninth embodiment of the present invention will be described next. FIG. 9 is a block diagram showing an example of the arrangement of a control circuit using a voltage generator according to the ninth embodiment of the present invention. The same reference numerals as in FIGS. 1 to 8 denote the same parts in FIG. 9. This embodiment is different from the seventh embodiment in that a control gain adjusting circuit 700 is added. The control gain adjusting circuit 700 includes resistors 7000 and 7001.

As described in the seventh embodiment, the relationship between control voltages VC and VCLS is represented by VRT−VCLS=VCC−VC. Considering that the maximum value of the level-shifted control voltage VCLS is VRT, the maximum value of the control voltage VC is VCC. For example, when VRT−VRB is designed as 0.5 V, and the power supply voltage VCC is grounded (=0 V), the control voltage VC can be input within the range from the minimum range VCC−0.5 V=−0.5 V to the maximum voltage VCC=0 V, that is, from −0.5 V to 0 V. When the control circuit uses 10 differential amplifiers 440I to 444I and 440Q to 444Q, like the example shown in FIG. 9, the total phase shift amount of the vector sum phase shifter to be described later is 810°. Hence, the gain of the control voltage obtained by dividing the phase shift amount by the slope of the control voltage is 810°/0.5 V=1620°/V.

To improve the resistance against noise or PVT of the device specifications or the control voltage VC, there exists a requirement for arbitrarily designing the gain of the control voltage VC. The control gain adjusting circuit 700 is inserted to meet this requirement. Let R1 and R2 be the resistance values of the resistors 7000 and 7001 of the control gain adjusting circuit 700, respectively. The control gain can be reduced to R1/(R1+R2) as compared to the eighth embodiment in which no control gain adjusting circuit 700 is inserted. The control gain adjusting circuit 700 can be implemented by the two resistors because the control circuit employs a PVT compensation circuit 600, and the maximum value of the control voltage VC is fixed to VCC. Note that the resistor 7001 may be a variable resistor. The resistors 7000 and 7001 may be implemented by potentiometers. According to this embodiment, the control gain of the control circuit can arbitrarily be adjusted.

10th Embodiment

Figure 10:
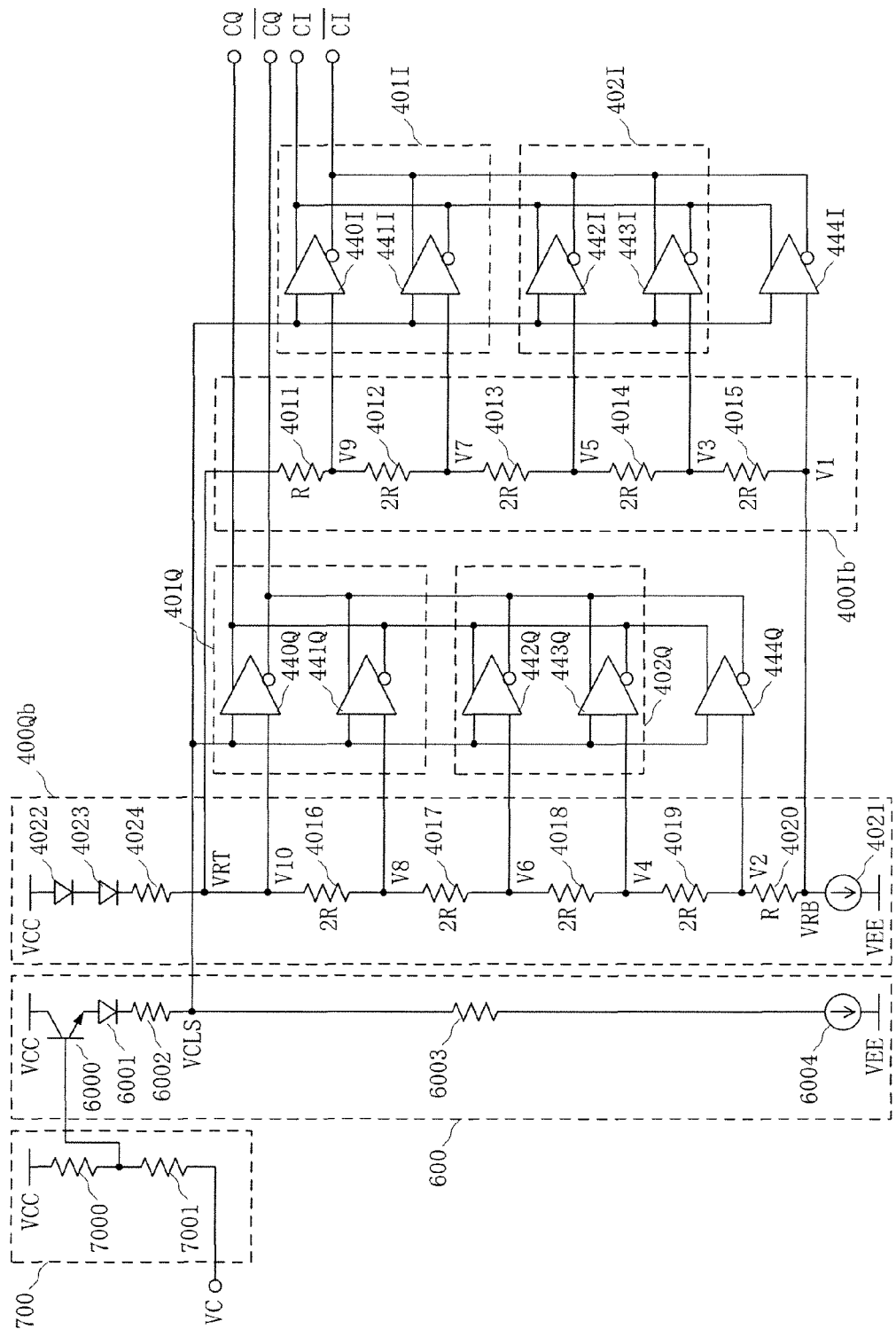
FIG. 10 is a block diagram showing an example of the arrangement of a control circuit using a voltage generator according to the 10th embodiment of the present invention.

The 10th embodiment of the present invention will be described next. FIG. 10 is a block diagram showing an example of the arrangement of a control circuit using a voltage generator according to the 10th embodiment of the present invention. The same reference numerals as in FIGS. 1 to 9 denote the same parts in FIG. 10. In the ninth embodiment, the voltage generator 400*b* is formed from a single resistor ladder. The 10th embodiment is different in that a voltage generator 400Ib on the in-phase signal side and a voltage generator 400Qb on the quadrature signal side are independently formed from resistor ladders, as in the fifth embodiment.

According to this embodiment, the same effects as in the ninth embodiment can be obtained. In this embodiment, additionally, the voltage generator 400Ib on the in-phase signal side and the voltage generator 400Qb on the quadrature signal side are independently formed from resistor ladders. As a result, the in-phase signal side and the quadrature signal side can have the same wiring parasitic capacitance. It is therefore possible to accurately give the reference voltage on the in-phase signal side and that on the quadrature signal side to the differential amplifiers and thus prevent operation imbalance between the in-phase signal side and the quadrature signal side.

11th Embodiment

Figure 11:
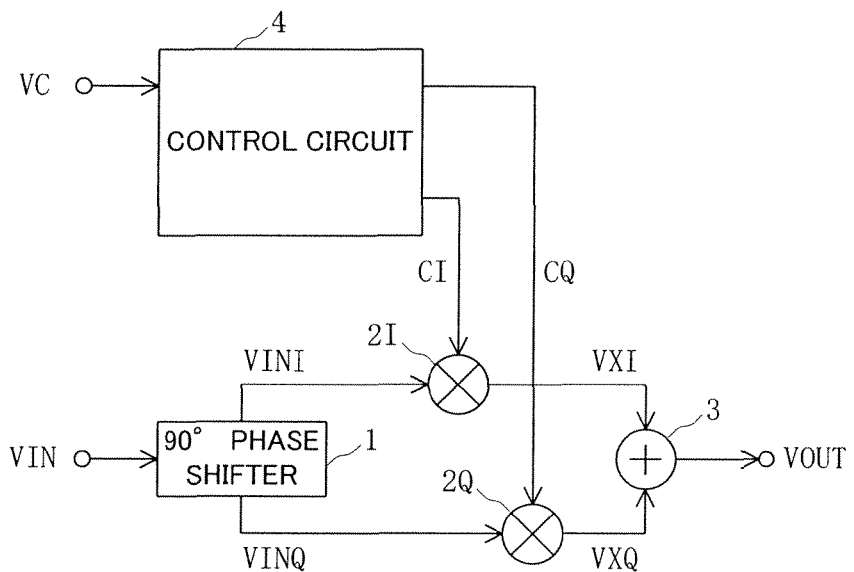
FIG. 11 is a block diagram the arrangement of a vector sum phase shifter according to the 11th embodiment of the present invention.
Figure 12A:
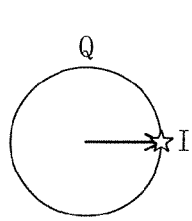
FIGS. 12A to 12C are constellation diagrams showing signals of the respective portions of the vector sum phase shifter shown in FIG. 1 plotted on a plane.
Figure 12B:
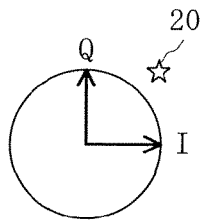
Figure 12C:
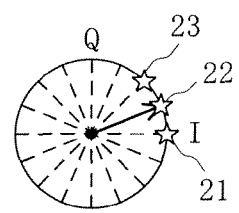

The 11th embodiment of the present invention will be described next with reference to the accompanying drawings. FIG. 11 is a block diagram showing the arrangement of a vector sum phase shifter according to the 11th embodiment of the present invention. FIGS. 12A to 12C are constellation diagrams of signals of the respective portions of the vector sum phase shifter shown in FIG. 11 plotted on a plane. In this embodiment, details of a control circuit using one of the voltage generators according to the first to 10th embodiment and details of a vector sum phase shifter using the control circuit will be explained.

The vector sum phase shifter in FIG. 11 includes a 90° phase shifter 1, two four-quadrant multipliers 2I and 2Q, combiner 3, and control circuit 4.

The operation of the vector sum phase shifter in FIG. 11 will be explained below assuming that an input signal VIN is an ideal sine wave. FIG. 12A shows the input signal VIN.

The 90° phase shifter 1 receives the input signal VIN, and outputs an in-phase signal VINI and a quadrature signal VINQ which are 90° degrees out of phase. On the constellation diagram with an in-phase component (I) plotted along the abscissa and a quadrature component (Q) plotted along the ordinate, the in-phase signal VINI can be represented by only the in-phase component (I), and the quadrature signal VINQ can be represented by only the quadrature component (Q), as shown in FIG. 12B. If the two signals VINI and VINQ are combined, a signal corresponding to a point 20 (at an angle of 45° and an amplitude of $2^{1/2}$) in FIG. 12B can be obtained.

The in-phase signal VINI and the quadrature signal VINQ are input to the pair of four-quadrant multipliers 2I and 2Q, respectively. Each of the four-quadrant multipliers 2I and 2Q has the same function as that of the combination of a sign inverter and a variable gain amplifier. The four-quadrant multipliers 2I and 2Q change the signs and gains of outputs based on the signs and levels of control signals CI and CQ, and consequently change the amplitudes of the in-phase signal VINI and the quadrature signal VINQ and output them, respectively. The combiner 3 vector-combines an in-phase signal VXI and a quadrature signal VXQ output from the pair of four-quadrant multipliers 2I and 2Q, and outputs the combined signal to the outside as a phase shifter output VOUT.

For example, when the gain on the in-phase signal side is set to 1, and that on the quadrature signal side is set to 0, a signal corresponding to a point 21 (at an angle of 0° and an amplitude of 1) in the constellation diagram of FIG. 12C can be obtained as the phase shifter output VOUT. Similarly, when the gain on the in-phase signal side is set to cos(22.5°) ≈0.92, and that on the quadrature signal side is set to sin (22.5°)≈0.38, a signal corresponding to a point 22 (at an angle of 22.5° and an amplitude of $(0.92^2+0.38^2)^{1/2}=1$) in FIG. 12C can be obtained as the phase shifter output VOUT. When the gain on the in-phase signal side is set to cos(45°)≈0.71, and that on the quadrature signal side is set to sin(45°)≈0.71, a signal corresponding to a point 23 (at an angle of 45° and an amplitude of $(0.71^2+0.71^2)^{1/2}=1$) in FIG. 12C can be obtained as the phase shifter output VOUT.

The above-described three setting examples are operation examples in the first quadrant (0° to 90°). Changing the signs of the control signals CI and CQ of the pair of four-quadrant multipliers 2I and 2Q allows to obtain a signal having an arbitrary phase throughout the four quadrants (0° to 360°). That is, when the gain on the in-phase signal side is set to cos(φ) and the gain on the quadrature signal side is set to sin(φ) a signal having an angle φ and an amplitude of 1 can be obtained as the phase shifter output VOUT.

For the operation of the above-described vector sum phase shifter, the control circuit 4 receives a control voltage VC corresponding to (for example, proportional to) the phase φ to be output, and generates the control signals CI and CQ for the pair of four-quadrant multipliers 2I and 2Q. The control voltage VC is input from a phase control circuit (not shown). The control circuit 4 includes an analog circuit which calculates cos and sin to generate the control signals CI and CQ. More specifically, the control circuit 4 is implemented by using, as constituent elements, a voltage generator which generates a plurality of reference voltages, and differential amplifier pairs each of which receives a control signal and two reference voltages and detects whether the control signal falls within or outside the range of the two reference voltages. As the control circuit 4, one of the control circuits described in the first to 10th embodiments is usable.

Figure 13:
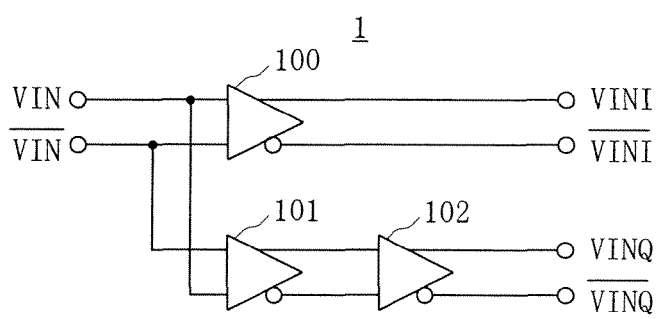
FIG. 13 is a block diagram showing an example of the arrangement of a 90° phase shifter according to the 11th embodiment of the present invention.

Each element of the vector sum phase shifter will be described below in detail. FIG. 13 is a block diagram showing an example of the arrangement of the 90° phase shifter 1. Note that FIG. 13 illustrates an example in which all signals are difference signals, and complementary signals are distinguished by adding bars.

The 90° phase shifter 1 includes three differential amplifiers 100, 101, and 102. In the arrangement shown in FIG. 13, the input signals VIN and $\overline{\text{VIN}}$ are divided to the two differential amplifiers 100 and 101. One of signal pairs is directly output from the differential amplifier 100 as the in-phase signals VINI and $\overline{\text{VINI}}$. The other signal pair is input from the differential amplifier 101 to the differential amplifier 102. The signals are delayed by the differential amplifier 102 and output as the quadrature signals VINQ and $\overline{\text{VINQ}}$ which are 90° degrees out of phase with the in-phase signals VINI and $\overline{\text{VINI}}$.

Letting f (Hz) be the input frequency, the delay time of the differential amplifier 102 is set to 1/(4·f) sec. For example, when the input frequency is 25 GHz, the delay time of the differential amplifier 102 is designed to be 10 psec.

The arrangement of the 90° phase shifter 1 is not limited to that in FIG. 13, and can appropriately be selected from an arrangement using a 90° hybrid, an arrangement using a pair of transistors with different ground potentials, an arrangement using a pair of transistors with different ground potentials, an arrangement using a pair of transmission lines with different line lengths, an arrangement using a pair of a low-pass filter and a high-pass filter, an arrangement using a polyphase filter, and the like. The polyphase filter is suitable as the 90° phase shifter of the vector sum phase shifter because it can easily make the amplitude of the output on the in-phase signal side match that of the output on the quadrature signal side, and also implement the 90° phase shift operation in a broad band. Alternatively, the 90° phase shifter may be implemented by a combination of an in-phase power divider and a 90° phase shifter without the dividing function.

Figure 14:
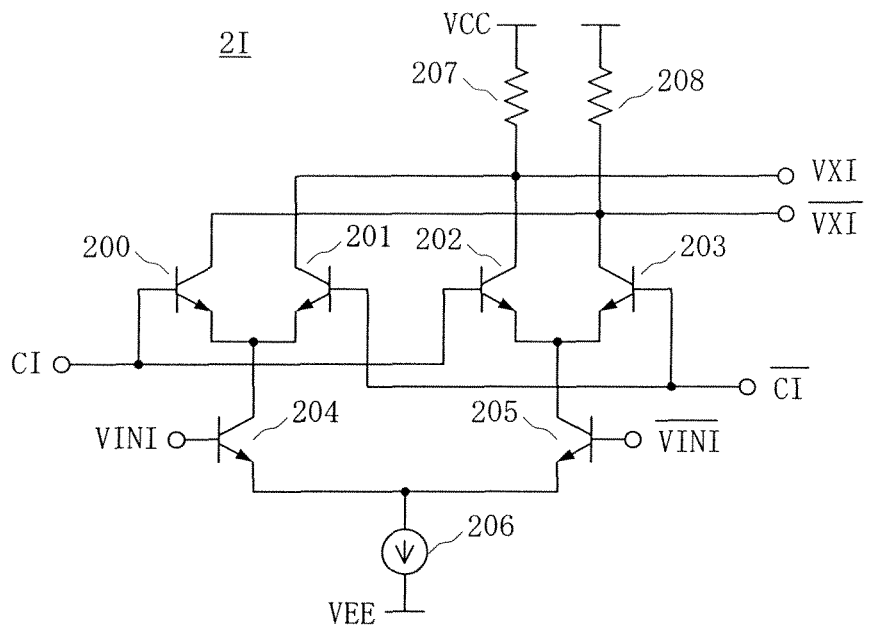
FIG. 14 is a block diagram showing an example of the arrangement of a four-quadrant multiplier according to the 11th embodiment of the present invention.

FIG. 14 is a block diagram showing an example of the arrangement of each of the four-quadrant multipliers 2I and 2Q. The four-quadrant multiplier 2I includes a differential circuit formed from transistors 200 and 201 having bases receiving the control signals CI and $\overline{\text{CI}}$, a differential circuit formed from transistors 202 and 203 having bases receiving the control signals CI and $\overline{\text{CI}}$, a transistor 204 having a base receiving the in-phase signal VINI and a collector connected to the emitters of the transistors 200 and 201, a transistor 205 having a base receiving the in-phase signal $\overline{\text{VINI}}$ and a collector connected to the emitters of the transistors 202 and 203, a current source 206 having one terminal connected to the emitters of the transistors 204 and 205 and the other terminal receiving a power supply voltage VEE, a load resistor 207 having one terminal connected to the collectors of the transistors 201 and 202 and the other terminal receiving a power supply voltage VCC, and a load resistor 208 having one terminal connected to the collectors of the transistors 200 and 203 and the other terminal receiving the power supply voltage VCC. The in-phase signal VXI is output from the node between the load resistor 207 and the collectors of the transistors 201 and 202. The in-phase signal $\overline{\text{VXI}}$ is output from the node between the load resistor 208 and the collectors of the transistors 200 and 203.

FIG. 14 illustrates the arrangement of the four-quadrant multiplier 2I. The four-quadrant multiplier 2Q also has the same arrangement. More specifically, the control signals CI and $\overline{\text{CI}}$ in FIG. 14 are replaced with CQ and $\overline{\text{CQ}}$. The in-phase signals VINI and $\overline{\text{VINI}}$ are replaced with VINQ and $\overline{\text{VINQ}}$. The in-phase signals VXI and $\overline{\text{VXI}}$ are replaced with VXQ and $\overline{\text{VXQ}}$.

The four-quadrant multiplier 2I or 2Q shown in FIG. 14 is a generally known circuit called a Gilbert cell or a modulator simply. This circuit receives the in-phase signals VINI and $\overline{\text{VINI}}$ (or the quadrature signals VINQ and $\overline{\text{VINQ}}$), multiplies the inputs by the control signals CI and $\overline{\text{CI}}$ on the in-phase signal side (or the control signals CQ and $\overline{\text{CQ}}$ on the quadrature signal side), and outputs the outputs VXI and $\overline{\text{VXI}}$ on the in-phase signal side (or the outputs VXQ and $\overline{\text{VXQ}}$ on the quadrature signal side).

The arrangement of the four-quadrant multipliers 2I and 2Q is not limited to that in FIG. 14, and can also be implemented by separating the functions of the sign inverter and the variable gain amplifier, as described concerning the prior art. Though bipolar transistors are used in FIG. 14, field effect transistors (FETs) may be used. To, for example, improve the linearity of the input/output, a resistor may be inserted to the emitter of each transistor.

Figure 15:
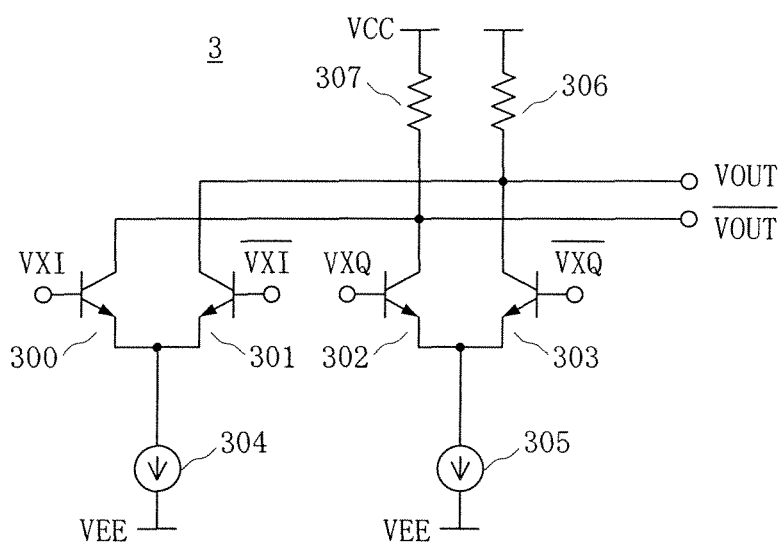
FIG. 15 is a block diagram showing an example of the arrangement of a combiner according to the 11th embodiment of the present invention.

FIG. 15 is a block diagram showing an example of the arrangement of the combiner 3. The combiner 3 includes a differential circuit formed from transistors 300 and 301 having bases receiving the in-phase signals VXI and $\overline{\text{VXI}}$, a differential circuit formed from transistors 302 and 303 having bases receiving the quadrature signals VXQ and $\overline{\text{VXQ}}$, a current source 304 having one terminal connected to the emitters of the transistors 300 and 301 and the other terminal receiving the power supply voltage VEE, a current source 305 having one terminal connected to the emitters of the transistors 302 and 303 and the other terminal receiving the power supply voltage VEE, a load resistor 306 having one terminal connected to the collectors of the transistors 301 and 303 and the other terminal receiving the power supply voltage VCC, and a load resistor 307 having one terminal connected to the collectors of the transistors 300 and 302 and the other terminal receiving the power supply voltage VCC. The output signal VOUT is output from the node between the load resistor 306 and the collectors of the transistors 301 and 303. The output signal $\overline{\text{VOUT}}$ is output from the node between the load resistor 307 and the collectors of the transistors 300 and 302.

The combiner 3 implements a function of vector-combining the in-phase signals VXI and $\overline{\text{VXI}}$ and the quadrature signals VXQ and $\overline{\text{VXQ}}$ output from the four-quadrant multipliers 2I and 2Q. Since this is combining two signals (in-phase component and quadrature component) that are orthogonal to each other, the voltages or currents are simply added. The circuit shown in FIG. 15 adds the currents of the in-phase signals VXI and $\overline{\text{VXI}}$ and the quadrature signals VXQ and $\overline{\text{VXQ}}$, and converts the sums into voltages, thereby obtaining the output signals VOUT and $\overline{\text{VOUT}}$.

The arrangement of the combiner 3 is not limited to that shown in FIG. 15, and, for example, a Wilkinson type power combiner may be used.

Figure 16:
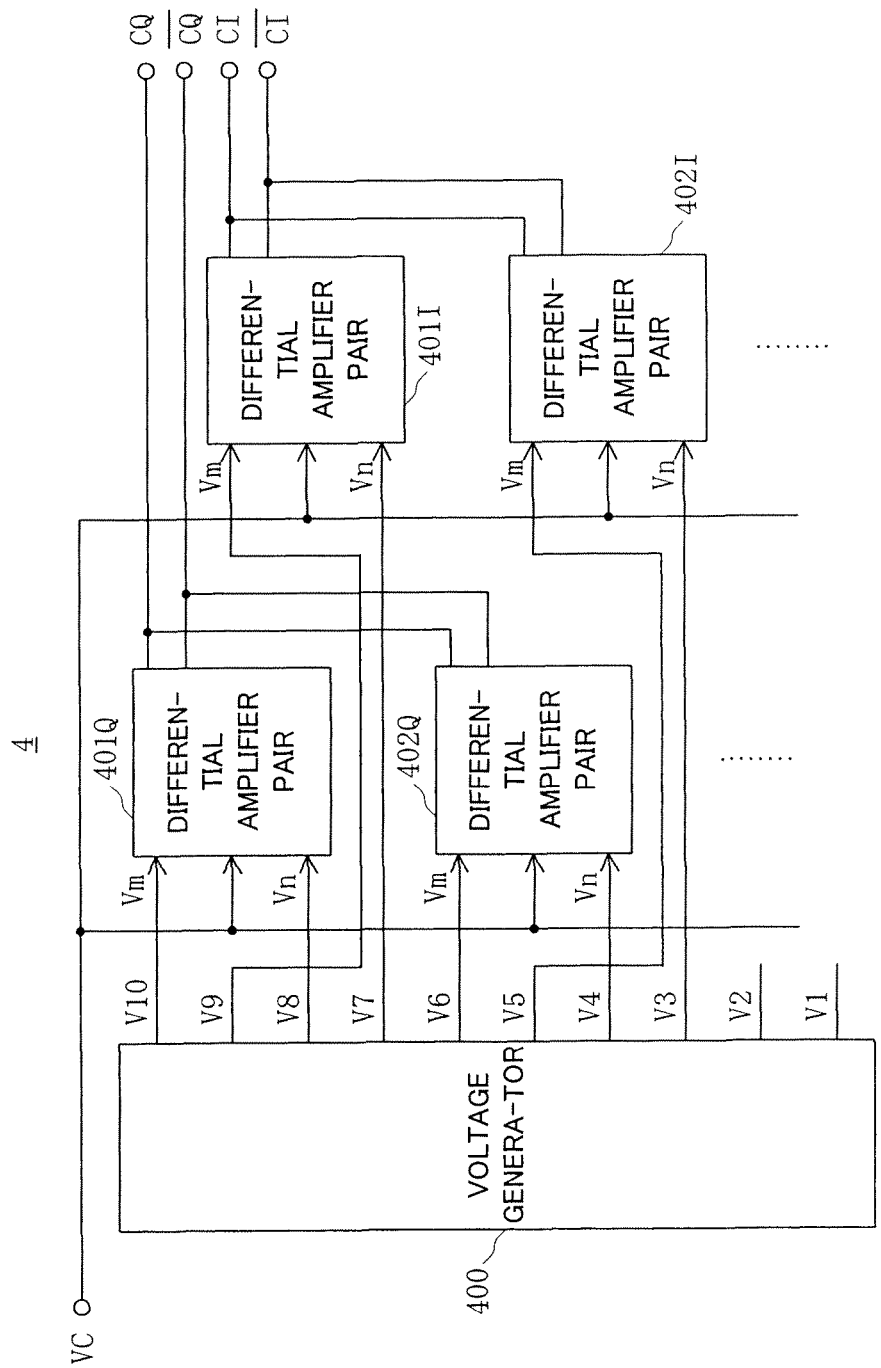
FIG. 16 is a block diagram showing an example of the arrangement of a control circuit according to the 11th embodiment of the present invention.

FIG. 16 is a block diagram showing an example of the arrangement of the control circuit 4. The control circuit 4 receives the control voltage VC corresponding to the phase φ to be output, and generates the control signals CI and CQ for the pair of four-quadrant multipliers 2I and 2Q. For this purpose, the control circuit 4 includes an analog operating circuit which converts the received control voltage VC into the control signals CI=cos(VC) and CQ=sin(VC) in real time. More specifically, the control circuit 4 is implemented by using, as constituent elements, a voltage generator 400 which generates a plurality of reference voltages, and differential amplifier pairs 401I, 401Q, 402I, and 402Q each of which receives the control voltage VC and two reference voltages and detects whether the control voltage VC falls within or outside the range of the two reference voltages.

The voltage generator 400 generates a plurality of reference voltages V1 to V10. Based on a necessary total phase shift amount Δφ of the vector sum phase shifter, the necessary number N (N is an integer of 2 or more) of reference voltages is given by $$N = 4 \times (\Delta\phi - 90°)/360° + 2 \tag{1}$$

In FIG. 16, the number N of reference voltages is set to 10 to implement the phase shift amount Δφ=810°. As an example of the control circuit 4, the control circuit of the first embodiment has been exemplified here. However, any one of the control circuits of the second to 10th embodiments may be used.

Each of the differential amplifier pairs 401I, 401Q, 402I, and 402Q receives the control voltage VC and two reference voltages Vm and Vn, and detects whether the control voltage VC falls within or outside the range of the two reference voltages Vm and Vn. In this embodiment, the differential amplifier pairs 401I, 401Q, 402I, and 402Q are required to have not a function of simply detecting two states in which the control voltage VC falls within/outside the range of the two reference voltages but a function of converting the received control voltage VC into the control signals CI=cos(VC) and CQ=sin(VC) by analog operation. The analog operation of a differential amplifier that is a constituent element of the differential amplifier pairs 401I, 401Q, 402I, and 402Q will be described.

Figure 17A:
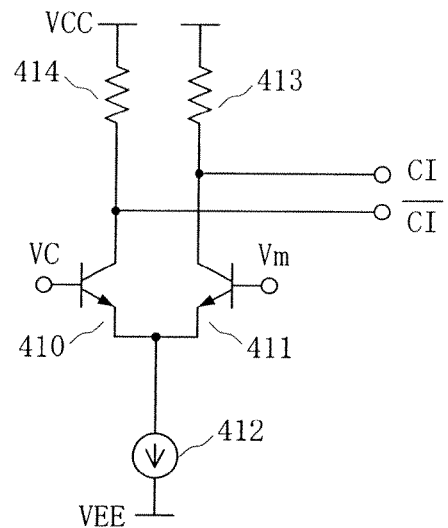
FIGS. 17A to 17C are views showing the circuit arrangement and operation of a differential amplifier that is a constituent element of a differential amplifier pair according to the 11th embodiment of the present invention.
Figure 17B:
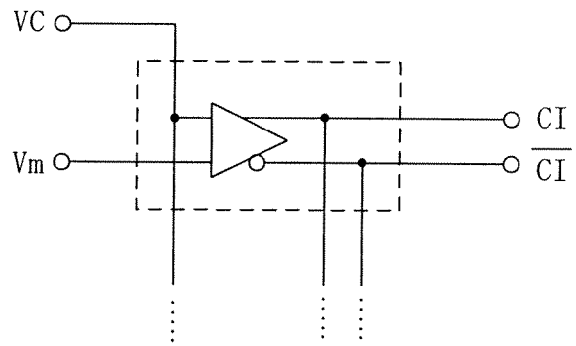
Figure 17C:
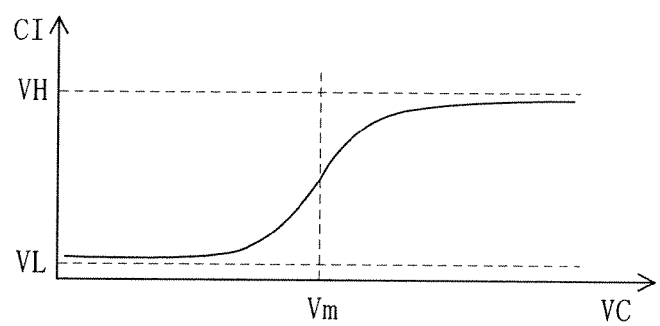

FIGS. 17A to 17C are views showing the circuit arrangement and operation of a differential amplifier. FIG. 17A is a circuit diagram of the differential amplifier. FIG. 17B is a circuit diagram showing the symbol of the differential amplifier in FIG. 17A. FIG. 17C is a graph showing the input/output characteristic (VC–CI characteristic) of the differential amplifier in FIG. 17A.

As shown in FIG. 17A, the differential amplifier includes a transistor 410 having a base receiving the control voltage VC, a transistor 411 having a base receiving the reference voltage Vm, a current source 412 having one terminal connected to the emitters of the transistors 410 and 411 and the other terminal receiving the power supply voltage VEE, a load resistor 413 having one terminal connected to the collector of the transistor 411 and the other terminal receiving the power supply voltage VCC, and a load resistor 414 having one terminal connected to the collector of the transistor 410 and the other terminal receiving the power supply voltage VCC. The control signal CI is output from the node between the load resistor 413 and the collector of the transistor 411. The control signal $\overline{CI}$ is output from the node between the load resistor 414 and the collector of the transistor 410. This differential amplifier is represented by the symbol in FIG. 17B.

Letting $\alpha$ be the current amplification factor of the base ground of the bipolar transistor, IEE be the current value of the current source 412, RL be the resistance value of the load resistors 413 and 414, and VT be a constant (VT=kT/q=26 mV, where k is the Boltzmann's constant, T is the absolute temperature, q is the charges of electrons), the control signal CI that is the output voltage of the differential amplifier is given by $$CI=RL\cdot\alpha\cdot IEE/(1+\exp((-VC+Vm)/VT)) \quad (2)$$

Considering the extreme value of the control voltage VC, when VC→∞, the control signal CI converges to VH=RL·α·IEE. When VC→-∞, the control signal CI converges to VL=0. On the other hand, when the control voltage VC is close to the reference voltage Vm, the control signal CI has the intermediate level between VH and VL. In this embodiment, the control voltage VC is set to a value near the reference voltage Vm so as to use the intermediate level, thereby converting the control voltage VC into the control signal CI similar to cos(VC) by analog operation. The example shown in FIGS. 17A to 17C indicates the arrangement for calculating the control signal CI. The arrangement for calculating the control signal CQ is also the same. The control voltage VC can be converted into the control signal CQ similar to sin(VC) by analog operation.

Figure 18A:
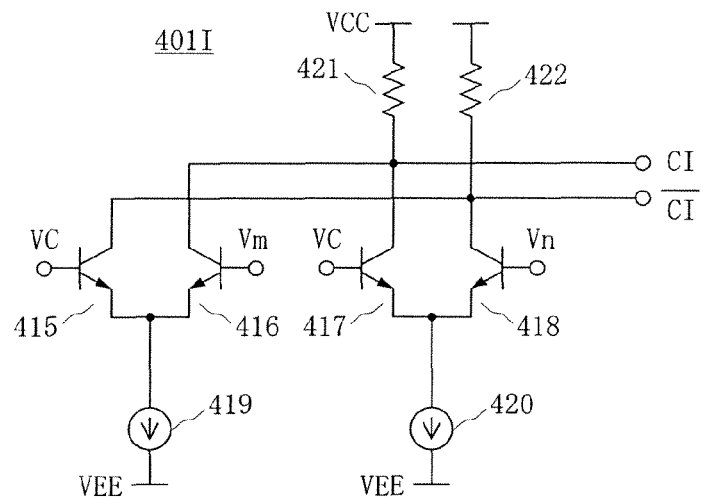
FIGS. 18A to 18C are views showing the circuit arrangement and operation of the differential amplifier pair according to the 11th embodiment of the present invention.
Figure 18B:
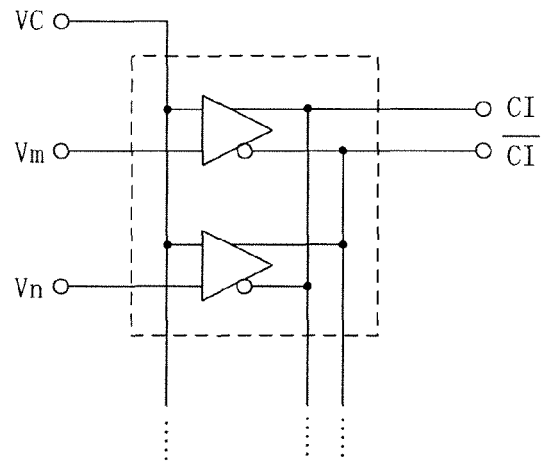
Figure 18C:
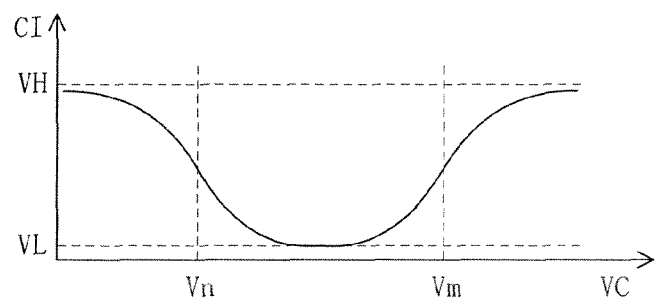

FIGS. 18A to 18C are views showing the circuit arrangement and operation of the differential amplifier pair 401I. FIG. 18A is a circuit diagram of the differential amplifier pair 401I. FIG. 18B is a circuit diagram showing the symbol of the differential amplifier pair 401I in FIG. 18A. FIG. 18C is a graph showing the input/output characteristic (VC–CI characteristic) of the differential amplifier pair 401I in FIG. 18A.

As shown in FIG. 18A, the differential amplifier pair 401I includes a differential circuit formed from transistors 415 and 416 having bases receiving the control voltage VC and the reference voltage Vm, a differential circuit formed from transistors 417 and 418 having bases receiving the control voltage VC and the reference voltage Vn, a current source 419 having one terminal connected to the emitters of the transistors 415 and 416 and the other terminal receiving the power supply voltage VEE, a current source 420 having one terminal connected to the emitters of the transistors 417 and 418 and the other terminal receiving the power supply voltage VEE, a load resistor 421 having one terminal connected to the collectors of the transistors 416 and 417 and the other terminal receiving the power supply voltage VCC, and a load resistor 422 having one terminal connected to the collectors of the transistors 415 and 418 and the other terminal receiving the power supply voltage VCC. The differential amplifier pair 401I thus includes two differential amplifiers. The control voltage VC and the reference voltage Vm are input to one differential amplifier. The control voltage VC and the reference voltage Vn are input to the other differential amplifier.

The outputs of the two differential amplifiers are connected in opposite phases. The control signal CI is output from the node between the load resistor 421 and the collectors of the transistors 416 and 417. The control signal $\overline{CI}$ is output from the node between the load resistor 422 and the collectors of the transistors 415 and 418. This differential amplifier is represented by the symbol in FIG. 18B. Note that the inputs may be connected in opposite phases, and the outputs may be connected in phase.

The control signal CI that is the output voltage of the differential amplifier pair 401I is given by $$CI=RL\cdot\alpha\cdot IEE/(1+\exp((-VC+Vn)/VT))+RL\cdot\alpha\cdot IEE/(1+\exp((VC-Vm)/VT)) \quad (3)$$

Considering the extreme value of the control voltage VC, when VC→∞, the first term of equation (3) converges to VH=RL·α·IEE, and the second term converges to VL=0. Hence, the control signal CI converges to VH=RL·α·IEE. When VC→-∞, the first term of equation (3) converges to VL=0, and the second term converges to VH=RL·α·IEE. Hence, the control signal CI converges to VH=RL·α·IEE. On the other hand, when the control voltage VC is close to the reference voltage Vm or the reference voltage Vn, the control signal CI has the intermediate level between VH and VL. In this embodiment, the control voltage VC is set to a value near the reference voltage Vm to a value near the reference voltage Vn so as to use the intermediate level.

Figure 19A:
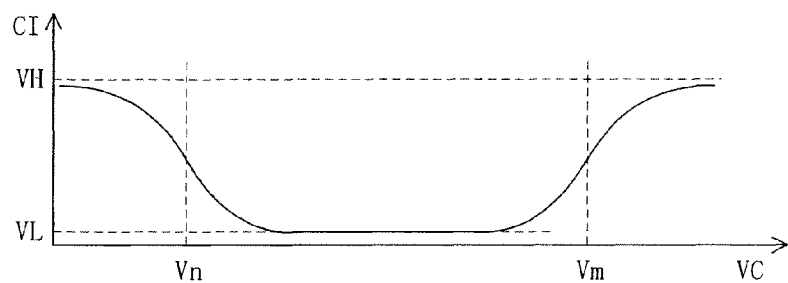
FIGS. 19A to 19C are graphs showing the input/output characteristic of the differential amplifier pair according to the 11th embodiment of the present invention.
Figure 19B:
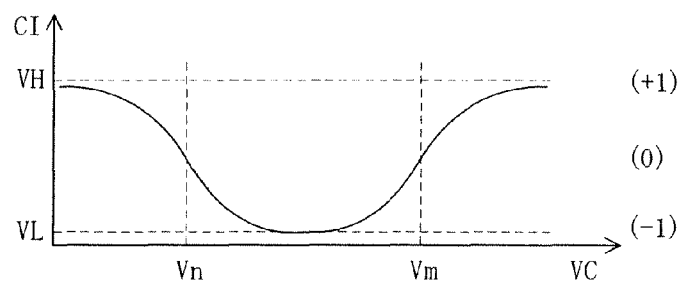
Figure 19C:
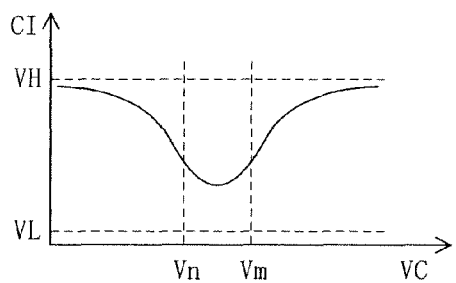

FIGS. 19A to 19C are graphs showing the input/output characteristic (VC–CI characteristic) of the differential amplifier. FIG. 19A is a graph showing the input/output characteristic when the difference between the reference voltages Vm and Vn is much larger than the constant VT (|Vm−Vn|>>8VT). FIG. 19B is a graph showing the input/output characteristic when the difference between the reference voltages Vm and Vn is almost eight times the constant VT (|Vm−Vn|≈8VT). FIG. 19C is a graph showing the input/output characteristic when the difference between the reference voltages Vm and Vn is much smaller than the constant VT (|Vm−Vn|<<8VT).

In general, when the control voltage VC corresponds to the intermediate voltage between the reference voltages Vm and Vn, the control signal CI is minimum. However, its behavior changes depending on the magnitude relation between the constant VT and the voltage difference between the reference voltages Vm and Vn. If the difference between the reference voltages Vm and Vn is much larger than the constant VT, the control signal CI is fixed to VL=0 within a wide range of the control voltage VC, as shown in FIG. 19A. Conversely, if the difference between the reference voltages Vm and Vn is much smaller than the constant VT, the control signal CI is minimum when the control voltage VC corresponds to the intermediate voltage between the reference voltages Vm and Vn, as shown in FIG. 19C. However, the voltage value of the control signal CI never decrease to VL.

Assume that the relationship between the constant VT and the voltage difference between the reference voltages Vm and Vn is selected appropriately (for example, voltage difference between the reference voltages Vm and Vn is set to about eight times the constant VT). In this case, when the control voltage VC corresponds to the intermediate voltage between the reference voltages Vm and Vn, as shown in FIG. 19B, the control signal CI lowers to near VL=0 and has a minimum value like a cos waveform or sin waveform.

As described above, when the relationship between the constant VT and the voltage difference between the reference voltage Vm and Vn is appropriately selected, the characteristic of the change of the control signal CI with respect to the control voltage VC can be made similar to cos(VC) or sin(VC). In addition, the control signal CI largely changes relative to the change of the control voltage VC and is hardly affected by noise. For this reason, the control signal CI is suitable as a control signal.

When the voltage difference between the reference voltages Vm and Vn is smaller than twice the constant VT or larger than 12 times the constant VT, the control signal CI has a waveform different from that of a sine wave or cosine wave. To make the control signal CI have a waveform like a sine wave or cosine wave, it is effective to set the voltage difference between the reference voltages Vm and Vn within the range from twice the constant VT (inclusive) to 12 times the constant VT (inclusive).

The major characteristic feature of this embodiment is to use the pseudo cos characteristic or sin characteristic of the output of the differential amplifier to control the four-quadrant multiplier.

When the control voltage VC is close to one of the reference voltages Vn (n is an integer), the input/output characteristic of the control circuit can be expressed by the transition function of one differential amplifier. A differential amplifier output having a characteristic similar to a sine wave or cosine wave will be explained. The input/output characteristic of the difference signal of a general differential amplifier can be described in the form of y=tan h(x) (reference, Paul R. Gray, Robert G. Meyer, "Analysis and design of analog integrated circuits", John Wiley & Sons, Inc., 1977, pp. 227-231). According to this, the transition function of a difference signal Vo of the differential amplifier near VC is given by

[Mathematical 1]

$$Vo = CI - \overline{CI} = RL \cdot \alpha \cdot IEE \tan h[(VC-Vn)/(2 \cdot VT)] \quad (4)$$

With the Taylor expansion for about x=0, tan h(x) is given by

[Mathematical 2]

$$\tanh(x) = x - \frac{x^3}{3} + \frac{2x^5}{15} - \frac{17x^7}{315} + \ldots \quad (5)$$

On the other hand, with the Taylor expansion for about x=0, sin(x) is given by

[Mathematical 3]

$$\sin(x) = \frac{x}{1!} - \frac{x^3}{3!} + \frac{x^5}{5!} - \frac{x^7}{7!} \ldots \quad (6)$$

Equation (5) representing the Taylor expansion of tan h(x) for about x=0 is compared with equation (6) representing the Taylor expansion of sin(x) for about x=0. The two equations are similar because the first terms match, and the second terms are different only in the coefficients.

As is apparent from this, near x=0 (corresponding to VC=Vn, and VC=Vm in this embodiment), the input/output characteristic (tan h waveform) of the difference signal of the differential amplifier is similar to a sine waveform.

The similarity between the input/output characteristic of the control circuit and a sine wave or cosine wave in a wider range will be described next. From VC=Vn to VC=V(n+1) to VC=V(n+2)=Vm, the input/output characteristic of the control circuit is described as the combined input/output characteristic of the two adjacent differential amplifiers.

$$Vo = RL \cdot \alpha \cdot IEE[\tan h[(VC-Vn)/(2 \cdot VT)] + \tan h[(V(n+2)-VC)/(2 \cdot VT)]-1] \quad (7)$$

To obtain the control circuit outputs CI and CQ with a large amplitude, both the two adjacent differential amplifiers need to be almost on or off for VC=V(n+1). To almost turn on or off both the two differential amplifiers, (V(n+2)−Vn) needs to be much larger than VT (=kT/q). On the other hand, if (V(n+2)−Vn) is excessively large, the control signals CI and CQ exhibit the characteristic shown in FIG. 19A, that is, a characteristic alienated from the ideal sine waveform represented by $$Videal = RL \cdot \alpha \cdot IEE \sin [(VC-Vn) \cdot \pi/VT] \quad (8)$$

Figure 20A:
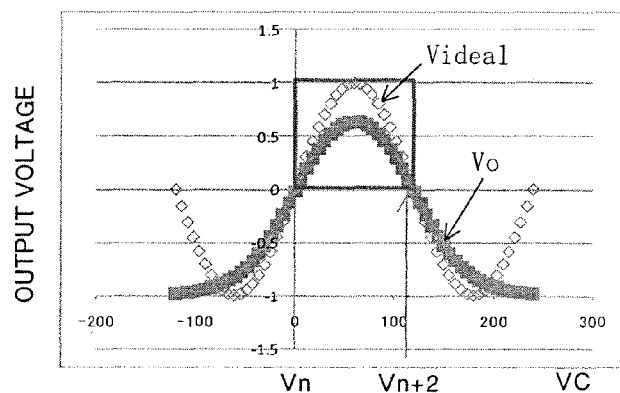
FIGS. 20A to 20C are graphs showing the input/output characteristic and ideal input/output characteristic of the control circuit according to the 11th embodiment of the present invention.
Figure 20B:
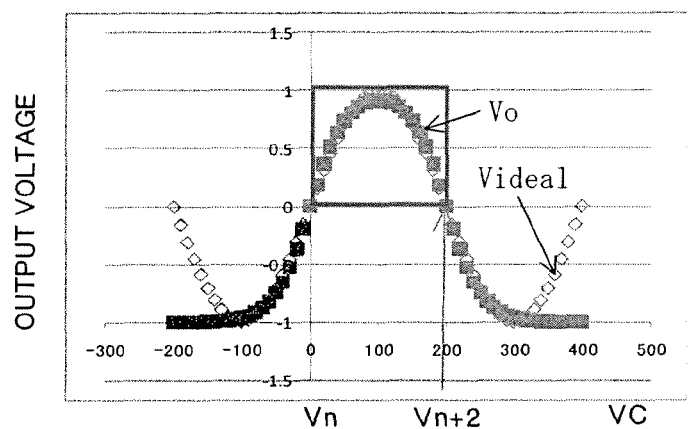
Figure 20C:
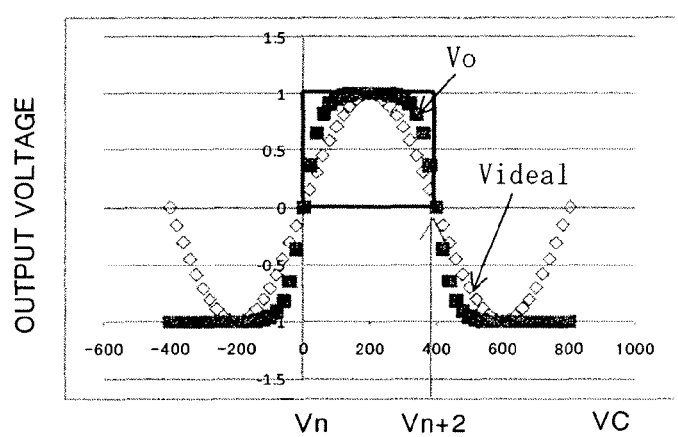

Videal represents the ideal value of the difference signal Vo of the differential amplifier. The alienation of the characteristic of the control signals CI and CQ from the ideal sine waveform results in poorer linearity of the phase shift operation or poorer constancy of the output amplitude. FIGS. 20A to 20C show the calculation results of the input/output characteristic of the control circuit represented by equation (7) and the ideal input/output characteristic represented by equation (8). In FIGS. 20A to 20C, the abscissa represents the output voltage, and the ordinate represents the control voltage VC. FIG. 20A shows the characteristics when V(n+2)−Vn is 4.6VT. FIG. 20B shows the characteristics when V(n+2)−Vn is 7.7VT. FIG. 20C shows the characteristics when V(n+2)−Vn is 15.4VT.

Figure 21:
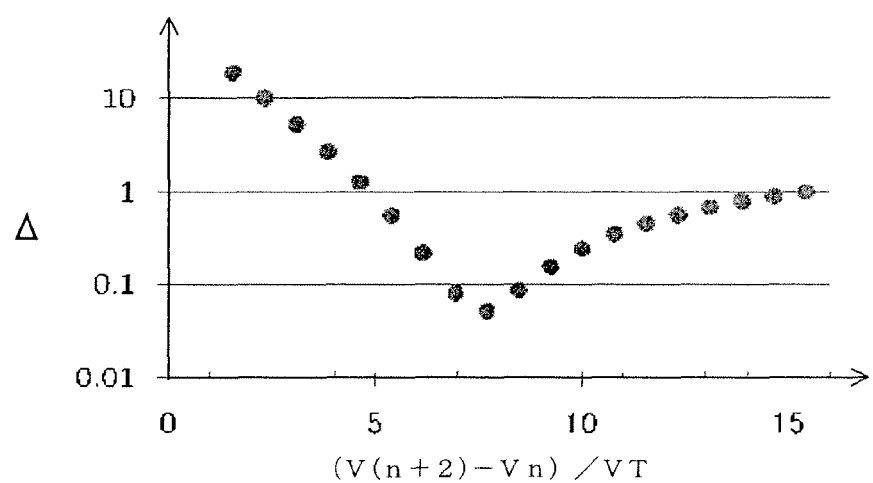
FIG. 21 is a graph showing the square of the alienation of the difference signal of the differential amplifier from an ideal sine wave according to the 11th embodiment of the present invention.

As shown in FIG. 21, a value Δ (arbitrary unit) corresponding to the sum of the squares (Vo−Videal)² of the alienation of the difference signal Vo of the differential amplifier from the ideal sine wave at 21 points from VC=Vn to VC=V(n+2) is minimum when (V(n+2)−Vn) is 196 mV, that is, 7.5·VT (when the ambient temperature is 300K).

As is apparent, when the difference between the reference voltages Vm and Vn is almost equal to eight times (more strictly, about 7.5 times according to the examples shown in FIGS. 20A to 20C) the constant VT, the similarity between the input/output characteristic of the control circuit and a sine wave or cosine wave rises within a wide range. To obtain the input/output characteristic of the control circuit which can be regarded as a sine wave or cosine wave, the voltage difference between the reference voltages Vm and Vn is preferably set within the range from twice the constant VT (inclusive) to 12 times (inclusive). The reason is as follows.

The upper limit of the voltage difference between the reference voltages Vm and Vn is determined based on the condition that the maximum value of the alienation |Vo−Videal| of the difference signal Vo of the differential amplifier from the ideal sine wave falls within 25% of the maximum amplitude of the ideal sine wave. When Vm−Vn is increased from 196 mV (=7.5·VT), the maximum value of |Vo−Videal| reaches 25% of the maximum amplitude of the ideal sine wave when Vm−Vn=303 mV (=11.7·VT). Hence, the upper limit of the voltage difference between the reference voltages Vm and Vn can be estimated about 12 times the constant VT.

The lower limit of the voltage difference between the reference voltages Vm and Vn is estimated considering (A) and (B).

(A) When the voltage difference Vm−Vn between the reference voltages Vm and Vn is decreased from 196 mV (=7.5·VT), the amplitude of the control signals CI and CQ becomes smaller and alienated from the ideal value in terms of calculation. However, the waveform itself remains close to a sine wave or cosine wave (FIG. 20A). Hence, for the lower limit, the condition that the maximum value of the alienation |Vo−Videal| of the difference signal Vo of the differential amplifier from the ideal sine wave falls within 25% of the maximum amplitude of the ideal sine wave is relaxed. The lower limit is determined based on the condition that the maximum value of the alienation |Vo−Videal| falls within 50% of the maximum amplitude of the ideal sine wave. More specifically, when Vm−Vn is decreased from 196 mV (=7.5·VT), the maximum value of |Vo−Videal| reaches 50% of the maximum amplitude of the ideal sine wave when Vm−Vn=102 mV (=3.9·VT).

(B) When implementing the differential amplifier by cascade-connecting two stages of differential amplifiers, the voltage difference Vm−Vn between the reference voltages Vm and Vn can be almost halved. Considering this case, it is necessary to further halve the lower limit of the voltage difference between the reference voltages Vm and Vn. More specifically, the lower limit is Vm−Vn=51 mV (=2·VT). Hence, the lower limit of the voltage difference between the reference voltages Vm and Vn can be estimated about twice the constant VT.

Due to the above-described reason, to obtain the input/output characteristic of the control circuit which can be regarded as a sine wave or cosine wave, the voltage difference between the reference voltages Vm and Vn is preferably set within the range from twice the constant VT (inclusive) to 12 times (inclusive).

Note that adding a negative feedback circuit to each differential amplifier included in the differential amplifier pair allows to adjust the gain of the differential amplifier and thus change the input/output (VC−CI) characteristic of the differential amplifier pair. For example, a negative feedback can be added by inserting a resistor to the emitter of each transistor. Adding the negative feedback circuit enables a design that adjusts the input/output characteristic of the differential amplifier pair without changing the conditions of Vm, Vn, and VT and thus improves the pseudo cos characteristic or pseudo sin characteristic.

The differential amplifier pair that generates the control signals CI and $\overline{CI}$ has been described with reference to FIGS. 17A to 19C. However, the differential amplifier pair that generates the control signals CQ and $\overline{CQ}$ can also be implemented by the same arrangement.

FIGS. 1 to 10 illustrate detailed implementation examples of the control circuit 4. The differential amplifier pair 401I includes differential amplifiers 440I and 441I. The differential amplifier pair 402I includes differential amplifiers 442I and 443I. Similarly, the differential amplifier pair 401Q includes differential amplifiers 440Q and 441Q. The differential amplifier pair 402Q includes differential amplifiers 442Q and 443Q. The differential amplifiers 440I to 444I on the in-phase signal side construct a first differential amplifier group. The differential amplifiers 440Q to 444Q on the quadrature signal side construct a second differential amplifier group.

The number N (N is an integer of 2 or more) of reference voltages can be selected from arbitrary integers to obtain the necessary total phase shift amount of the vector sum phase shifter. In FIGS. 1 to 10, N=10. The sum of the number of differential amplifiers included in the first differential amplifier group and the number of differential amplifiers included in the second differential amplifier group is N. Hence, to implement N=9, the differential amplifier 444I is removed from the arrangements shown in FIGS. 1 to 10. To implement N=8, the differential amplifiers 444I and 444Q are removed.

In the above description, a differential amplifier pair is regarded as a unit that implements one function. However, the minimum unit that implements the function of generating the pseudo cos characteristic or sin characteristic is a differential amplifier. One differential amplifier pair (that is, two differential amplifiers) can implement a characteristic corresponding to 360° of the cos characteristic and sin characteristic. However, the characteristic can be added or removed by differential amplifier. The adding or removing corresponds to adding or removing a characteristic corresponding to 180° of the cos characteristic or sin characteristic.

In FIGS. 1 to 10, five differential amplifiers (two differential amplifier pairs and one differential amplifier) are used to generate the control signal CI on the in-phase signal side. Five differential amplifiers (two differential amplifier pairs and one differential amplifier) are used to generate the control signal CQ on the quadrature signal side. Hence, a cos characteristic or sin characteristic corresponding to 180°×5=900° can be obtained on each of the in-phase signal side and the quadrature signal side. However, the operations for the control signals CI and CQ shift by a phase corresponding to 90°. Hence, in the vector sum phase shifter, a phase shift amount of 900°−90°=810° is obtained.

Figure 22:
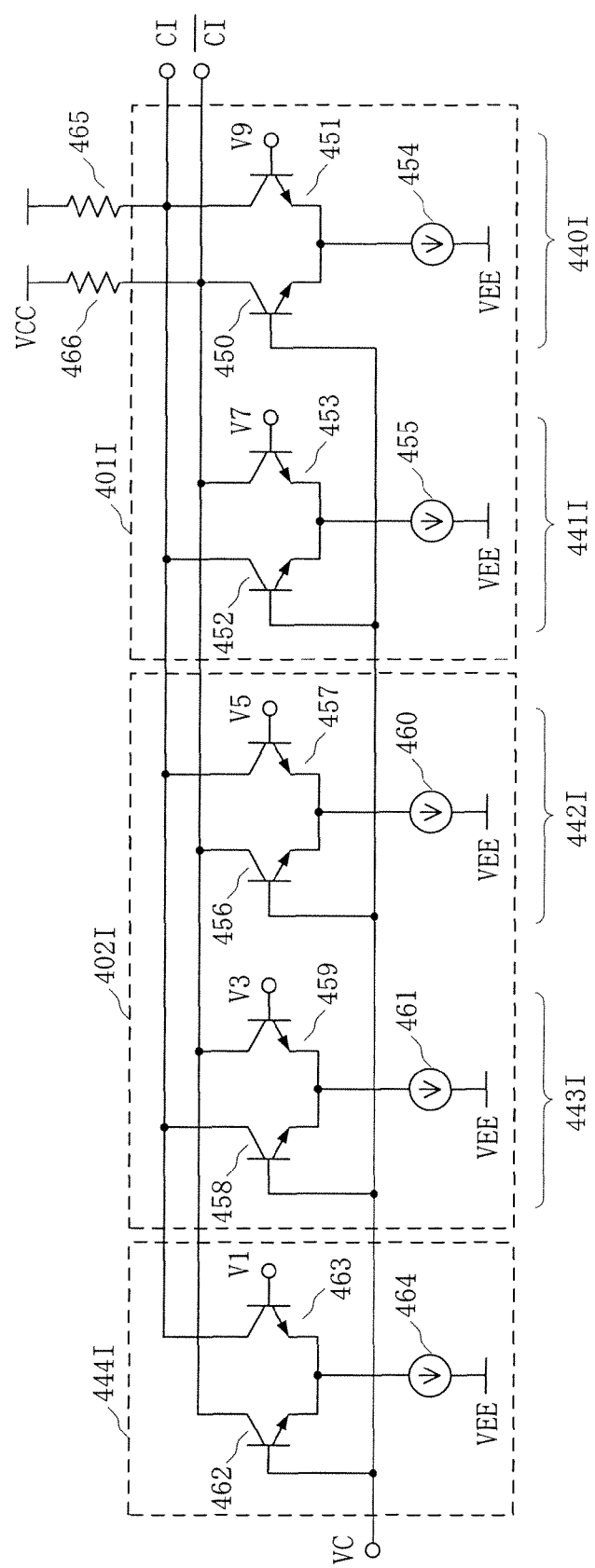
FIG. 22 is a circuit diagram showing an example of the arrangement of the differential amplifier pairs and the differential amplifier on the in-phase signal side in FIGS. 1 to 10.

FIG. 22 is a circuit diagram showing an example of the arrangement of the differential amplifier pairs 401I and 402I and the differential amplifier 444I on the in-phase signal side in FIGS. 1 to 10. The differential amplifier 440I includes transistors 450 and 451, current source 454, and load resistors 465 and 466. The differential amplifier 441I includes transistors 452 and 453, current source 455, and the load resistors 465 and 466. The differential amplifier 442I includes transistors 456 and 457, current source 460, and the load resistors 465 and 466. The differential amplifier 443I includes transistors 458 and 459, current source 461, and the load resistors 465 and 466. The differential amplifier 444I includes transistors 462 and 463, current source 464, and the load resistors 465 and 466.

Figure 23:
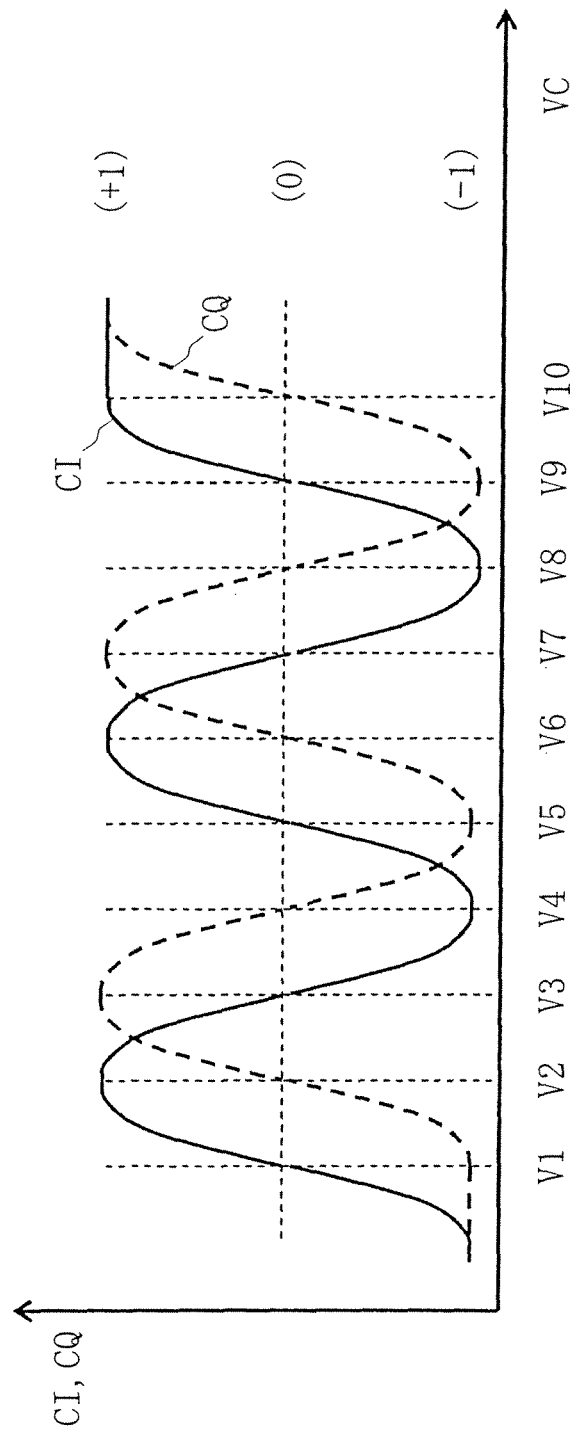
FIG. 23 is a graph showing the input/output characteristic of the control circuit according to the 11th embodiment of the present invention.

FIG. 23 is a graph showing the input/output characteristic of the control circuit 4. To understand the operation from a broad view, the operation of the entire control circuit 4 will be described with reference to the arrangement of the control circuit 4 shown in FIG. 16 and the input/output characteristics of the differential amplifier pair shown in FIGS. 19A to 19C.

First, the operation will be described with a focus placed on the differential amplifier pair 401I which receives the voltage V9 as the reference voltage Vm and the voltage V7 as the reference voltage Vn. In the range where the control voltage VC is higher than the voltage V6 and lower than the voltage V10, the control signal CI has the same characteristic as in FIG. 19B. More specifically, the voltage V6 is regarded as the reference (0°) of the phase. The level of the control signal CI can spuriously be understood as) cos(0°) at VC=V6, cos(90°) at VC=Vn=V7, cos(180°) at VC=V8, and cos(270°) at VC=Vm=V9. Referring to FIG. 19B, the voltage value for cos(0°) is VH, the voltage value for cos(180°) is VL, and the voltage value for cos(90° and cos(270°) is the intermediate value between VH and VL. In this embodiment, VH is defined as "1", VL is defined as "−1", and the intermediate value between VH and VL is defined as "0", as shown in FIG. 23.

The operation will be described with a focus placed on the differential amplifier pair 402I which receives the voltage V5 as the reference voltage Vm and the voltage V3 as the reference voltage Vn. In the range where the control voltage VC is higher than the voltage V2 and lower than the voltage V6, the control signal CI has the same characteristic as in FIG. 19B. More specifically, the voltage V2 is regarded as the reference (0°) of the phase. The level of the control signal CI can spuriously be understood as cos(0°) at VC=V2, cos(90°) at VC=Vn=V3 cos(180°) at VC=V4, and cos(270°) at VC=Vm=V5.

As is apparent, the above-described two differential amplifier pairs 401I and 402I can obtain a pseudo cos characteristic corresponding to 720° where the control voltage VC ranges from the voltage V2 to the voltage V10. When the differential amplifier (the differential amplifier 444I in FIGS. 1 to 10) that receives the voltage V1 is provided, the control signal CI has a value corresponding to cos(270° at the voltage V1. Combining the two differential amplifier pairs 401I and 402I and the differential amplifier 444I allows to obtain a pseudo cos characteristic corresponding to 810° where the control voltage VC ranges from the voltage V1 to the voltage V10.

The operation will be described with a focus placed on the differential amplifier pair 401Q which receives the voltage V10 as the reference voltage Vm and the voltage V8 as the reference voltage Vn. In the range where the control voltage VC is higher than the voltage V7, the control signal CQ has the same characteristic as that of the control signal CI in FIG. 19B. The reference is shifted by 90°, and the voltage V6 is regarded as the reference (0°) of the phase. The level of the control signal CQ can spuriously be understood as sin(0°) at VC=V6, sin(90°) at VC=V7, sin(180°) at VC=Vn=V8, and sin(270°) at VC=V9.

The operation will be described with a focus placed on the differential amplifier pair 402Q which receives the voltage V6 as the reference voltage Vm and the voltage V4 as the reference voltage Vn. In the range where the control voltage VC is higher than the voltage V3 and lower than the voltage V7, the control signal CQ has the same characteristic as that of the control signal CI in FIG. 19B. The reference is shifted by 90°, and the voltage V2 is regarded as the reference) (0°) of the phase. The level of the control signal CQ can spuriously be understood as sin(0°) at VC=V2, sin(90°) at VC=V3, sin (180°) at VC=Vn=V4, and sin(270°) at VC=V5.

As is apparent, the above-described two differential amplifier pairs 401Q and 402Q can obtain a pseudo sin characteristic corresponding to 720° where the control voltage VC ranges from the voltage V2 to the voltage V10. When the differential amplifier (the differential amplifier 444Q in FIGS. 1 to 10) that receives the voltage V2 is provided, the control signal CQ has a value corresponding to sin(0°) at VC=V2 and sin(270°) at VC=V1. Combining the two differential amplifier pairs 401Q and 402Q and the differential amplifier 444Q allows to obtain a pseudo sin characteristic corresponding to 810° where the control voltage VC ranges from the voltage V1 to the voltage V10.

As described above, the control circuit 4 of this embodiment is an analog operating circuit which converts the received control voltage VC into the control signals CI=cos (VC) and CQ=sin(VC) in real time. The control signal CI on the in-phase signal side and the control signal CQ on the quadrature signal side can simultaneously be obtained because the plurality of reference voltages generated by the voltage generator 400 in the control circuit 4 are alternately input to the differential amplifier pairs that perform the calculation on the in-phase signal side and the differential amplifier pairs that perform the calculation on the quadrature signal side. This connection method is the major factor that characterizes the embodiment. For example, in the examples shown in FIGS. 1 to 10, the voltages V9, V7, V5, V3, and V1 are used for the calculation on the in-phase signal side, and the voltages V10, V8, V6, V4, and V2 are used for the calculation on the quadrature signal side.

When the analog operation of converting the received control voltage VC into the control signals CI=cos(VC) and CQ=sin(VC) is ideally implemented without any error, the output amplitude of the vector sum phase shifter can remain constant even when the control voltage VC is changed to change the phase shift amount φ of the output signal of the vector sum phase shifter. However, the control circuit 4 of this embodiment aims at generating the pseudo cos characteristic or sin characteristic. Actually, the output amplitude cannot strictly be kept constant because of the presence of design errors or errors caused by external environmental variations. When designing the vector sum phase shifter of this embodiment, the necessary design accuracy of analog operation is determined based on the requirement of the constancy of the output amplitude.

Figure 24:
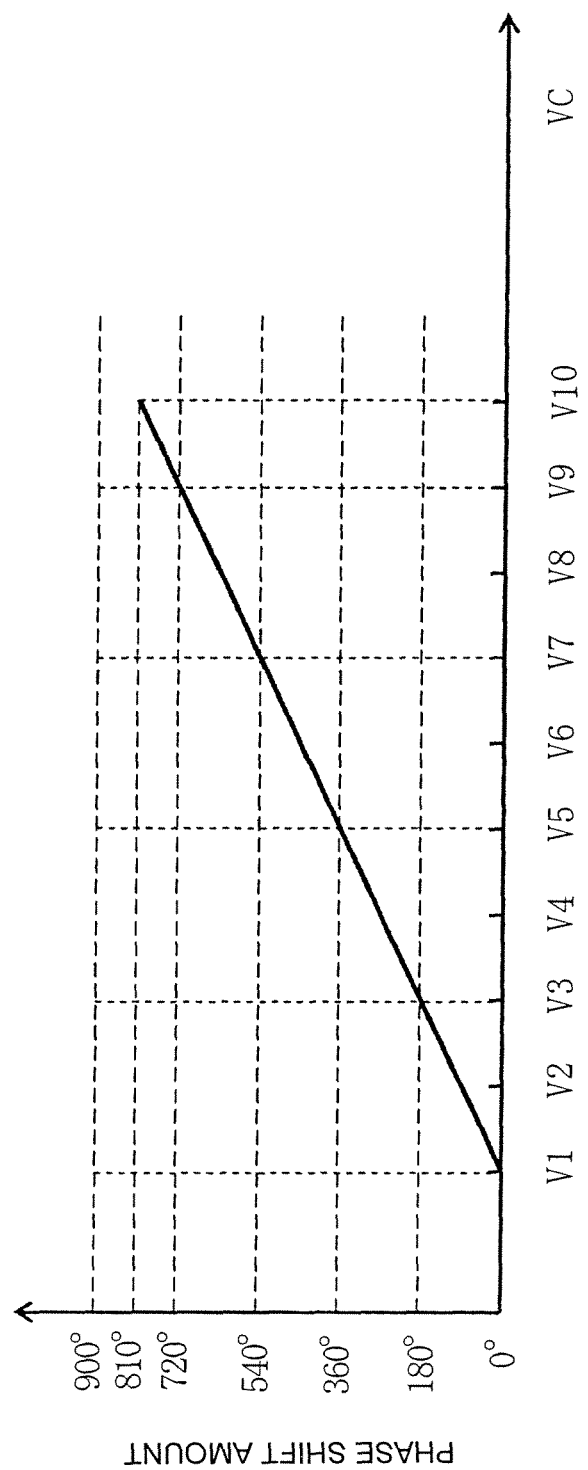
FIG. 24 is a graph showing the relationship between the control voltage and the phase shift amount of the output signal of the vector sum phase shifter according to the 11th embodiment of the present invention.

FIG. 24 is a graph showing the relationship between the control voltage VC and the phase shift amount φ of the output signal of the vector sum phase shifter according to the embodiment. When the control voltage VC is changed from the voltage V1 to the voltage V10, the phase of the output signal VOUT of the vector sum phase shifter can change from 0° to 810°.

Figure 25:
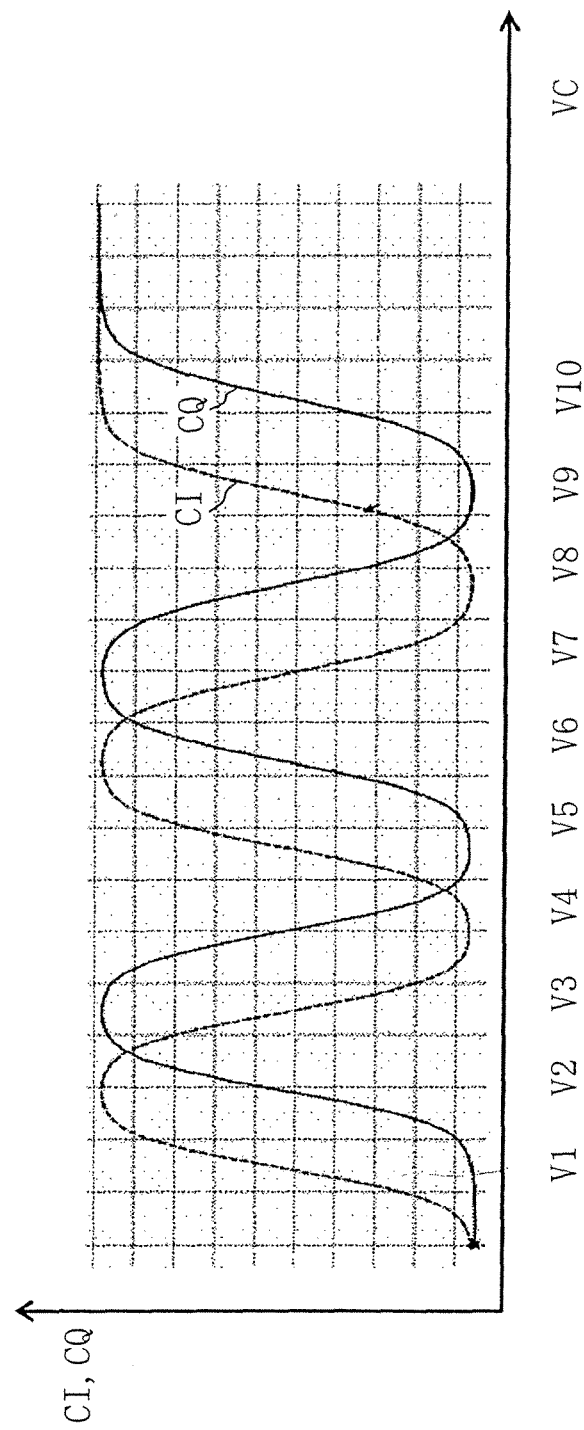
FIG. 25 is a graph showing the result of simulation of the input/output characteristic of the control circuit on a transistor model using the arrangements shown in FIGS. 1 to 10 and 22 as the differential amplifier arrangement.

FIG. 25 is a graph showing the result of simulation of the input/output characteristic of the control circuit 4 on an actual transistor model using the arrangements shown in FIGS. 1 to 10 and 22 as the differential amplifier arrangement. As is apparent from FIG. 25, a pseudo cos characteristic or sin characteristic which almost matches that in FIG. 23 can be obtained.

Figure 26A:
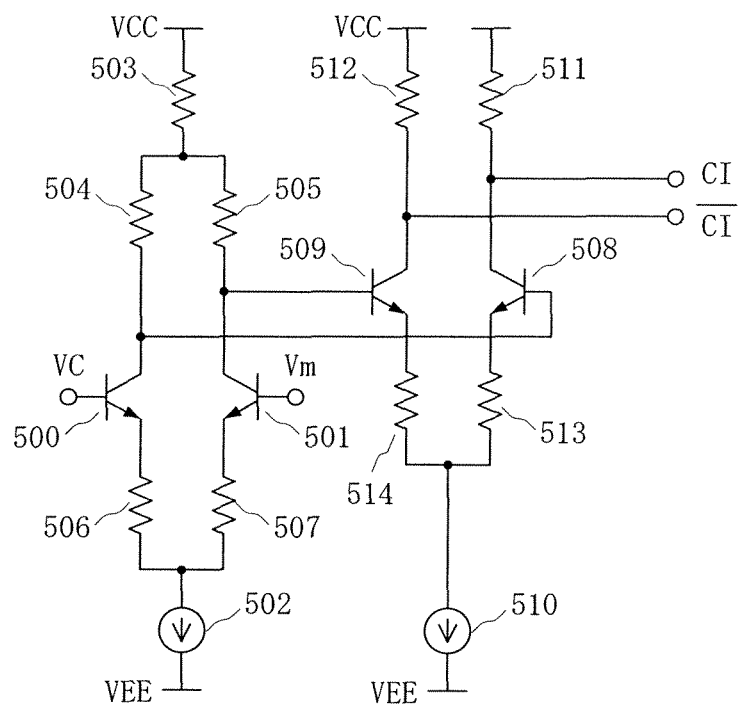
FIGS. 26A and 26B are views showing another circuit arrangement and operation of the differential amplifier that is a constituent element of the differential amplifier pair according to the 11th embodiment of the present invention.
Figure 26B:
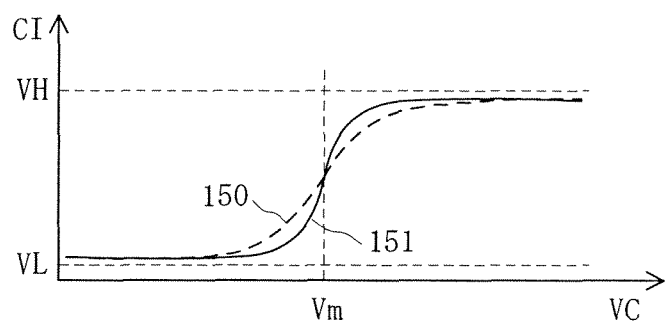

FIGS. 26A and 26B are views showing another circuit arrangement and operation of the differential amplifier shown in FIG. 17A. FIG. 26A is a circuit diagram of the differential amplifier. FIG. 26B is a graph showing the input/output characteristic (VC–CI characteristic) of the differential amplifier in FIG. 26A. Referring to FIG. 26B, 150 represents the input/output characteristic of the differential amplifier shown in FIG. 17A, and 151 represents the input/output characteristic of the differential amplifier shown in FIG. 26A.

As shown in FIG. 26A, the differential amplifier includes a transistor 500 having a base receiving the control voltage VC, a transistor 501 having a base receiving the reference voltage Vm, a current source 502 having one terminal receiving the power supply voltage VEE, a level shift resistor 503 having one terminal receiving the power supply voltage VCC, a load resistor 504 having one terminal connected to the collector of the transistor 500 and the other terminal connected to the other terminal of the level shift resistor 503, a load resistor 505 having one terminal connected to the collector of the transistor 501 and the other terminal connected to the other terminal of the level shift resistor 503, a negative feedback resistor 506 having one terminal connected to the emitter of the transistor 500 and the other terminal connected to the other terminal of the current source 502, a negative feedback resistor 507 having one terminal connected to the emitter of the transistor 501 and the other terminal connected to the other terminal of the current source 502, a transistor 508 having a base connected to the collector of the transistor 500, a transistor 509 having a base connected to the collector of the transistor 501, a current source 510 having one terminal receiving the power supply voltage VEE, a load resistor 511 having one terminal connected to the collector of the transistor 508 and the other terminal receiving the power supply voltage VCC, a load resistor 512 having one terminal connected to the collector of the transistor 509 and the other terminal receiving the power supply voltage VCC, a negative feedback resistor 513 having one terminal connected to the emitter of the transistor 508 and the other terminal connected to the other terminal of the current source 510, and a negative feedback resistor 514 having one terminal connected to the emitter of the transistor 509 and the other terminal connected to the other terminal of the current source 510. The control signal CI is output from the node between the load resistor 511 and the collector of the transistor 508. The control signal $\overline{CI}$ is output from the node between the load resistor 512 and the collector of the transistor 509.

In the circuit shown in FIG. 17A, the voltage difference between the reference voltages Vm and Vn needs to be about eight times the constant VT. When the ambient temperature is 300K, the constant VT is 26 mV. As a result, the voltage difference between the external reference voltages VRT and VRB is determined as 8VT·4.5≈1 V, resulting in little degree of freedom of design. In the circuit shown in FIG. 17A, the input/output characteristic of the differential amplifier can be adjusted by the negative feedback resistor (resistor added to the emitter of each transistor), as described above. However, the adjustment can be done only in a direction of increasing the voltage difference between the external reference voltages VRT and VRB.

In the circuit shown in FIG. 26A, however, the plurality of differential amplifiers are cascade-connected to obtain the input/output characteristic (VC–CI characteristic) steeper than that of the differential amplifier in FIG. 17A, as shown in FIG. 26B. This makes it possible to design a smaller voltage difference (for example, about 0.5 V) between the external reference voltages VRT and VRB. Assume that the reference voltage V1 corresponds to the external reference voltage VRT, and the reference voltage V10 corresponds to the external reference voltage VRB in FIG. 23. In this case, if the sine wave curve of the VC–CI characteristic is steep, the potential difference between V1 and V10 (VRT and VRB) is smaller. In addition, the voltage difference between the external reference voltages VRT and VRB can be increased by a negative feedback resistor, resulting in higher degree of freedom of design. In the circuit shown in FIG. 26A, the level shift resistor 503 is provided to cascade-connect the plurality of differential amplifiers without using an emitter follower. This effectively reduces the circuit scale and power consumption.

Figure 27:
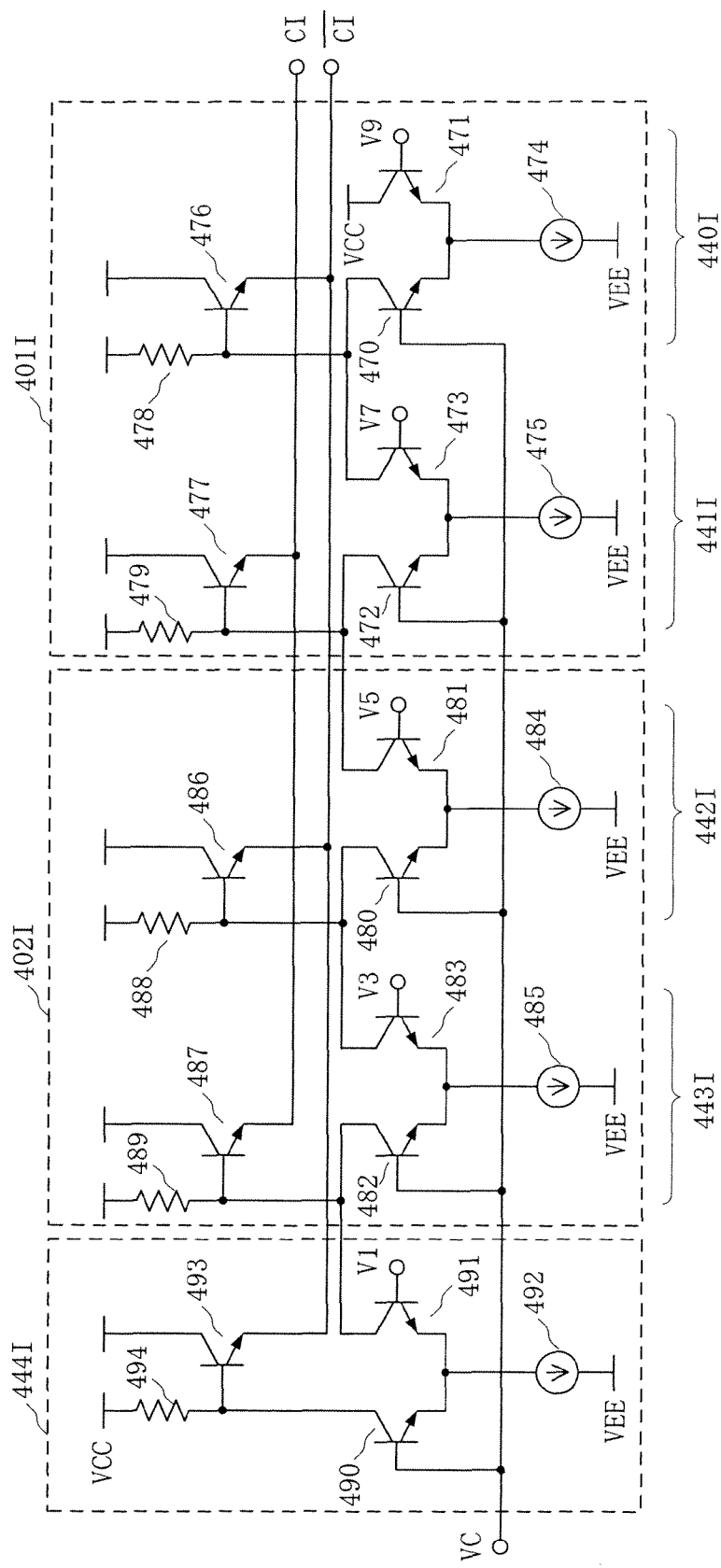
FIG. 27 is a circuit diagram showing another example of the arrangement of the differential amplifier pairs and the differential amplifier on the in-phase signal side in FIG. 10.

FIG. 27 is a circuit diagram showing another example of the arrangement of the differential amplifier pairs 401I and 402I and the differential amplifier 444I on the in-phase signal side in FIGS. 1 to 10. The differential amplifier 440I includes transistors 470, 471, and 476, current source 474, and resistor 478. The differential amplifier 441I includes transistors 472, 473, and 477, current source 475, and resistor 479. The differential amplifier 442I includes transistors 480, 481, and 486, current source 484, and resistor 488. The differential amplifier 443I includes transistors 482, 483, and 487, current source 485, and resistor 489. The differential amplifier 444I includes transistors 490, 491, and 493, current source 492, and resistor 494. According to the circuit shown in FIG. 27, it is possible to obtain the same input/output characteristic as that of the circuit in FIG. 22. Note that the differential amplifier pairs 401Q and 402Q and the differential amplifier 444Q on the quadrature signal side can also be implemented by the same arrangement as in FIG. 27.

The conventional vector sum phase shifter uses a control circuit including a large-scale digital circuit and DACs. This increases the circuit scale and power consumption. Such an increase in the circuit scale and power consumption leads to an increase in the size and cost of an optical communication transceiver which includes the vector sum phase shifter. In addition, the control band (maximum speed of phase control) of the conventional vector sum phase shifter is limited to the band of the control circuit. For this reason, when the vector sum phase shifter is used for NRZ (Non Return to Zero)-RZ (Return to Zero) conversion in the optical communication transceiver, the resistance against phase variations caused by disturbances (variations in the power supply voltage and the like) due to environmental changes cannot be made sufficiently high. This makes it impossible to implement a sufficiently high control band when feedback-controlling the phase position of NRZ-RZ conversion.

The above-described problem of control band can be solved by removing the control circuit of the conventional vector sum phase shifter and supplying the analog level (voltage or current) of one of the control signals DAI and DAQ of the variable gain amplifiers (or one of the control signals CI and CQ) directly from the outside. In this method, however, the variable phase φ is limited to the range of 0° to 180°, and the output amplitude largely varies depending on the phase (for example, when CQ is fixed to 0.5, and CI is changed from −1 to 1, the output amplitude changes between the maximum value $(5^{1/2})/2$ and the minimum value ½).

In this embodiment, however, it is possible to provide a control circuit which generates the control signal of a means (variable gain amplifier or four-quadrant multiplier) for adjusting the signal amplitude using an analog differential amplifier, that is, using the output characteristic of a differential amplifier, which is similar to a sine wave or a cosine wave, without using a digital circuit and a DAC. Hence, applying the control circuit of this embodiment to a vector sum phase shifter enables to provide a vector sum phase shifter which simultaneously achieves a small circuit scale, low power consumption, wide control band, wide phase shift range, and suppression of variations in the output amplitude.

Figure 28:
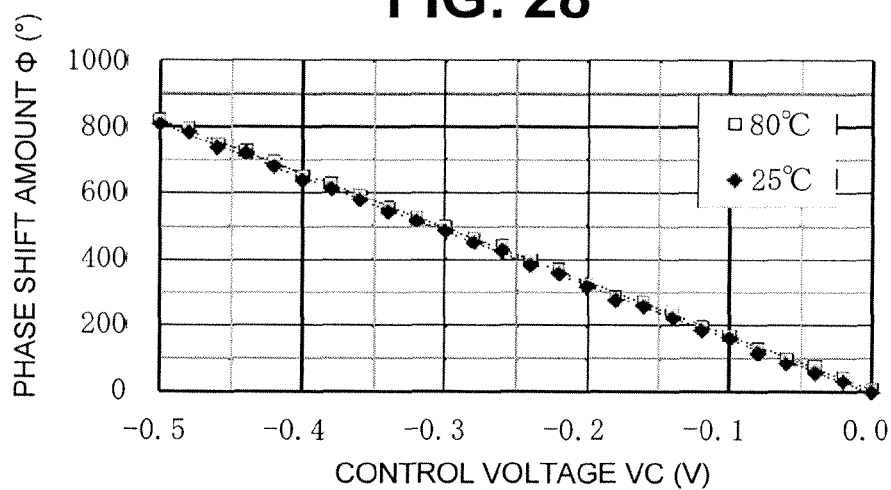
FIG. 28 is a graph showing the temperature dependence of the relationship between the control voltage and the phase shift amount of the output signal of the vector sum phase shifter according to the 11th embodiment of the present invention.

FIG. 28 is a graph showing the temperature dependence of the relationship between a control voltage VC and a phase shift amount φ of an output signal in an IC in which the vector sum phase shifter of this embodiment is integrated by an InP HBT (Heterojunction Bipolar Transistor). In this case, the control circuit of the eighth embodiment shown in FIG. 8 is used as the control circuit 4. The input signal to the vector sum phase shifter is a sine wave of 21.5 GHz. As is apparent from FIG. 28, phase shift in the wide range from 0° to 810° is implemented by changing the control voltage VC. Adopting the differential amplifier shown in FIG. 26A enables to implement the range of the control voltage VC as small value as 0.5 V. As can be seen, adopting the control circuit shown in FIG.

8 enables to suppress the phase variation to 40° or less with respect to the temperature change from 25° to 80°.

Figure 29:
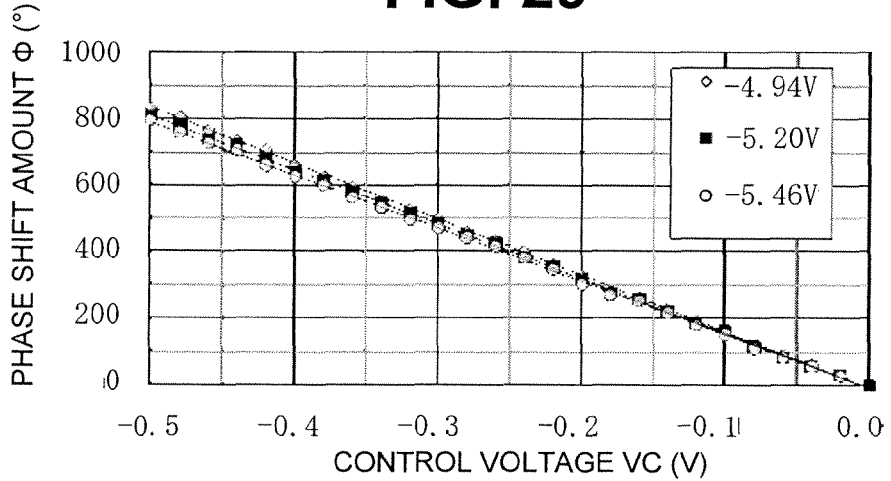
FIG. 29 is a graph showing the power supply voltage dependence of the relationship between the control voltage and the phase shift amount of the output signal of the vector sum phase shifter according to the 11th embodiment of the present invention.

FIG. 29 is a graph showing the power supply voltage dependence of the relationship between the control voltage VC and the phase shift amount φ of the output signal in an IC in which the vector sum phase shifter of this embodiment is integrated by an InP HBT. The input signal to the vector sum phase shifter is a sine wave of 21.5 GHz. In this case, a power supply voltage VCC is set at the ground potential. As can be seen, adopting the control circuit shown in FIG. 8 enables to suppress the phase variation to 40° or less even when a power supply voltage VEE varies from −5.20 V by +5% (−4.94 V) or by −5% (−5.46 V).

Figure 30:
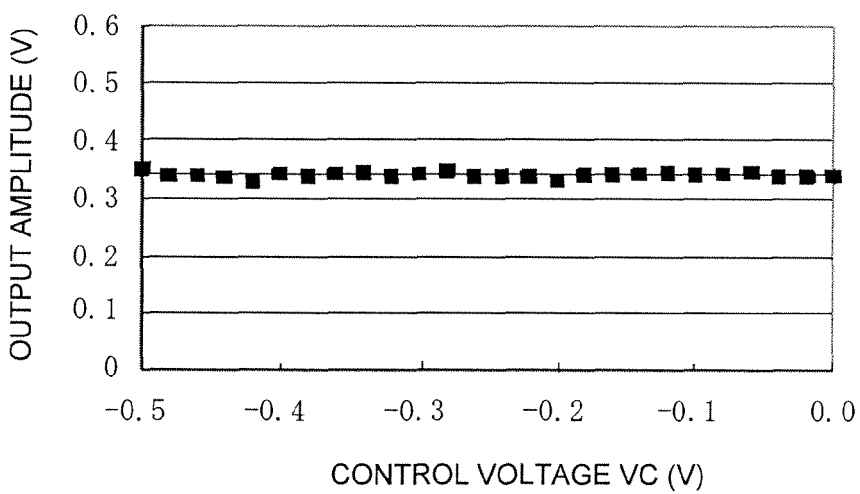
FIG. 30 is a graph showing the relationship between the control voltage and the output amplitude of the vector sum phase shifter according to the 11th embodiment of the present invention.

FIG. 30 is a graph showing the relationship between the control voltage VC and the output amplitude in an IC in which the vector sum phase shifter of this embodiment is integrated by an InP HBT. The input signal to the vector sum phase shifter is a sine wave of 21.5 GHz. Adopting the control circuit shown in FIG. 8 enables to generate control signals CI and CQ close to an ideal sine wave or cosine wave. As a result, the amplitude variation for the average output amplitude 360 mV of the vector sum phase shifter is ±11 mV within the variable range (−0.5 to 0 V) of the control voltage VC. As can be seen, it is possible to suppress the amplitude variation to about 3%.

12th Embodiment

Figure 31:
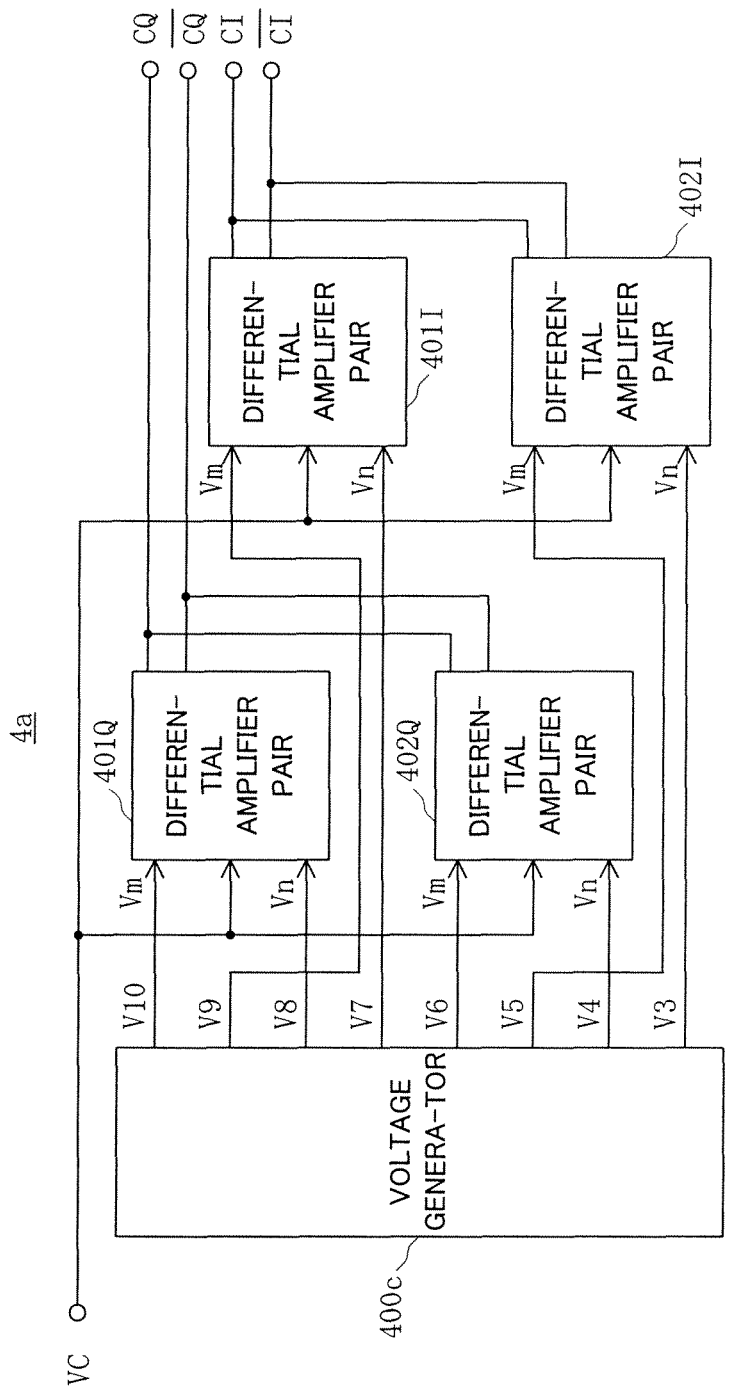
FIG. 31 is a block diagram showing the arrangement of the control circuit of a vector sum phase shifter according to the 12th embodiment of the present invention.

The 12th embodiment of the present invention will be described next. FIG. 31 is a block diagram showing the arrangement of a control circuit 4a according to the 12th embodiment of the present invention. The same reference numerals as in FIG. 16 denote the same parts in FIG. 31. The overall arrangement of the vector sum phase shifter is the same as in the 11th embodiment.

In this embodiment, the number N of reference voltages is set to 8 so that a total phase shift amount Δφ of the vector sum phase shifter is 630°. Hence, each of the first differential amplifier group on the in-phase signal side and the second differential amplifier group on the quadrature signal side includes four differential amplifiers.

Figure 32:
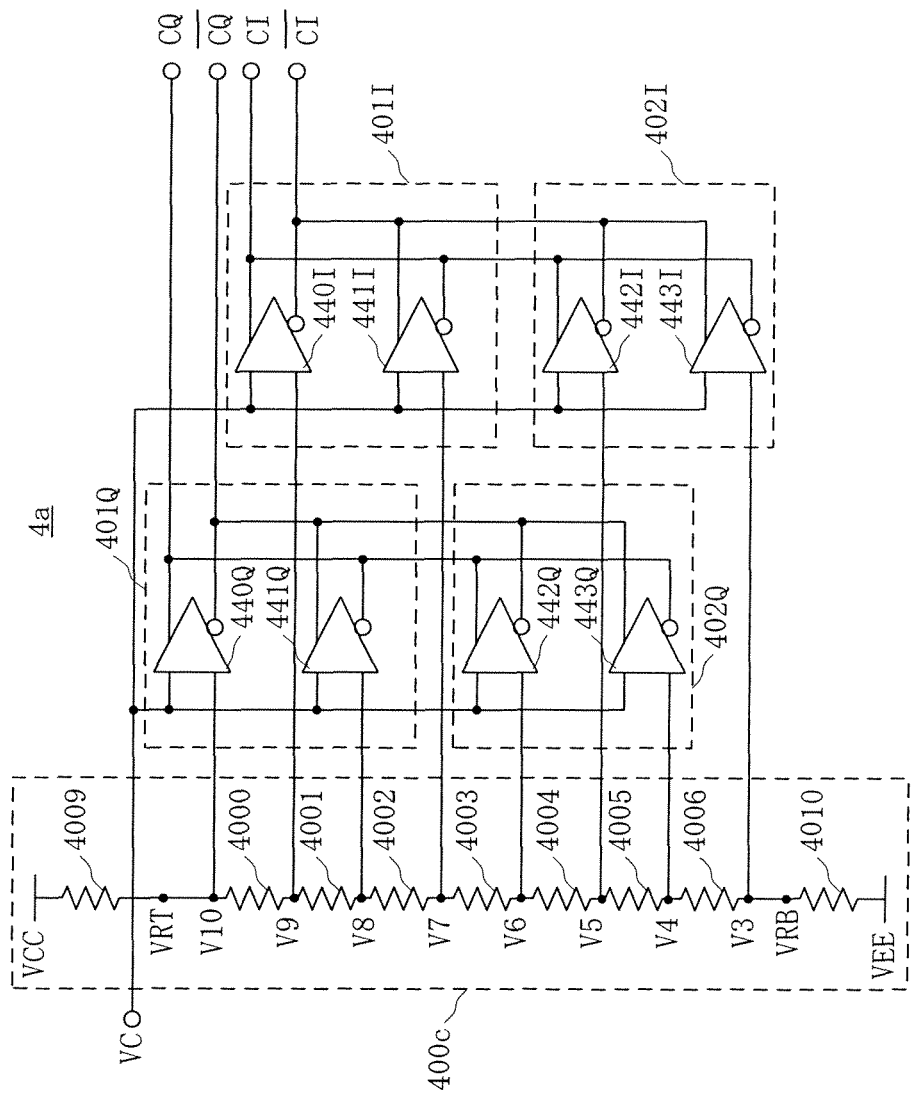
FIG. 32 is a block diagram showing a detailed implementation example of the control circuit according to the 12th embodiment of the present invention.

FIG. 32 is a block diagram showing a more detailed implementation example of the control circuit 4a. A voltage generator 400c is formed from a resistor ladder including resistors 4000 to 4006. A differential amplifier pair 401I includes differential amplifiers 440I and 441I. A differential amplifier pair 402I includes differential amplifiers 442I and 443I. Similarly, a differential amplifier pair 401Q includes differential amplifiers 440Q and 441Q. A differential amplifier pair 402Q includes differential amplifiers 442Q and 443Q. An example has been described here in which the differential amplifiers 444I and 444Q are removed from the control circuit of the first embodiment shown in FIG. 1, and the resistors 4007 and 4008 are also removed from the voltage generator. The control circuit 4a can also be implemented by modifying the control circuits of the second to 10th embodiments in the same way.

Figure 33:
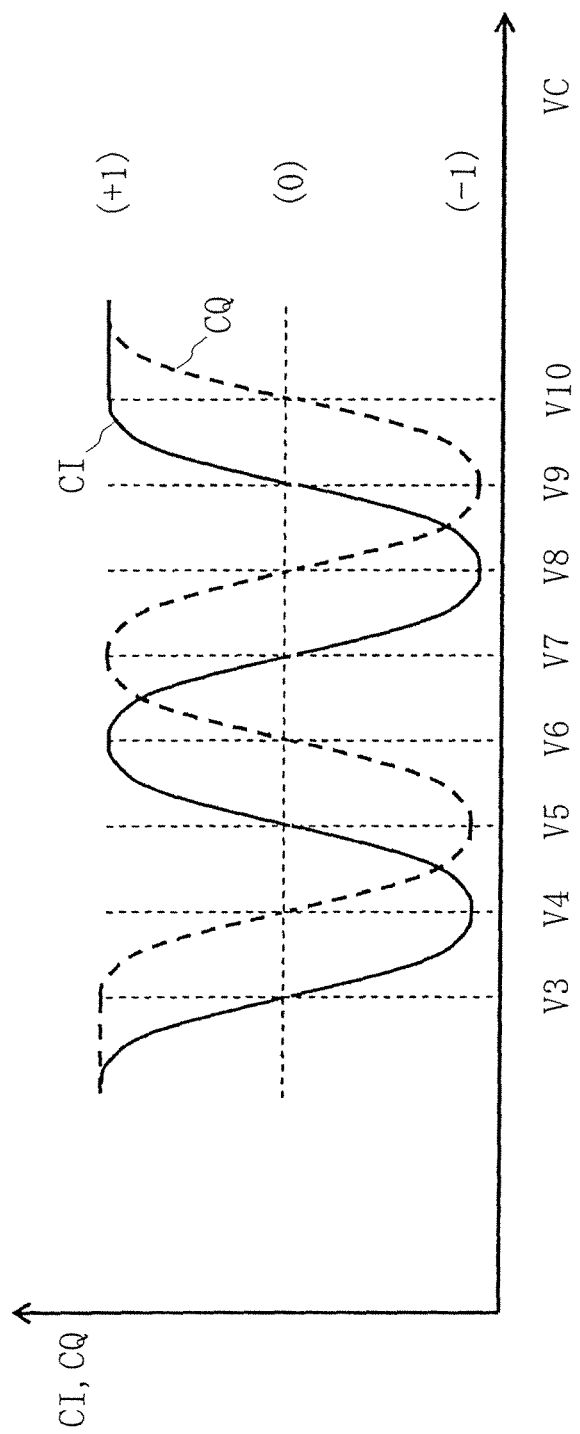
FIG. 33 is a graph showing the input/output characteristic of the control circuit according to the 12th embodiment of the present invention.

FIG. 33 is a graph showing the input/output characteristic of the control circuit 4a. The operation of the entire control circuit 4a will be described with reference to the arrangement of the control circuit 4a shown in FIG. 31 and the input/output characteristics of the differential amplifier pair shown in FIGS. 19A to 19C.

First, the operation will be described with a focus placed on the differential amplifier pair 401I which receives a voltage V9 as a reference voltage Vm and a voltage V7 as the reference voltage Vn. In the range where a control voltage VC is higher than a voltage V6 and lower than a voltage V10, a control signal CI has the same characteristic as in FIG. 19B. More specifically, the voltage V6 is regarded as the reference (0°) of the phase. The level of the control signal CI can spuriously be understood as cos(0°) at VC=V6, cos(90°) at VC=Vn=V7, cos(180°) at VC=V8, and cos(270°) at VC=Vm=V9.

The operation will be described with a focus placed on the differential amplifier pair 402I which receives a voltage V5 as the reference voltage Vm and a voltage V3 as the reference voltage Vn. In the range where the control voltage VC is higher than a voltage V2 and lower than the voltage V6, the control signal CI has the same characteristic as in FIG. 19B. More specifically, the voltage V2 is regarded as the reference (0°) of the phase. The level of the control signal CI can spuriously be understood as cos(0°) at VC=V2, cos(90°) at VC=Vn=V3, cos(180°) at VC=V4, and cos(270°) at VC=Vm=V5.

As is apparent, the above-described two differential amplifier pairs 401I and 402I can obtain a pseudo cos characteristic corresponding to 720° where the control voltage VC ranges from the voltage V2 to the voltage V10 (corresponding to 630° where the control voltage VC ranges from the voltage V3 to the voltage V10).

The operation will be described with a focus placed on the differential amplifier pair 401Q which receives the voltage V10 as the reference voltage Vm and the voltage V8 as the reference voltage Vn. In the range where the control voltage VC is higher than the voltage V7, a control signal CQ has the same characteristic as that of the control signal CI in FIG. 19B. The reference is shifted by 90°, and the voltage V6 is regarded as the reference (0°) of the phase. The level of the control signal CQ can spuriously be understood as sin(0°) at VC=V6, sin(90°) at VC=V7, sin(180°) at VC=Vn=V8, and sin(270°) at VC=V9.

The operation will be described with a focus placed on the differential amplifier pair 402Q which receives the voltage V6 as the reference voltage Vm and the voltage V4 as the reference voltage Vn. In the range where the control voltage VC is higher than the voltage V3 and lower than the voltage V7, the control signal CQ has the same characteristic as that of the control signal CI in FIG. 19B. The reference is shifted by 90°, and the voltage V2 is regarded as the reference (0°) of the phase. The level of the control signal CQ can spuriously be understood as sin(0°) at VC=V2, sin(90°) at VC=V3, sin (180°) at VC=Vn=V4, and sin(270°) at VC=V5.

As is apparent, the above-described two differential amplifier pairs 401Q and 402Q can obtain a pseudo sin characteristic corresponding to 630° where the control voltage VC ranges from the voltage V3 to the voltage V10.

As described above, the control circuit 4a of this embodiment is an analog operating circuit which converts the received control voltage VC into the control signals CI=cos (VC) and CQ=sin(VC) in real time. The control signal CI on the in-phase signal side and the control signal CQ on the quadrature signal side can simultaneously be obtained because the plurality of reference voltages generated by the voltage generator 400c in the control circuit 4a are alternately input to the differential amplifier pairs that perform the calculation on the in-phase signal side and the differential amplifier pairs that perform the calculation on the quadrature signal side. This connection method is the major factor that characterizes the embodiment. For example, in the example shown in FIG. 31, the voltages V9, V7, V5, and V3 are used for the calculation on the in-phase signal side, and the voltages V10, V8, V6, and V4 are used for the calculation on the quadrature signal side.

Figure 34:
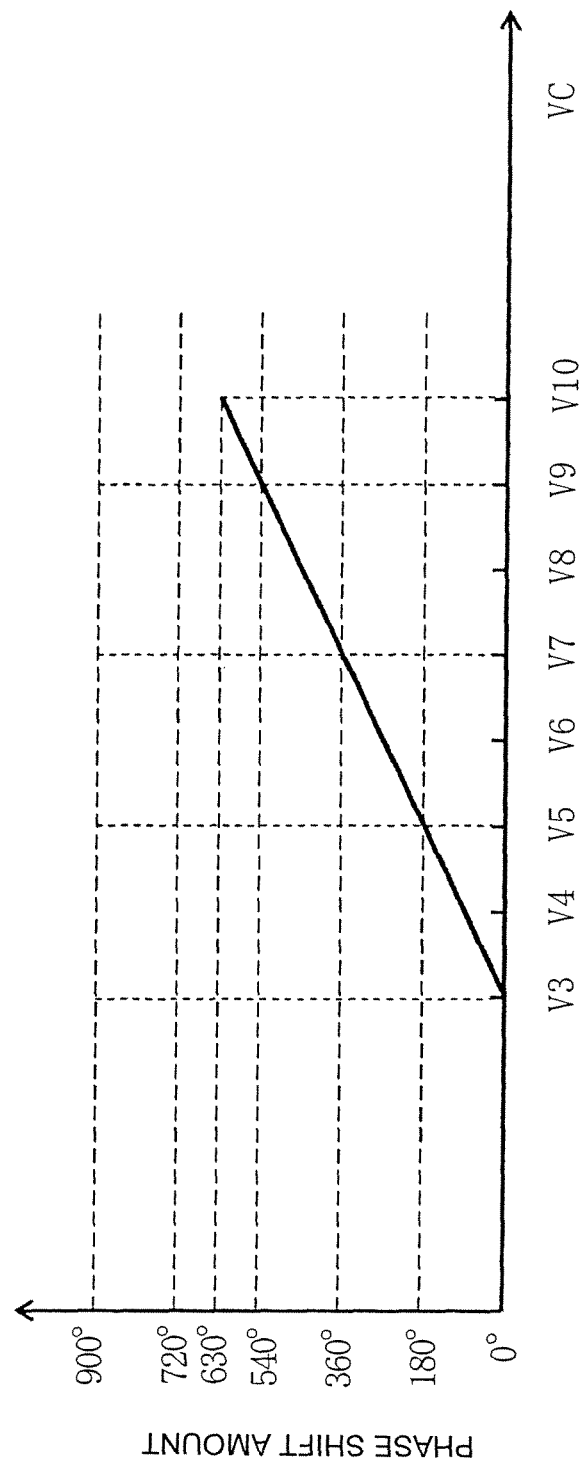
FIG. 34 is a graph showing the relationship between the control voltage and the phase shift amount of the output signal of the vector sum phase shifter according to the 12th embodiment of the present invention.

FIG. 34 is a graph showing the relationship between the control voltage VC and the phase shift amount φ of the output signal of the vector sum phase shifter according to the embodiment. When the control voltage VC is changed from the voltage V3 to the voltage V10, the phase of an output signal VOUT of the vector sum phase shifter can change from 0° to 630°.

Note that in the 11th and 12th embodiments, the plurality of differential amplifier pairs are arranged on each of the in-phase signal side and the quadrature signal side. However, the operation of the control circuits 4 and 4a of the 11th and 12th embodiments (analog operation of converting the received control voltage into the control signals similar to a sine wave or cosine wave) can also be implemented using an arrangement including one differential amplifier pair arranged on each of the in-phase signal side and the quadrature signal side.

The operation of the control circuits 4 and 4a of the 11th and 12th embodiments can also be implemented using an arrangement including one differential amplifier arranged on each of the in-phase signal side and the quadrature signal side.

13th Embodiment

Figure 35:
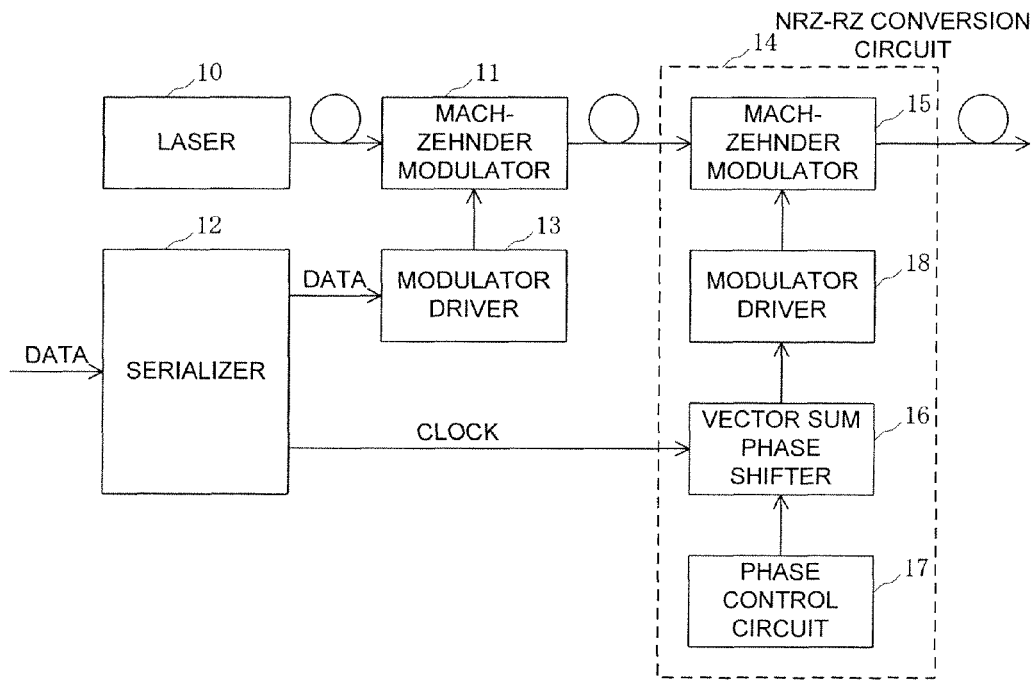
FIG. 35 is a block diagram showing the arrangement of an optical transceiver according to the 13th embodiment of the present invention.

The 13th embodiment of the present invention will be described next. FIG. 35 is a block diagram showing the arrangement of the transmitter of an optical transceiver according to the 13th embodiment of the present invention. In this embodiment, one of the vector sum phase shifters according to the 11th and 12th embodiments is applied to the NRZ-RZ conversion circuit of the optical transceiver.

The transmitter of the optical transceiver includes a laser 10, Mach-Zehnder modulator 11, serializer 12, modulator driver 13, and NRZ-RZ conversion circuit 14.

The NRZ-RZ conversion circuit 14 includes a Mach-Zehnder modulator 15, vector sum phase shifter 16, phase control circuit 17, and modulator driver 18.

The serializer 12 receives low-speed parallel data and outputs high-speed serial data. When the modulation scheme is, for example, OOK (On-Off Keying) or DPSK (Differential Phase Shift Keying), the serializer 12 outputs one data (two data for difference signals). When the modulation scheme is DQPSK (Differential Quadrature Phase Shift Keying), the serializer 12 outputs two data (four data for difference signals).

The modulator driver 13 amplifies the data output from the serializer 12 into a voltage amplitude capable of driving the Mach-Zehnder modulator 11.

In accordance with the output signal from the modulator driver 13, the Mach-Zehnder modulator 11 phase- or amplitude-modulates continuous light input from the laser 10 and outputs NRZ signal light.

Upon receiving the NRZ signal light and clocks, the NRZ-RZ conversion circuit 14 converts the NRZ signal light into RZ signal light and outputs it.

The clock input from the serializer 12 to the NRZ-RZ conversion circuit 14 is adjusted to an optimum phase by the vector sum phase shifter 16 and amplified by the modulator driver 18 to a voltage amplitude capable of driving the Mach-Zehnder modulator 15. Note that the optimum phase means the most appropriate phase relation between the NRZ signal light and the clock input to the Mach-Zehnder modulator 15. In general, it indicates a phase relation that cuts the phase that most stabilizes the NRZ signal light into the RZ signal by the clock.

The Mach-Zehnder modulator 15 cuts (that is, amplitude-modulates) the received NRZ signal light based on the output signal from the modulator driver 18, thereby outputting RZ signal light.

Adjusting the clock to the optimum phase is done by causing the phase control circuit 17 to, for example, monitor the waveform output from the vector sum phase shifter 16 and control it. The shift of the clock phase from the optimum phase is detected as, for example, voltage information. The phase control circuit 17 outputs a control voltage VC based on the information to adjust the clock to the optimum phase, thereby controlling the vector sum phase shifter 16.

In this embodiment, one of the vector sum phase shifters according to the 11th and 12th embodiments is applied to the optical transceiver, thereby implementing size and cost reduction. Especially when one of the vector sum phase shifters according to the 11th and 12th embodiments is applied to NRZ-RZ conversion in the optical transceiver, the resistance against phase variations caused by disturbances (variations in the power supply voltage and the like) due to environmental changes can be increased because a wider control band can be ensured. It is also possible to perform phase control on analog level. In this embodiment, when performing wide band control in analog form from the outside, the phase shift enable range can greatly be widened from 180° in the conventional method (for example, to 810°). At this time, variations in the output amplitude can be suppressed.

Note that in this embodiment, one of the vector sum phase shifters according to the 11th and 12th embodiments is applied to the NRZ-RZ conversion circuit of the optical transceiver. However, the present invention is not limited to this. The vector sum phase shifter is also applicable to a measuring instrument such as an arbitrary waveform generator or pulse pattern generator.

Additionally, in the first to 13th embodiments, the control circuit of a vector sum phase shifter has been described as an application example of the voltage generator. However, the present invention is not limited to this. The voltage generator of the present invention is also applicable to any other circuit such as an A/D converter that needs a reference voltage for its operation.

14th Embodiment

Figure 36:
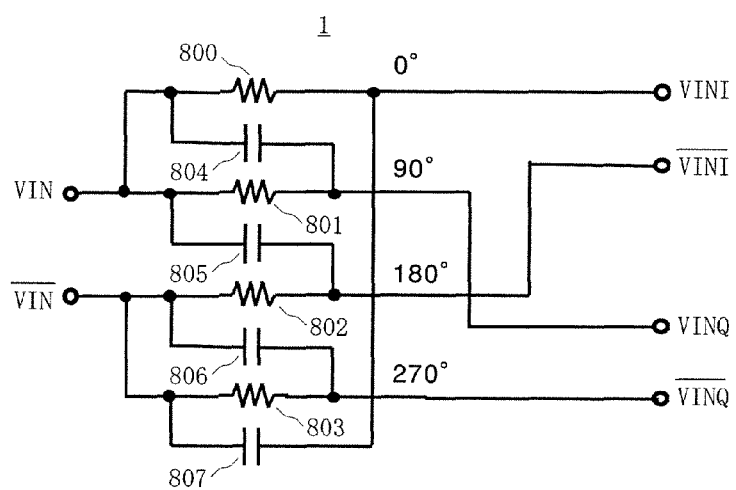
FIG. 36 is a circuit diagram showing the arrangement of a 90° phase shifter according to the 14th embodiment of the present invention.

The 14th embodiment of the present invention will be described next. FIG. 36 is a circuit diagram showing the arrangement of a 90° phase shifter according to the 14th embodiment of the present invention. In this embodiment, the 90° phase shifter 1 in the vector sum phase shifters according to the 11th and 12th embodiments is implemented by a polyphase filter.

The polyphase filter includes a resistor 800 having one terminal connected to the input terminal of an input signal VIN and the other terminal connected to the output terminal of an in-phase signal VINI, a resistor 801 having one terminal connected to the input terminal of the input signal VIN and the other terminal connected to the output terminal of a quadrature signal VINQ, a resistor 802 having one terminal connected to the input terminal of an input signal $\overline{\text{VIN}}$ and the other terminal connected to the output terminal of an in-phase signal $\overline{\text{VINI}}$, a resistor 803 having one terminal connected to the input terminal of the input signal $\overline{\text{VIN}}$ and the other terminal connected to the output terminal of a quadrature signal $\overline{\text{VINQ}}$, a capacitance 804 having one terminal connected to the input terminal of the input signal VIN and the other terminal connected to the output terminal of the quadrature signal VINQ, a capacitance 805 having one terminal connected to the input terminal of the input signal VIN and the other terminal connected to the output terminal of the in-phase signal $\overline{\text{VINI}}$, a capacitance 806 having one terminal connected to the input terminal of the input signal $\overline{\text{VIN}}$ and the other terminal connected to the output terminal of the quadrature signal $\overline{\text{VINQ}}$, and a capacitance 807 having one terminal connected to the input terminal of the input signal $\overline{\text{VIN}}$ and the other terminal connected to the output terminal of the in-phase signal VINI.

Let Rp be the resistance value of the resistors 800 to 803, and Cp be the capacitance value of the capacitances 804 to 807. Difference signals with an angular frequency $\omega=1/(RpCp)$ are input to the polyphase filter as the input signals VIN and $\overline{\text{VIN}}$. The polyphase filter outputs a single-phase signal with a phase of 0° from the node between the resistor 800 and the capacitance 807, a single-phase signal with a phase of 90° from the node between the resistor 801 and the capacitance 804, a single-phase signal with a phase of 180° from the node between the resistor 802 and the capacitance 805, and a single-phase signal with a phase of 270° from the node between the resistor 803 and the capacitance 806. Out of the single-phase signals, the signals with the phases of 0° and 180° are defined as the in-phase signals VINI and $\overline{\text{VINI}}$, and the signals with the phases of 90° and 270° are defined as the quadrature signals VINQ and $\overline{\text{VINQ}}$. The in-phase signals VINI and $\overline{\text{VINI}}$ and the quadrature signals VINQ and $\overline{\text{VINQ}}$ which are 90° degrees out of phase with the in-phase signals VINI and $\overline{\text{VINI}}$ are thus obtained.

Note that when a differential amplifier is provided at the input of the polyphase filter, though not illustrated in FIG. 36, the differential amplifier functions as a single balance (single-phase differential) converter. Even if the input signal VIN input from the outside is a single-phase signal, difference signals can be input to the polyphase filter so as to obtain the in-phase signals VINI and $\overline{\text{VINI}}$ and the quadrature signals VINQ and $\overline{\text{VINQ}}$. As another arrangement example of the polyphase filter, the resistors and capacitances may be connected in a fashion different from FIG. 36, or the resistors and capacitances may be connected in multiple stages.

15th Embodiment

Figure 37:
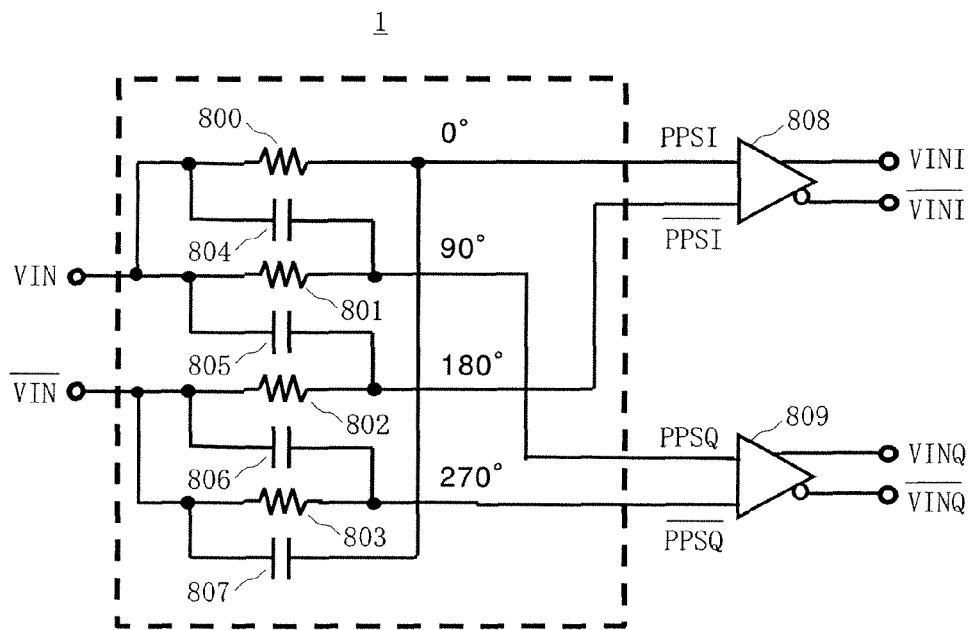
FIG. 37 is a circuit diagram showing the arrangement of a 90° phase shifter according to the 15th embodiment of the present invention.

The 15th embodiment of the present invention will be described next. FIG. 37 is a circuit diagram showing the arrangement of a 90° phase shifter according to the 15th embodiment of the present invention. In this embodiment, the 90° phase shifter 1 in the vector sum phase shifters according to the 11th and 12th embodiments is implemented by a polyphase filter. An arrangement example different from that of the 14th embodiment will be explained.

In the polyphase filter of this embodiment, a high-gain differential amplifier 808 that receives the signal output from the node between a resistor 800 and a capacitance 807 as a noninverting input signal PPSI and the signal output from the node between a resistor 802 and a capacitance 805 as a noninverting input signal $\overline{\text{PPSI}}$ and a high-gain differential amplifier 809 that receives the signal output from the node between a resistor 801 and a capacitance 804 as a noninverting input signal PPSQ and the signal output from the node between a resistor 803 and a capacitance 806 as a noninverting input signal $\overline{\text{PPSQ}}$ are added to the arrangement of the 14th embodiment shown in FIG. 36. The outputs from the high-gain differential amplifier 808 are in-phase signals VINI and $\overline{\text{VINI}}$. The outputs from the high-gain differential amplifier 809 are quadrature signals VINQ and $\overline{\text{VINQ}}$. The gain of the high-gain differential amplifiers 808 and 809 is generally 2 or more.

The arrangement of the 14th embodiment is a passive filter and therefore has a transmission loss. For this reason, the amplitude of the output signal is much smaller (½ or less in general) than that of the input signal. When the in-phase signals VINI and $\overline{\text{VINI}}$ and quadrature signals VINQ and $\overline{\text{VINQ}}$ with small amplitudes are input to the four-quadrant multipliers of the vector sum phase shifter, the output signals of the vector sum phase shifter not only have smaller amplitudes but also suffer waveform degradation and increases in jitter. The two high-gain differential amplifiers 808 and 809 are inserted to compensate for the transmission loss and thus input the in-phase signals VINI and $\overline{\text{VINI}}$ and quadrature signals VINQ and $\overline{\text{VINQ}}$ with appropriate amplitudes to the four-quadrant multipliers. In this embodiment, in-phase noise generated in the arrangement shown in FIG. 36 can also be removed.

Figure 38:
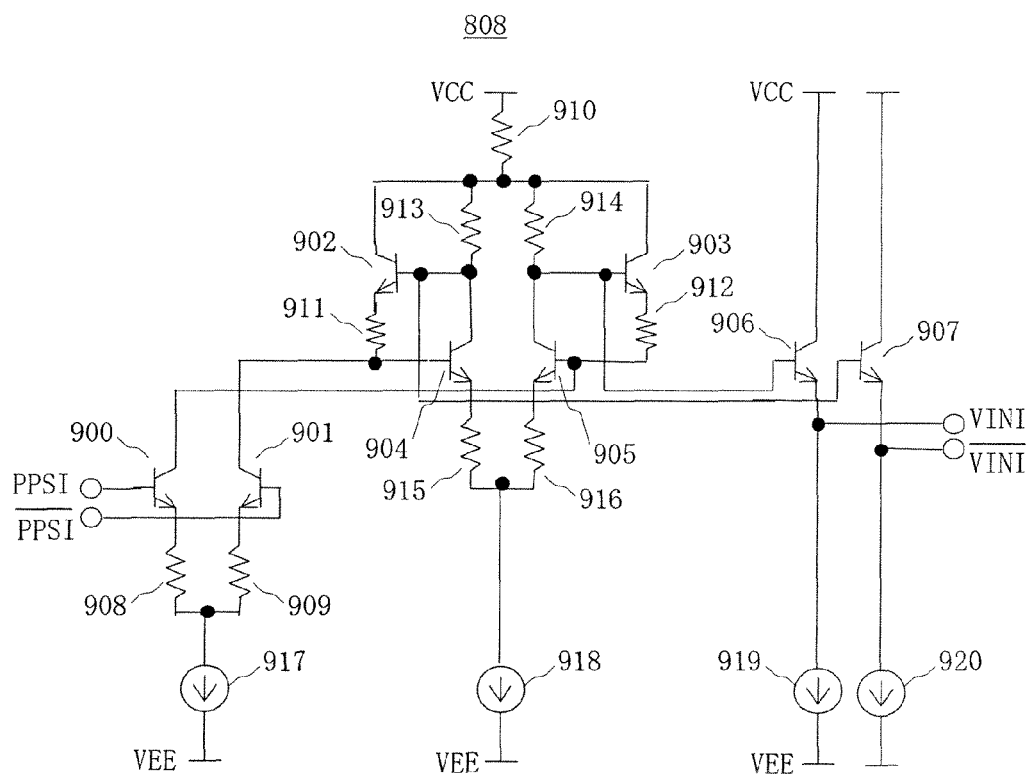
FIG. 38 is a circuit diagram showing an example of the arrangement of a high-gain differential amplifier according to the 15th embodiment of the present invention.
Figure 39:
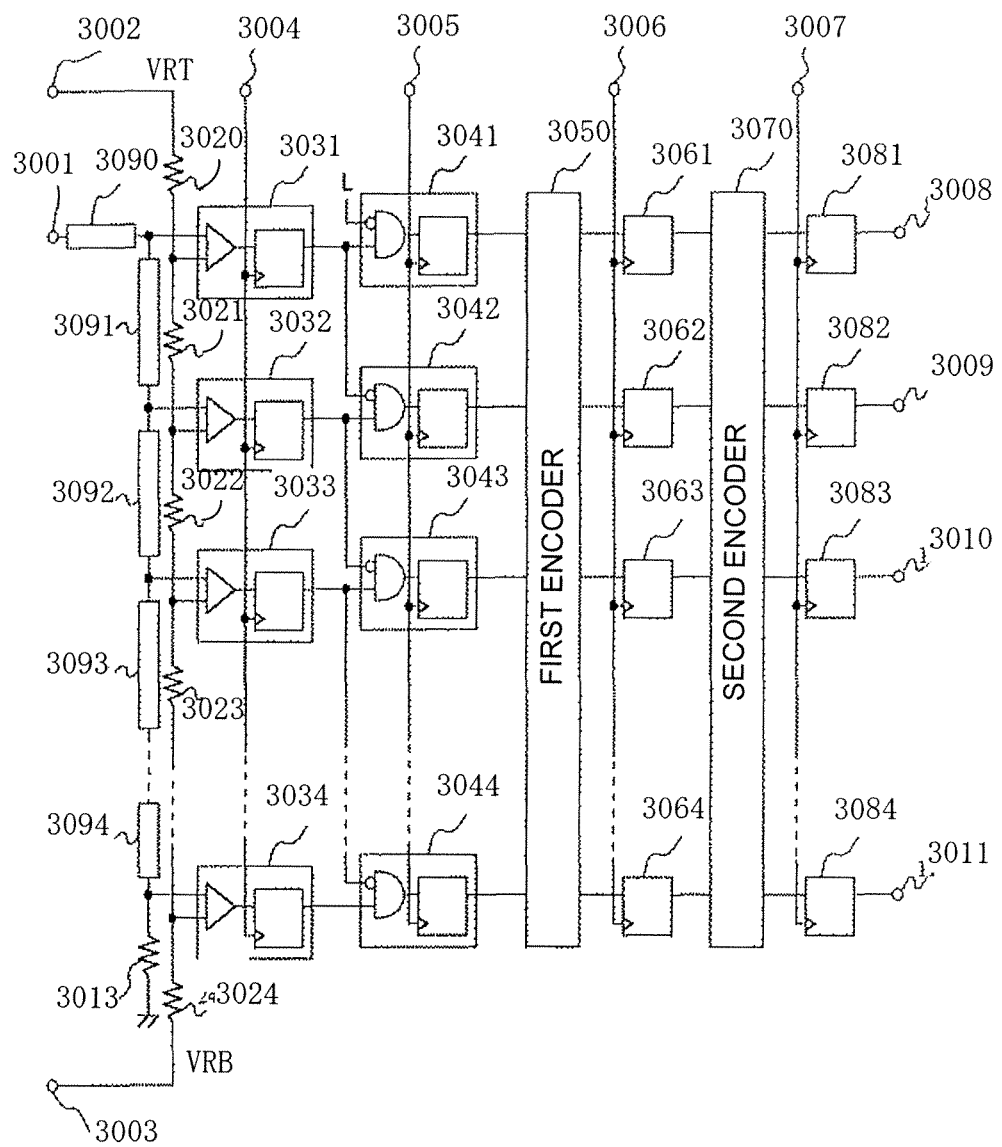
FIG. 39 is a block diagram showing the arrangement of a conventional control circuit.
Figure 40:
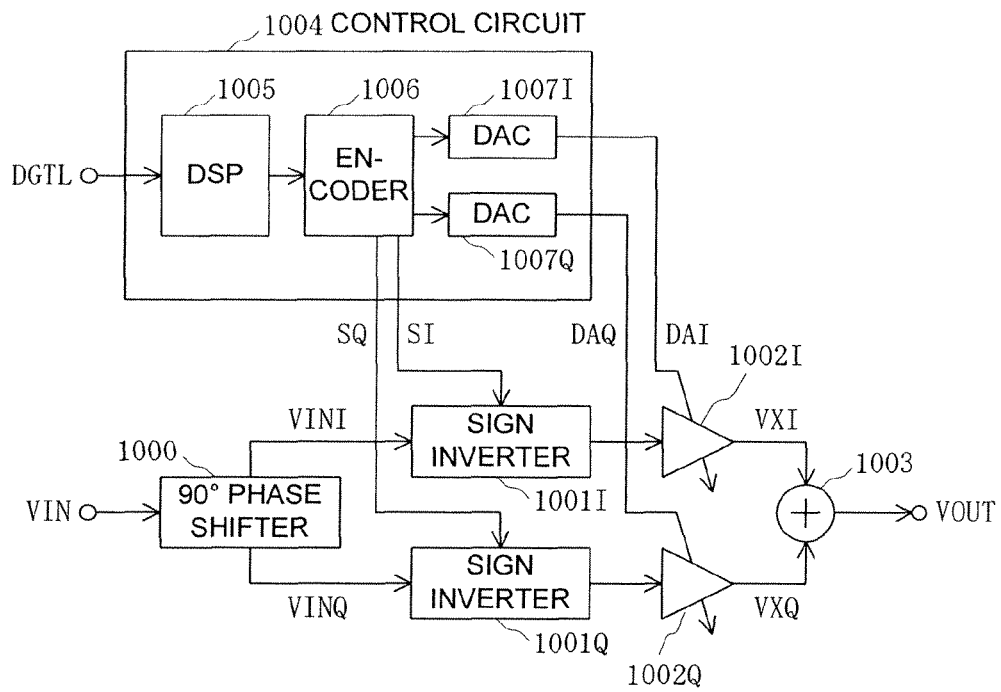
FIG. 40 is a block diagram showing the arrangement of a vector sum phase shifter.
Figure 41A:
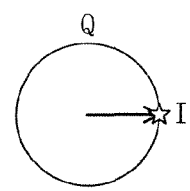
FIGS. 41A to 41D are constellation diagrams showing signals of the respective portions of the vector sum phase shifter shown in FIG. 40 plotted on a plane.
Figure 41B:
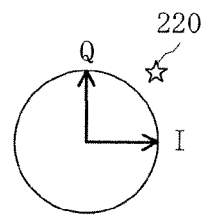
Figure 41C:
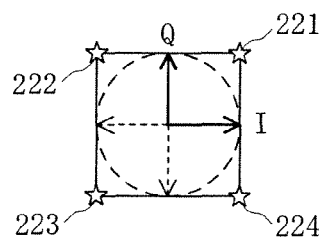
Figure 41D:
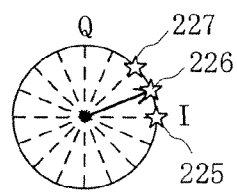
Figure 42:
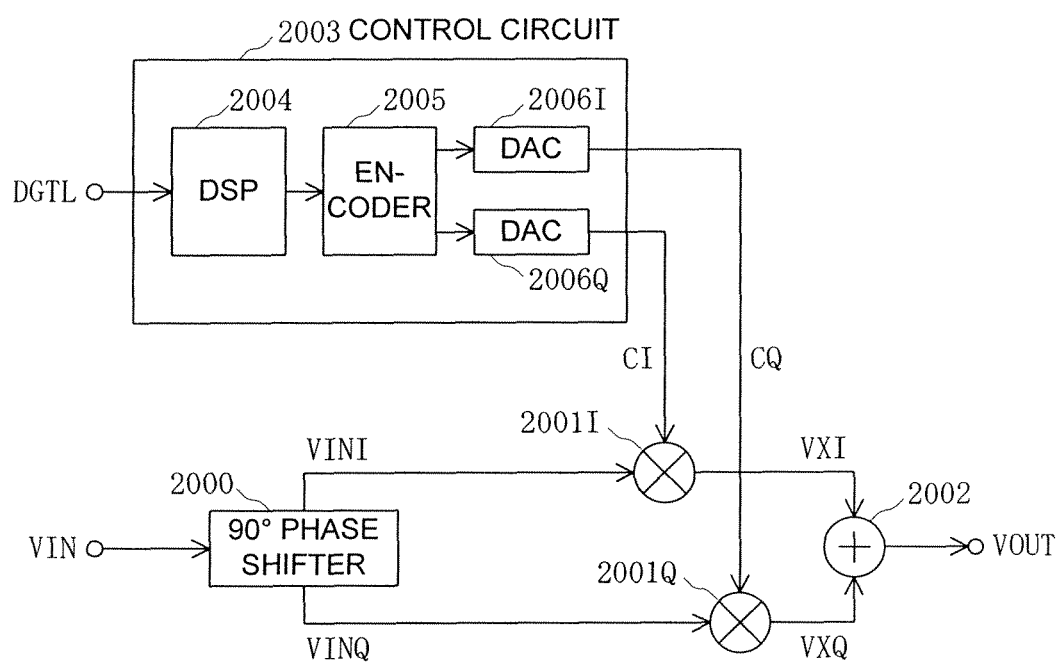
FIG. 42 is a block diagram showing another arrangement of the conventional vector sum phase shifter.

FIG. 38 is a circuit diagram showing an example of the arrangement of the high-gain differential amplifier 808. The high-gain differential amplifier 808 includes transistors 900 to 907, resistors 908 to 916, and current sources 917 to 920. The arrangement shown in FIG. 38 is called a Cherry Hooper type or total feedback type. The circuit arrangement shown in FIG. 38 is suitable for ensuring both a high bandwidth and a high gain and can compensate for the transmission loss generated in the arrangement of the 14th embodiment. Note that though an example of the high-gain differential amplifier 808 has been described with reference to FIG. 38, the arrangement in FIG. 38 is applicable to the high-gain differential amplifier 809 as well, as a matter of course.

INDUSTRIAL APPLICABILITY

The present invention is applicable to a voltage generator which generates a reference voltage, a control circuit which receives a control voltage and a reference voltage generated by a voltage generator and outputs a control signal to a means such as a variable gain amplifier or four-quadrant multiplier for adjusting the signal amplitude, a vector sum phase shifter using a control circuit and a variable gain amplifier or four-quadrant multiplier, and an optical transceiver using a vector sum phase shifter.

The invention claimed is:

1. A voltage generator comprising:
   a resistor ladder which divides a supplied voltage to generate a plurality of reference voltages;
   a first level shift diode inserted between a first power supply voltage and one terminal of said resistor ladder; and
   a first constant current source inserted between a second power supply voltage and the other terminal of said resistor ladder; and
   a Process, Voltage and Temperature (PVT) compensation circuit which supplies a voltage obtained by level compensation of an externally input control voltage to a difference amplifier.

2. A voltage generator according to claim 1, wherein said PVT compensation circuit comprises:
   one of an emitter follower and a source follower, which is formed from a transistor having one of a base and a gate receiving the externally input control voltage, one of a collector and a drain receiving the first power supply voltage, and one of an emitter and a source connected to an output terminal of said PVT compensation circuit;
   a first resistor inserted between the second power supply voltage and the output terminal of said PVT compensation circuit; and a second constant current source inserted between the second power supply voltage and the output terminal of said PVT compensation circuit in series with said first resistor.

3. A voltage generator according to claim 2, wherein
said PVT compensation circuit further comprises at least one second level shift diode inserted between one of the emitter and the source of said transistor and the output terminal of said PVT compensation circuit when said first level shift diode comprises a plurality of first level shift diodes, and
the total number of stages of said second level shift diodes and the one of the emitter follower and the source follower equals the number of stages of said first level shift diodes.

4. A voltage generator according to claim 1, further comprising a control gain adjusting circuit which adjusts a gain of the control voltage.

5. A voltage generator according to claim 1, wherein
said resistor ladder comprises two resistor ladders divisionally arranged for each of a first differential amplifier group and a second differential amplifier group provided in a circuit that receives the reference voltage,
a first resistor ladder inputs generated reference voltages only to the first differential amplifier group on a one-by-one basis,
a second resistor ladder inputs generated reference voltages only to the second differential amplifier group on a one-by-one basis, and
when the reference voltages generated by said first resistor ladder and the reference voltages generated by said second resistor ladder are alternately arranged, voltage levels between the reference voltages are constant.

6. A control circuit for outputting a control signal to means for adjusting a signal amplitude, comprising:
a voltage generator which generates a reference voltage; and
a differential amplifier which outputs, as a control signal, a difference signal between the control voltage after level compensation obtained by said voltage generator and the reference voltage generated by said voltage generator,
wherein said voltage generator comprises:
a resistor ladder which divides a supplied voltage to generate the plurality of reference voltages;
a first level shift diode inserted between a first power supply voltage and one terminal of said resistor ladder;
a first constant current source inserted between a second power supply voltage and the other terminal of said resistor ladder; and
a Process, Voltage, and Temperature (PVT) compensation circuit which supplies a voltage obtained by level compensation of an externally control voltage to said difference amplifier,
when the control voltage is near the reference voltage, said differential amplifier performs an analog operation of converting the control voltage into the control signal which is similar to one of a sine wave and a cosine wave.

7. A control circuit according to claim 6, wherein said differential amplifier comprises a plurality of differential amplifiers cascade-connected.

8. A control circuit according to claim 6, further comprising, as the differential amplifier, a first differential amplifier group which receives the control voltage and the reference voltage and outputs a first control signal on an in-phase signal side and a second differential amplifier group which receives the control voltage and the reference voltage and outputs a second control signal on a quadrature signal side when an in-phase signal and a quadrature signal 90° degrees out of phase with the in-phase signal exist as amplitude adjustment target signals,
wherein each of said first differential amplifier group and said second differential amplifier group comprises at least one differential amplifier.

9. A control circuit according to claim 8, wherein said voltage generator generates the plurality of reference voltages by dividing the voltage and alternately inputs the plurality of reference voltages to said first differential amplifier group and said second differential amplifier group on a one-by-one basis.

10. A control circuit according to claim 8, wherein
said voltage generator generates N reference voltages (N is an integer of not less than 2), and
a sum of the numbers of differential amplifiers included in said first differential amplifier group and the number of differential amplifiers included in said second differential amplifier group is N.

11. A control circuit according to claim 8, wherein
outputs of two adjacent differential amplifiers included in said first differential amplifier group are connected in opposite phases, and
outputs of two adjacent differential amplifiers included in said second differential amplifier group are connected in opposite phases.

12. A control circuit according to claim 8, wherein
the reference voltage Vm and the reference voltage Vn, which alternate, are input to two adjacent differential amplifiers included in said first differential amplifier group or two adjacent differential amplifiers included in said second differential amplifier group, and
a voltage difference between the reference voltage Vm and the reference voltage Vn ranges from twice a constant $VT=kT/q$ (k is the Boltzmann's constant, T is an absolute temperature, q is charges of electrons) (inclusive) to 12 times the constant VT.

13. A vector sum phase shifter comprising:
a 90° phase shifter which generates, from an input signal, an in-phase signal and a quadrature signal 90° degrees out of phase with the in-phase signal;
a first four-quadrant multiplier which changes an amplitude of the in-phase signal based on a first control signal on an in-phase signal side and outputs the in-phase signal;
a second four-quadrant multiplier which changes an amplitude of the quadrature signal based on a second control signal on a quadrature signal side and outputs the quadrature signal;
a combiner which combines the in-phase signal output from said first four-quadrant multiplier and the quadrature signal output from said second four-quadrant multiplier and outputs a combined signal; and
a control circuit which outputs the first control signal and the second control signal,
wherein said control circuit comprises:
a voltage generator which generates a reference voltage; and
a differential amplifier which outputs a difference signal between the reference voltage and the control voltage after level compensation obtained by said voltage generator as one of the first control signal and the second control signal, and
said voltage generator comprises:
a resistor ladder which divides a supplied voltage to generate the plurality of reference voltages;

a first level shift diode inserted between a first power supply voltage and one terminal of said resistor ladder; and a voltage supply resistor provided between a second power supply voltage and the other terminal of said resistor ladder;

a first constant current source inserted between the second power supply voltage and the other terminal of said resistor ladder; and a Process Voltage and Temperature (PVT) compensation circuit which supplies a voltage obtained by level compensation of an externally input control voltage to said difference amplifier, when the control voltage is near the reference voltage, said differential amplifier performs an analog operation of converting the control voltage into one of the first control signal and the second control signal which is similar to one of a sine wave and a cosine wave.

14. A vector sum phase shifter according to claim 13, wherein said 90° phase shifter comprises a polyphase filter.

15. A vector sum phase shifter according to claim 14, wherein said 90° phase shifter further comprises a high-gain differential amplifier at a succeeding stage of said polyphase filter.

16. A vector sum phase shifter according to claim 15, wherein said high-gain differential amplifier comprises a Cherry Hooper type high-gain differential amplifier.

* * * * *

UNITED STATES PATENT AND TRADEMARK OFFICE
CERTIFICATE OF CORRECTION

PATENT NO. : 8,687,973 B2  
APPLICATION NO. : 13/132308  
DATED : April 1, 2014  
INVENTOR(S) : Hideyuki Nosaka et al.

Page 1 of 1

It is certified that error appears in the above-identified patent and that said Letters Patent is hereby corrected as shown below:

In the Claims

Column 35, Claim 6, line 53, please delete "externally control" and insert --externally input control--.

Signed and Sealed this
Fourth Day of November, 2014

Michelle K. Lee
*Deputy Director of the United States Patent and Trademark Office*